United States Patent [19]

Kuroda

[11] Patent Number: 5,550,770
[45] Date of Patent: Aug. 27, 1996

[54] SEMICONDUCTOR MEMORY DEVICE HAVING FERROELECTRIC CAPACITOR MEMORY CELLS WITH READING, WRITING AND FORCED REFRESHING FUNCTIONS AND A METHOD OF OPERATING THE SAME

[75] Inventor: Kenichi Kuroda, Tachikawa, Japan

[73] Assignee: Hitachi, Ltd., Tokyo, Japan

[21] Appl. No.: 458,159

[22] Filed: Jun. 2, 1995

Related U.S. Application Data

[63] Continuation of Ser. No. 111,507, Aug. 24, 1993, Pat. No. 5,487,829.

[30] Foreign Application Priority Data

Aug. 27, 1992 [JP] Japan ..................................... 4-252326

[51] Int. Cl.$^6$ .................................................. G11C 11/22
[52] U.S. Cl. .......................................... 365/145; 365/149
[58] Field of Search ..................................... 365/145, 149

[56] References Cited

U.S. PATENT DOCUMENTS

| | | | |
|---|---|---|---|
| 3,579,208 | 5/1971 | Bartlett | 340/173.2 |
| 4,169,258 | 9/1979 | Tannas, Jr. | 365/145 |
| 4,360,896 | 11/1982 | Brody | 365/145 |

(List continued on next page.)

FOREIGN PATENT DOCUMENTS

| | | |
|---|---|---|
| 1-158691 | 6/1989 | Japan . |
| 3-036763 | 2/1991 | Japan . |
| 3-040298 | 2/1991 | Japan . |
| 4-090189 | 3/1992 | Japan . |

OTHER PUBLICATIONS

IEEE Journal of Solid–State Circuits, vol. 23, No. 5, Oct. 1988, "An Experimental 512–bit Nonvolatile Memory with Ferroelectric Storage Cell", pp. 1171–1175.
IEEE 1990 Symposium on VLSI Technology, "A Ferroelectric DRAM Cell for High Density NVRAMS", pp. 15–16.
IEEE 1987 IEDM, "A Non–Volatile Memory Cell Based on Ferroelectric Storage Capacitors", pp. 850–851.
Nikkei Microdevises, Jun. 1992, pp. 78–83.
Science, vol. 246, 1989, "Ferroelectric Memories", pp. 1400–1405.
Integrated Ferroelectrics, 1992, vol. 1, "Fatigue and Aging in Ferroelectric $PbZr_{0.2}Ti_{0.8}O_3/YBa_2Cu_3O_7$ Heterostructures", pp. 1–15.
IEEE 1990 IEDM, "Endurance Properties of Ferroelectric PZT Thin Films", pp. 417–420.
Semiconductor Word, Dec. 1991, pp. 122–125.

*Primary Examiner*—David C. Nelms
*Assistant Examiner*—F. Niranjan
*Attorney, Agent, or Firm*—Antonelli, Terry, Stout & Kraus

[57] ABSTRACT

There are provided a plurality of ferroelectric capacitors each of which having one of a pair of electrodes thereof connected with one terminal of a switch element which has the control terminal thereof connected with a first address selecting line. Second address selecting lines are respectively connected with the other electrodes of the ferroelectric capacitors to construct a unit memory circuit. When the switch element is turned ON by the first address selecting line, one of the second address selecting line is brought into a selecting state to feed such a voltage as to polarize the ferroelectric capacitors. The remaining address selecting lines are set to an unselect potential so that the voltage to be applied to the unselected ferroelectric capacitors coupled to the remaining address selecting lines may be about one half as high as that applied to the selected ferroelectric capacitor. When the switch element is turned ON by the first address selecting line, the second address selecting lines are fed with such an unselect potential as to reduce the voltage to be applied to the ferroelectric capacitors substantially to zero. The stress to the ferroelectric capacitors of the unit memory circuit corresponding to the unselected switch element can be reduced because no voltage is applied to the ferroelectric capacitors.

28 Claims, 53 Drawing Sheets

U.S. PATENT DOCUMENTS

| | | | |
|---|---|---|---|
| 4,707,897 | 11/1987 | Rohrer et al. | 29/25.42 |
| 4,809,225 | 2/1989 | Dimmler et al. | 365/145 |
| 4,853,893 | 8/1989 | Eaton, Jr. et al. | 365/145 |
| 4,873,455 | 10/1989 | de Chambost et al. | 307/201 |
| 4,873,664 | 10/1989 | Eaton, Jr. | 365/145 |
| 4,888,733 | 12/1989 | Mobley | 365/145 |
| 4,914,627 | 4/1990 | Eaton, Jr. et al. | 365/145 |
| 4,918,654 | 4/1990 | Eaton, Jr. et al. | 365/145 |
| 4,962,322 | 10/1990 | Chapman | 307/304 |
| 5,029,128 | 7/1991 | Toda | 365/145 |
| 5,031,143 | 7/1991 | Jaffe | 365/145 |
| 5,031,144 | 7/1991 | Persky | 365/145 |
| 5,038,323 | 8/1991 | Schwee | 365/145 |
| 5,060,191 | 10/1991 | Nagasaki et al. | 365/145 |
| 5,063,539 | 11/1991 | Rallapalli | 365/145 |
| 5,086,412 | 2/1992 | Jaffe et al. | 365/145 |
| 5,109,357 | 4/1992 | Eaton, Jr. | 365/145 |
| 5,121,353 | 6/1992 | Natori | 365/145 |

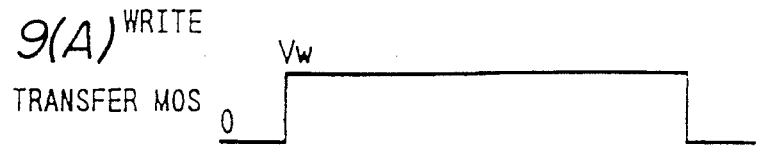
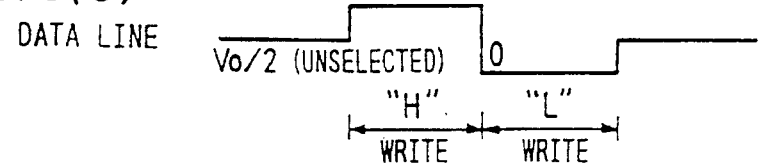
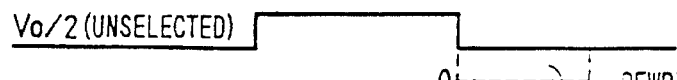
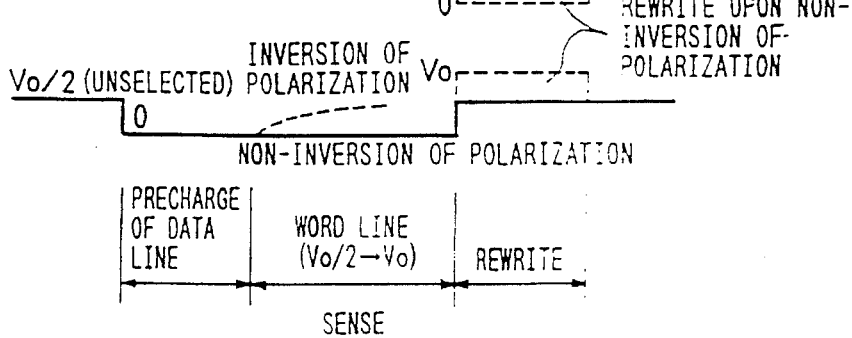

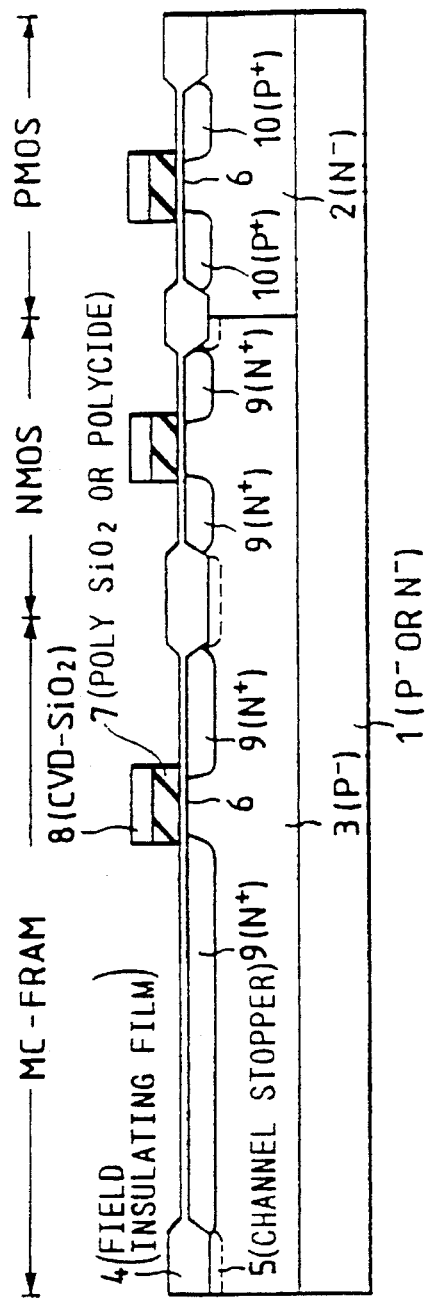
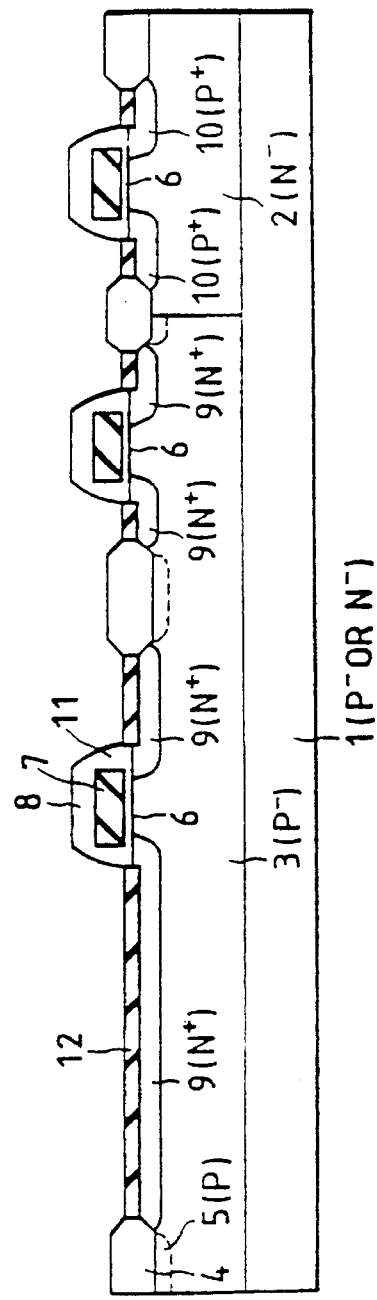
FIG. 43(A)
FIG. 43(B)

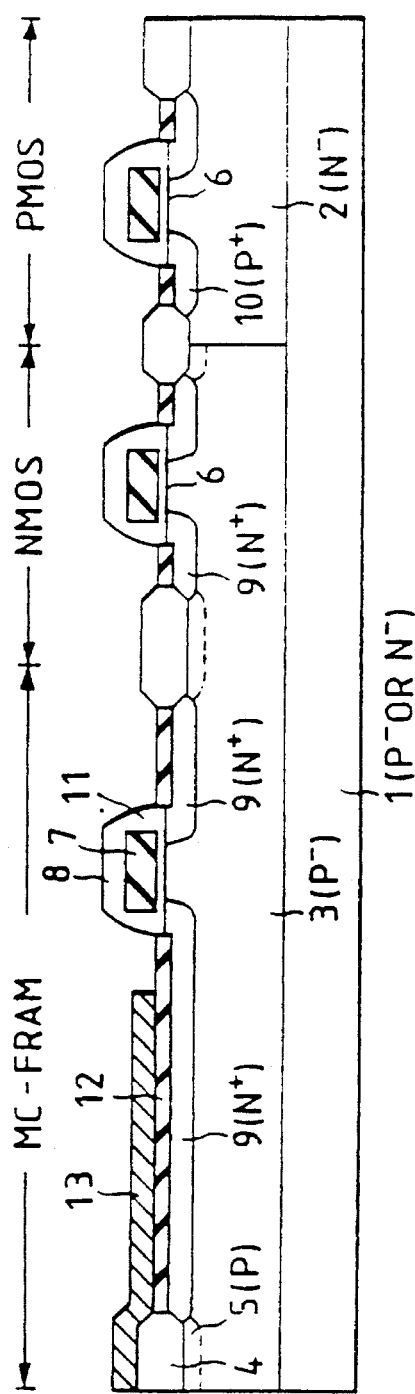
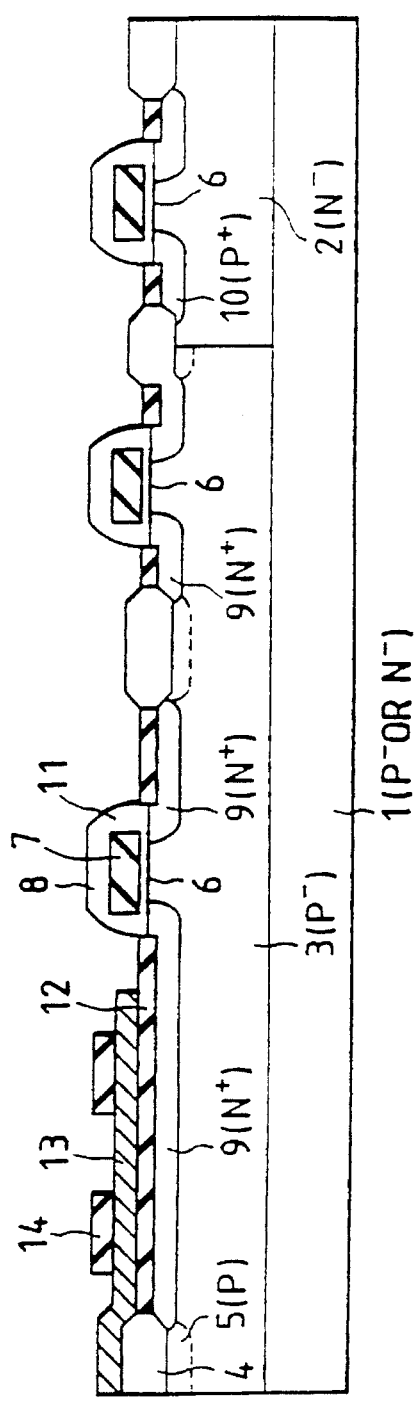
FIG. 44(A)
FIG. 44(B)

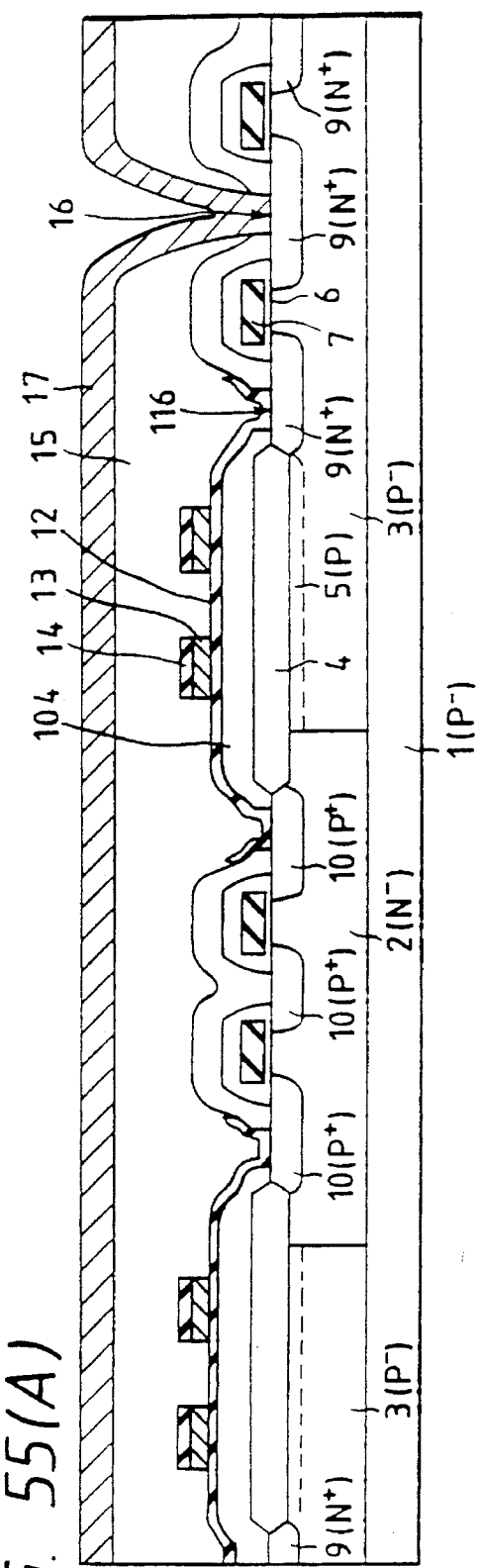
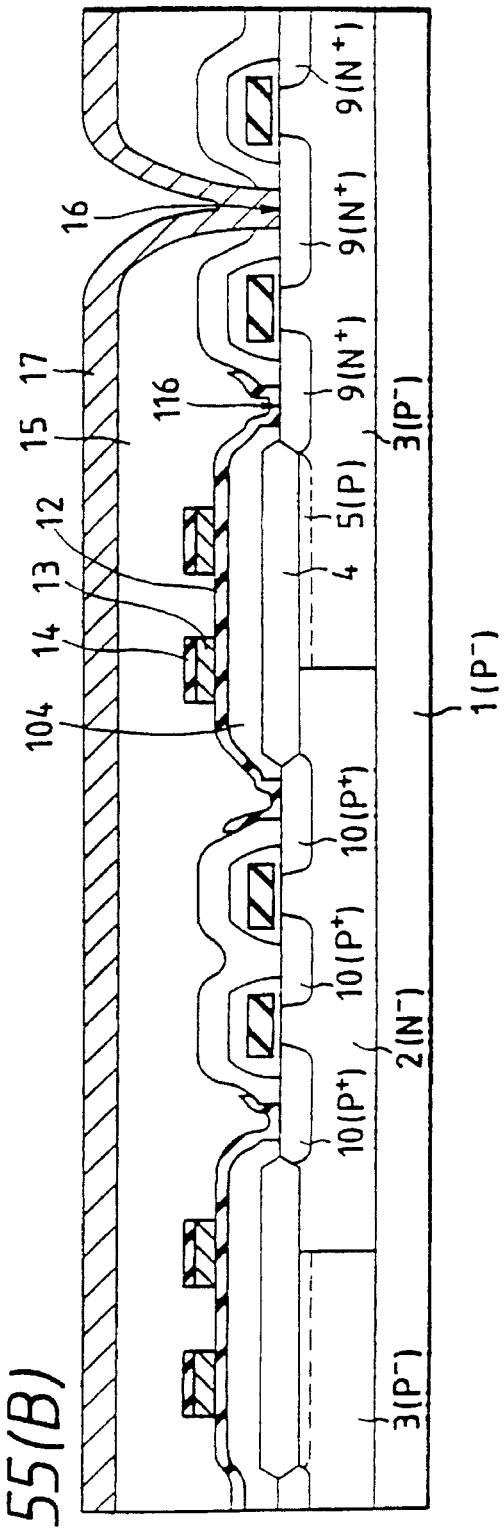
FIG. 55(A)
FIG. 55(B)

SEMICONDUCTOR MEMORY DEVICE HAVING FERROELECTRIC CAPACITOR MEMORY CELLS WITH READING, WRITING AND FORCED REFRESHING FUNCTIONS AND A METHOD OF OPERATING THE SAME

This is a continuation of application Ser. No. 08/111,507, filed Aug. 24, 1993 U.S. Pat. No. 5,487,829.

BACKGROUND OF THE INVENTION

The present invention relates to a semiconductor memory system and, more particularly, to a technology which is effective if applied to a semiconductor memory system using ferroelectric capacitors.

In Japanese Patent Laid-Open No. 90189/1991 (corresponding to U.S. patent application Ser. No. 07/78601 filed on Jul. 31, 1991), there is disclosed a semiconductor device which is equipped with ferroelectric capacitors for one switch element so that it may be highly integrated. Another example using the ferroelectric capacitors as memory elements is disclosed in Japanese Patent Laid-Open No. 201998/1990 (corresponding to U.S. Pat. No. 4,873,664) and Japanese Patent Laid-Open No. 36763/1990 (corresponding to U.S. patent application Ser. No. 07/546,854).

SUMMARY OF THE INVENTION

We have been able to ascertain the problems attributed to stress in ferroelectric capacitors, which is inevitably applied to an unselected ferroelectric capacitor in those instances in which a plurality of ferroelectric capacitors are provided for one switch element, as described above, and the circuit construction or layout accompanying the actual writing/reading operations.

An object of the present invention is to provide a semiconductor memory system (or device) which reduces stress to an unselected ferroelectric capacitor while raising the degree of integration.

Another object of the present invention is to provide a semiconductor memory system (or device) which can have its operation stabilized while raising the degree of integration.

Still another object of the present invention is to provide a semiconductor memory system (or device) which can have its characteristics stabilized for its manufacture process while raising the degree of integration.

The aforementioned and other objects and novel features of the present invention will become apparent from the following description to be made with reference to the accompanying drawings.

The summary of a representative aspect of the invention to be disclosed herein will be briefly described in the following. Specifically, according to the present invention, there is provided a semiconductor memory system (or device) comprising a unit memory circuit including: a switch element having its control terminal connected with first address selecting lines; a plurality of ferroelectric capacitors having their one-side terminals commonly connected with one terminal of the switch element: a plurality of second address selecting lines individually connected with the other terminals of the ferroelectric capacitors, wherein, when the first address selecting line is brought into a selecting state to turn ON the switch element, one of the second address selecting lines is brought into a selecting state and fed with such a voltage as to polarize the ferroelectric capacitors whereas the remaining second address selecting lines are set to such an unselect potential that the voltage applied to the ferroelectric capacitors may be about one half as high as that applied to the selected ferroelectric capacitor, and wherein, when the first address selecting line is brought into an unselecting state to turn OFF the switch element, the second address selecting lines are fed with such an unselect potential that the voltage applied to the ferroelectric capacitors may be reduced substantially to zero.

The unit memory circuits are arranged in a matrix form such that the X-addresses are assigned to the first address selecting line and the second address selecting lines whereas the Y-addresses are assigned to the signal lines. Each of these signal lines is equipped with a pair of switch elements so that one selected signal line is connected through one of the switch elements with the common signal line and fed with the select voltage whereas the remaining unselected signal lines are fed through the other switch element with about one half of the select voltage.

The unit memory circuits constitutes one memory block so that the memory accessing is carried out at the unit of the memory block.

This memory block is so initialized that its ferroelectric capacitors are polarized in one direction, and the actual writing operation is carried out with reference to the memory block only for such data as will invert the polarization.

The memory block is equipped with a counter circuit for memorizing the number of writing operations so that the counter circuit is used for deciding forced refreshing operation for relieving the writing fatigue of the ferroelectric material.

The input and output of the data to and from the memory block are carried out through a buffer memory having a data latch or a shift register.

When in the writing operation to invert the direction of the initialized polarization, a sense amplifier is operated so that a rewriting operation may be carried out if the sense signal fails to reach a predetermined level.

There is further provided a memory cell array which includes memory cells each having one switch element and one ferroelectric capacitor. These memory cells are operated as dynamic ones by feeding the ferroelectric capacitors with such a voltage as will raise no polarization.

Those of the ferroelectric capacitors, which correspond to one switch, are juxtaposed over a common inter-layer insulating film, such that their one-side electrodes integrated with the wiring lines connected with the switch element and their other electrodes integrated with the second address selecting lines intersect at a right angle through a ferroelectric material layer.

According to the means described above, a stress to the ferroelectric capacitors of the unit memory circuit corresponding to the unselected switch element can be drastically reduced because no voltage is applied to the ferroelectric capacitors. Thanks to the memory accessing at the block unit, the number of voltage applications to fatigue the unselected ferroelectric capacitors can be remarkably reduced, as compared with the case in which the individual ferroelectric capacitors are accessed at random. By inputting and outputting the data to and from the outside of the semiconductor memory system through the buffer memory, the apparent memory accessing speed can be accelerated.

According to the means described above, the number of rewriting the memory block is stored in the counter circuit so that the fatigue of the ferroelectric material can be relieved to store the information stably by performing the forced refreshing operation when the counted number reaches a predetermined value.

According to the means described above, a verification can be carried out by operating the sense amplifier when in the writing operation, so that a stable writing operation can be carried out by performing it again in dependence upon the verified result.

According to the means described above, a high-speed accessing can be achieved by a proper use, in which the ferroelectric capacitors are used as the dynamic memory cells so that these dynamic memory cells may be used for latching the data temporarily.

According to the means described above, by arranging the ferroelectric capacitors horizontally for one switch element, the process can be simplified more than the stacked case so that the deterioration and dispersion of the characteristics of the stacking process can be reduced.

BRIEF DESCRIPTION OF THE DRAWINGS

FIGS. 9(A) to 9(C) show waveforms chart for explaining the operations of the writing methods shown in FIGS. 2 and 3;

FIGS. 10(A) to 10(C) show a waveforms chart for explaining the operations of the writing methods shown in FIGS. 6 to 8;

FIGS. 43(A) and 43(B) are sections each showing a portion of manufacture steps for explaining one embodiment of a process for manufacturing the semiconductor memory system of FIG. 40;

FIGS. 44(A) and 44(B) are sections each showing the remaining portion of the manufacture steps for explaining one embodiment of the process for manufacturing the semiconductor memory system;

FIGS. 55(A) and 55(B) are sections each of an element structure and shows still another embodiment of the semiconductor memory system according to the present invention;

DETAILED DESCRIPTION OF THE INVENTION

Figure 1:
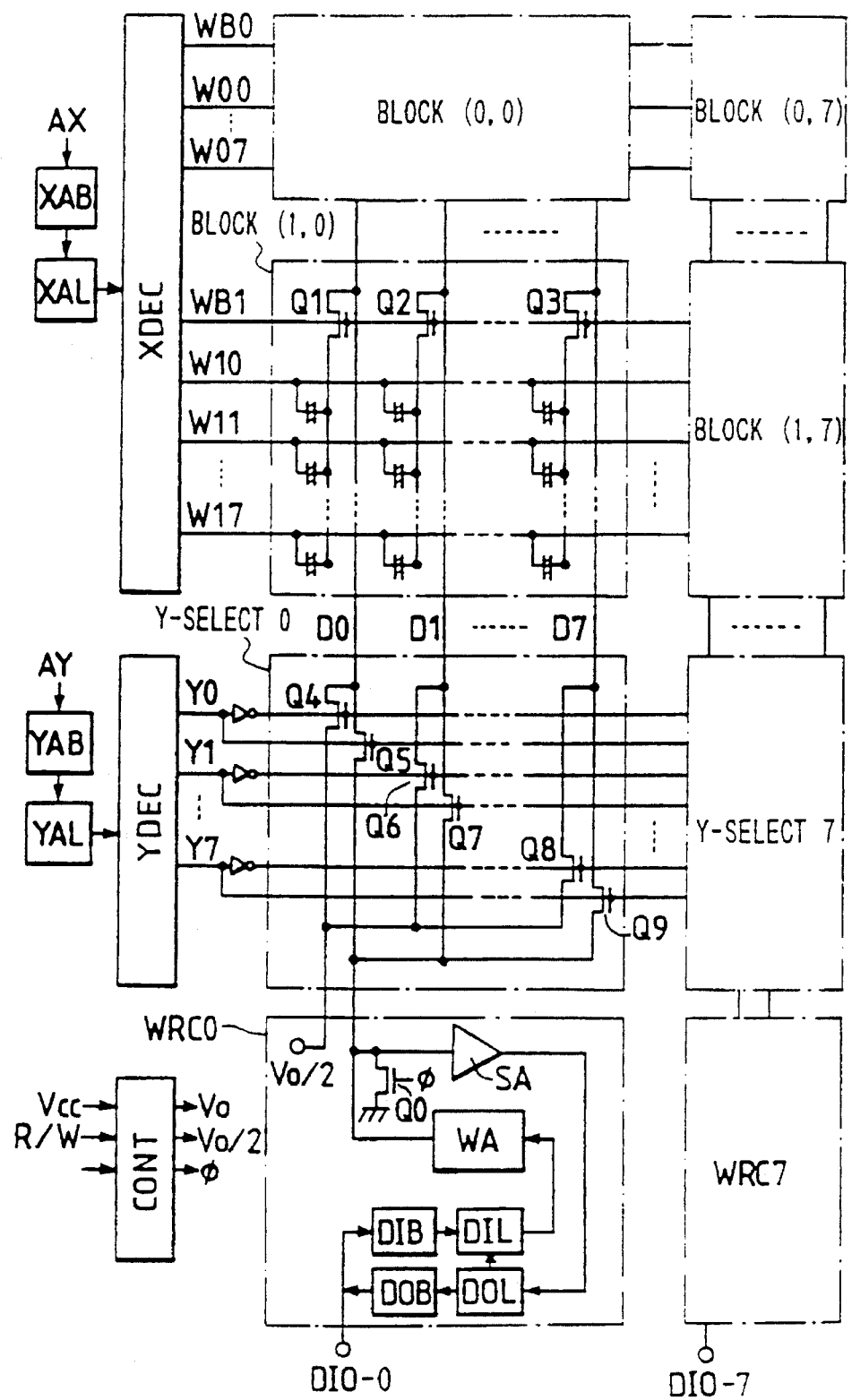
FIG. 1 is a block diagram showing one embodiment of a semiconductor memory system according to the present invention.

FIG. 1 is a block diagram showing one embodiment of the semiconductor memory system according to the present invention. The individual circuit blocks and circuit elements of FIG. 1 are formed over one semiconductor substrate made of single crystal silicon by the well-known technology of manufacturing a semiconductor integrated circuit. In the present application, the terminology "MOSFET" is used to mean the "insulated gate type field effect transistor (IGFET)".

The semiconductor memory system of this embodiment is adapted to write/read data at the unit of 8 bits. The memory array portion is provided with 2×8 memory blocks as a representative. Specifically, the memory array portion is provided with eight memory blocks in the row direction and with two memory blocks in the column direction. The eight memory blocks arranged in the row direction are made to correspond to eight data terminals DIO-0 to DIO-7. In FIG. 1, four of the memory blocks are shown by way of example.

A specific circuit of the unit memory circuit in one memory block (1, 0) is shown by way of example. The unit memory circuit is composed of one switch MOSFET Q1 and a plurality of corresponding ferroelectric capacitors. The switch MOSFET Q1 has its one electrode connected with a data line (e.g., a bit line or digit line) as a signal line and its other electrode connected commonly with the one-terminal electrodes of the ferroelectric capacitors. The one memory block is equipped therein with a plurality of data lines D0 to D7, and each of the data lines D1 to D7 is correspondingly equipped or the aforementioned data line D0 with one switch MOSFET Q2, Q3 or the like.

The switch MOSFETs Q1 to Q3 have their gates connected with a block selecting first word line WB1. The other electrodes of the aforementioned ferroelectric capacitors are connected with second word lines W10 to W17 which are extended in parallel with the aforementioned first word line.

The memory blocks (0, 0) and (1, 0) juxtaposed in the column direction share the data lines D0 to D7. These data lines D0 to D7 are connected through a Y-select 0 with a write/read circuit WRC0.

The Y-select 0 is equipped, as representatively shown in a specific circuit, with a pair of switch elements, i.e., a selecting switch MOSFET Q5 for one data line D0 and an unselecting switch MOSFET Q4. For the ocher data lines D1 and D7, as likewise representatively shown, there are provided unselecting and selecting switch MOSFETs Q6 and Q7, and Q8 and Q9. The selecting switch MOSFETs Q5, Q7 and Q9 connect the corresponding data lines with the common data line. This common data line is equipped with the aforementioned write/read circuit WRC0. The unselecting switch MOSFETs Q4, Q6 and Q8 feed the corresponding data lines with the voltage of Vo/2 which is one half as high as a write (or read) voltage of Vo.

The remaining seven data line terminals D1 to D7 are corresponded to by the Y-selects and write/read circuits having constructions similar to the aforementioned ones. In FIG. 1, there are representatively shown a Y-select 7 and a write/read circuit WRC7, which correspond to the data terminal DIO-7. The write circuit includes a data input buffer DIB, a data in-latch DIL and a write amplifier WA, and the read circuit includes a sense amplifier SA, a data out-latch DOL and a data output buffer DOB. The data to be fed from the data out-latch DOL to the data in-latch DIL are used for the rewrite due to the destructive read. A MOSFET Q0 is a switch MOSFET for feeding the earth potential of the circuit to a common data line connected with the input of the sense amplifier SA and the output of the write amplifier WA in response to a timing signal $\phi$.

The first word line and second word line of the memory block of the aforementioned memory array portion are fed with the select/unselect potentials by an X-decoder XDEC. An X-address signal AX is latched by an address latch circuit XAL through an address buffer XAB. The X-decoder XDEC decodes the address signal latched by the address latch circuit XAL, to produce the select/unselect signals of the first and second word lines in a manner to correspond to a series of operation sequences.

The individual switch MOSFETs of the aforementioned Y-selects 0 to 7 are switched by a Y-decoder YDEC. A Y-address signal AY is latched by an address latch circuit YAL through an address buffer YAB. The Y-decoder YDEC decodes the address signal latched by the address latch circuit YAL, so that one selected data line is connected with the write/read circuit WRC whereas the remaining unselected seven data lines are fed with the bias voltage of Vo/2.

A control circuit CONT produces the outputs of the write voltage of Vo and the half write voltage of Vo/2 in response to a supply voltage Vcc and the timing signal $\phi$ or the like in response to a write/read signal R/W. In addition, the control circuit CONT is fed, if necessary, with a chip select signal and a forced refreshing (or polling) high voltage, as will be described hereinafter. On the other hand, in case a block accessing operation or an automatic write verifying function is to be added, the control circuit CONT is equipped with a logic circuit for the sequence control.

Figure 2:
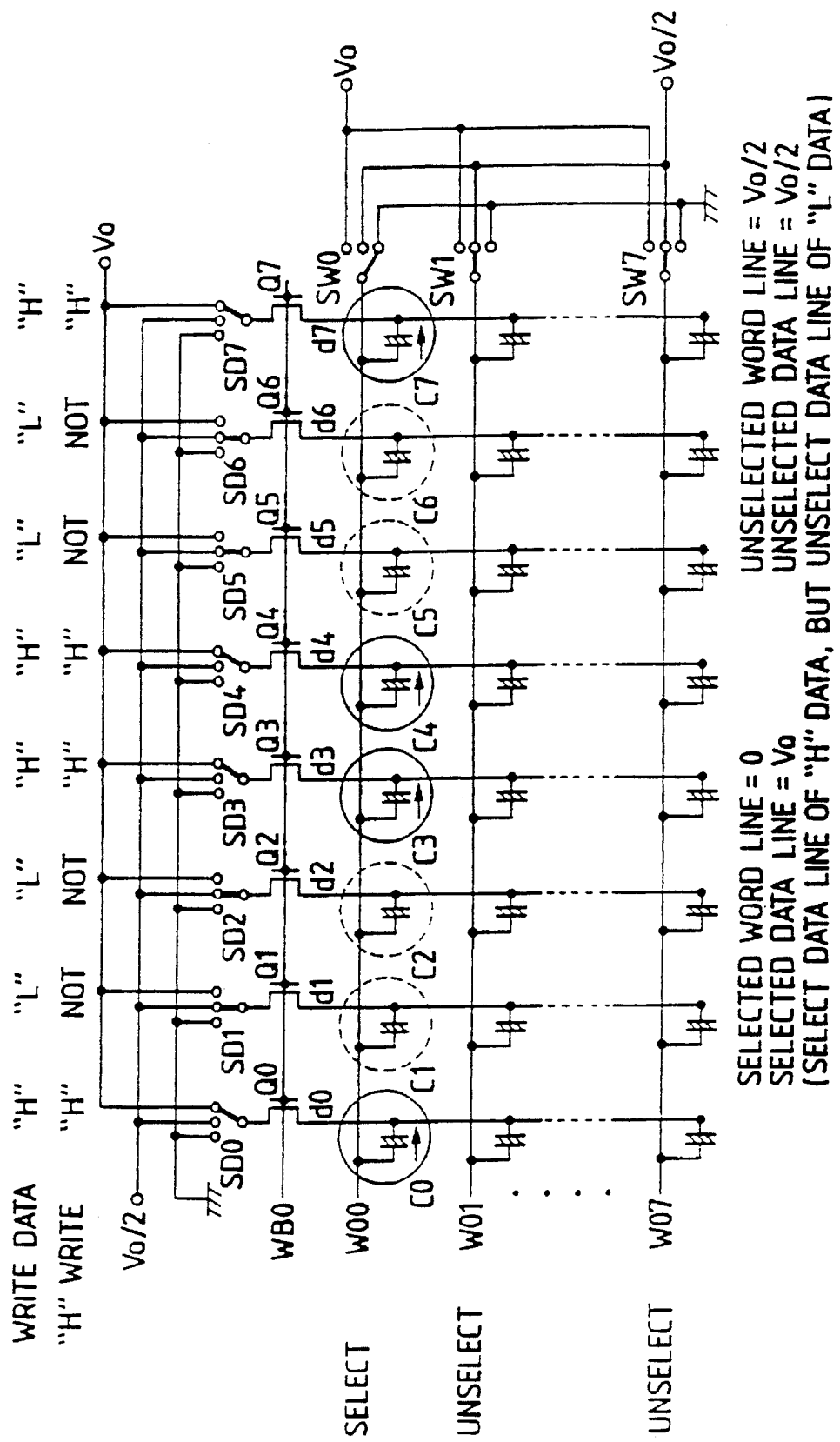
FIG. 2 is a circuit diagram for explaining a first writing operation of one embodiment of the writing method of the semiconductor memory system.

FIG. 2 is a circuit diagram for explaining one embodiment of the writing method of the aforementioned semiconductor memory system. In FIG. 2, there are mainly shown the relations among the first word line, the second word line and the data lines in case of writing data of total 8 bits bit by bit from the eight memory blocks. In FIG. 2, the portions, as indicated by switches SW0 to SW7, show the operations of the X-decoder XDEC, and the portions, as indicated by switches SD0 to SD7, show the operations of the write/read circuit WRC.

When the bit pattern of the write data fed from the external terminals DIO-0 to DIO-7 is "H" "L" "L" "H" "H" "L" "L" "H", the individual data lines selected by the Y-selects 0 to 7 are written with the data of "H" as a first operation. As a result, the data lines corresponding to "H" are fed with the write voltage of Vo from the switches SD0, SD3, SD4 and SD7. On the other hand, the data lines corresponding to "L" are fed with the half value of Vo/2 (NOT) of the write voltage of Vo as such an unselect voltage as will cause no inversion of polarization in the ferroelectric capacitors.

At this time, the first word line WB0 is set to the high level to turn ON the switch MOSFETs Q0 to Q7. As a result, of sub-data lines d0 to d7 connected through the switch MOSFETs Q0 to Q7, some written with "H" are fed with Vo whereas the others unwritten are fed with Vo/2.

Of second word lines W00 to W07, the selected one second word line W00 is fed with the earth potential (of 0 V) of the circuit from the switch SW0, whereas the remaining seven second word lines are fed with the potential of Vo/2.

As a result, of the ferroelectric capacitors C0 to C7 corresponding to the second word line W00, the ferroelectric capacitors C0, C3, C4 and C7 fed with the voltage of Vo are polarized in the directions of arrows. The remaining capacitors C1, C2, C5 and C6 connected with the aforementioned second word line W00 are held in the previous state because they are fed with such a voltage of Vo/2 as will cause no polarization in the ferroelectric capacitors.

Of the select blocks having their switch MOSFETs Q0 to Q7 turned ON and their second word lines unselected, those connected with the sub-data lines d0, d3, d4 and d7 to be subjected to the aforementioned writing operation are held in the previous polarized state like before because what they are fed with is the voltage of Vo/2 at the highest. Moreover, the ferroelectric capacitors connected with the remaining sub-data lines d1, d2, d5 and d6 not to be subjected to the writing operation are subject to no stress, because their two electrodes are at the same potential of Vo/2 so that they receive no voltage.

Although not shown in FIG. 2, in the memory block in which the switch elements connected with the unselected first word line are OFF, all the second word lines are at the earth potential of 0 V of the circuit, and the unselected ferroelectric capacitors are kept away from the stress by precharging the aforementioned sub-data lines d0 to d7 with the same potential of 0 V.

Thus, the stress upon the unselected ferroelectric capacitors can be minimized by giving the X-decoders or write amplifiers the ternary voltages of 0, Vo/2 and Vo and by combining these voltages.

Incidentally, the potential of Vo/2 may be fed to the data lines by setting the potential of the data lines corresponding to the data "L" to Vo/2 of unselection (NOT) not by the write amplifier but by the Y-select of FIG. 1. In this case, the Y-decoder YDEC is also fed with the write data.

Figure 8:
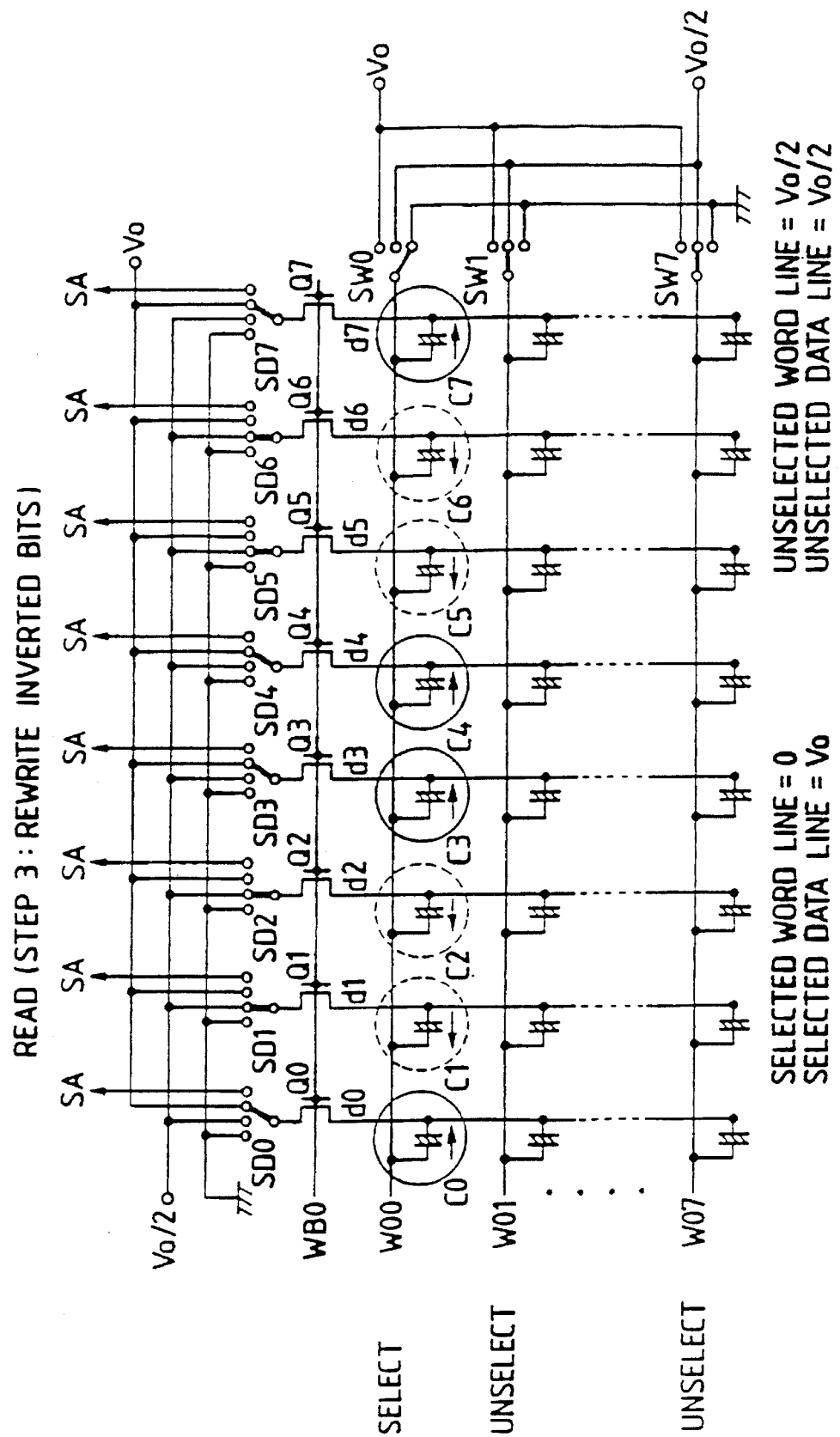
FIG. 8 is a circuit diagram for explaining the operation of Step 3 (of rewiring inverted bits) and shows one embodiment of the reading method of the semiconductor memory system.

FIG. 8 is a circuit diagram for explaining a second operation to be carried out subsequent to the operation of FIG. 2. The individual data lines, which are selected by the Y-select 0 to 7 in each memory block when the bit pattern of the write data to be fed from the external terminals DIO-0 to DIO-7 is "H", "L", "L", "H", "H", "L", "L" and "H", are written with "L" as the second writing operation.

The data lines corresponding to the aforementioned data "L" are fed with the voltage of 0 V from the switches SD1, SD2, SD5 and SD6. At this time, the written data lines corresponding to the data "H" are fed with the half voltage of Vo/2 (NOT) of the write voltage of Vo as such an unselect voltage as will cause no inversion of polarization in the ferroelectric capacitors.

At this time, too, the first word line WB0 is raised to the high level to turn ON the switch MOSFETs Q0 to Q7. As a result, of the sub-data lines d0 to d7 connected through the switch MOSFETs Q0 to Q7, some written with the data "L" are fed with 0 V whereas the unwritten others are fed with Vo/2.

Of the second word lines W00 to W07, the selected one second word line W00 is fed with the aforementioned write voltage Vo by the switch SW0 whereas the remaining seven second word lines are fed with the potential of Vo/2.

As a result, of the ferroelectric capacitors C0 to C7 corresponding to the second word line W00, the ferroelectric capacitors C1, C2, C5 and C6 fed reversely with the voltage of Vo are polarized in the directions of arrows. The remaining capacitors C0, C3, C4 and C7 connected with the aforementioned second word line W00 are held in the previous polarized state because they are fed with such a voltage of Vo/2 as will cause no polarization in the ferroelectric capacitors.

Of the select blocks having their switch MOSFETs Q0 to Q7 turned ON and their second word lines unselected, those connected with the sub-data lines d1, d2, d5 and d6 to be subjected to the aforementioned writing operation are held in the previous polarized state like before because what they are fed with is the voltage of Vo/2 at the highest. Moreover, the ferroelectric capacitors connected with the remaining sub-data lines d0, d3, d4 and d7 not to be subjected to the writing operation are subject to no stress, because their two electrodes are at the same potential of Vo/2 so that they receive no voltage.

Figure 3:
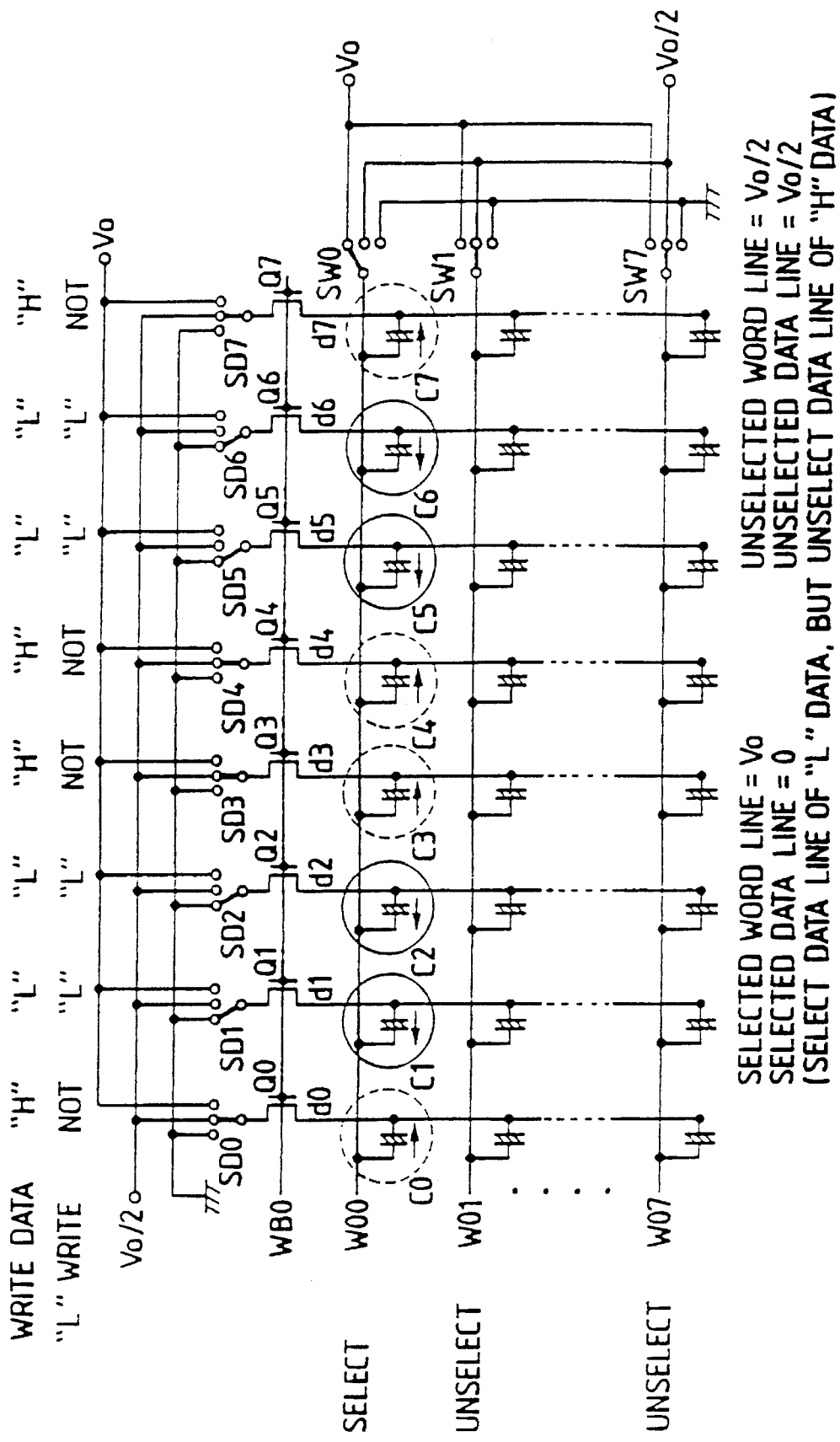
FIG. 3 is a circuit diagram for explaining a second writing operation of one embodiment of the writing method of the semiconductor memory system.

Although not shown in FIG. 3, in the memory block in which the switch elements connected with the unselected first word line are OFF, all the second word lines are at the earth potential of 0 V of the circuit, and the unselected ferroelectric capacitors are kept away from the stress by precharging the aforementioned sub-data lines d0 to d7 with the same potential of 0 V.

Incidentally, the potential of Vo/2 may be fed to the data lines by setting the potential of the data lines corresponding to the data "H" to Vo/2 of unselection (NOT) not like the aforementioned first writing operation but by the Y-select of FIG. 1.

Figure 4:
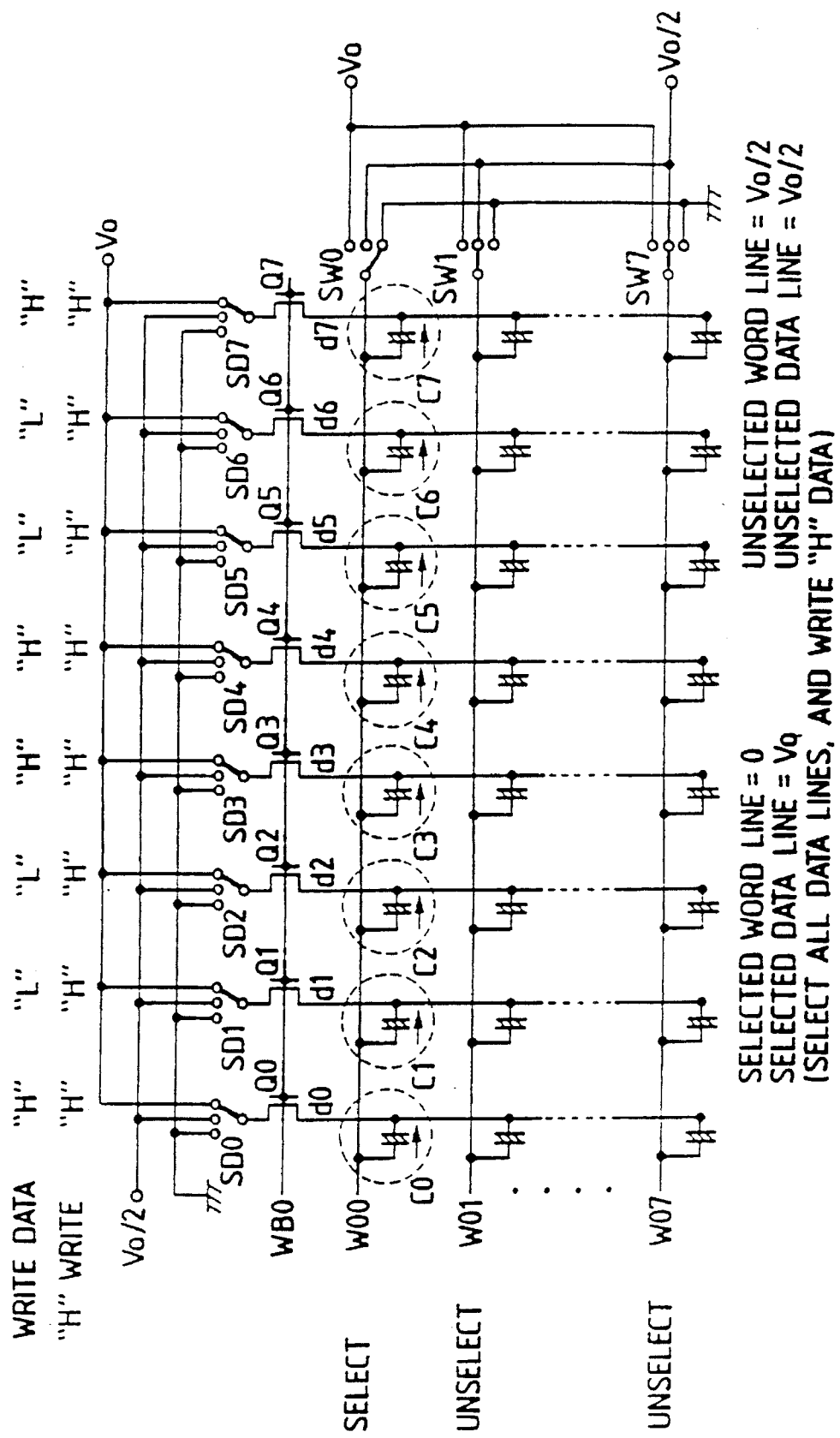
FIG. 4 is a circuit diagram for explaining a first writing operation of another embodiment of the writing method of the semiconductor memory system.

FIG. 4 is a circuit diagram for explaining one embodiment of the writing method of the aforementioned semiconductor memory system. In FIG. 4, too, there are mainly shown the relations among the first word line, the second word line and the data lines in case of writing data of total 8 bits bit by bit from the eight memory blocks. In FIG. 4, the portions, as indicated by switches SW0 to SW7, show the operations of the X-decoder XDEC, and the portions, as indicated by switches SD0 to SD7, show the operations of the write/read circuit WRC.

When the bit pattern of the write data fed from the external terminals DIO-0 to DIO-7 is "H" "L" "L" "H" "H" "L" "L" "H", all the ferroelectric capacitors C0 to C7 are written with the data of "H" as a first operation. As a result, all the data lines are evenly fed with the write voltage Vo in response to the data "H" independently of the aforementioned actual write data.

At this time, the first word line WB0 is set to the high level to turn ON the switch MOSFETs Q0 to Q7. As a result, the sub-data lines d0 to d7 to be connected through the switch MOSFETs Q0 to Q7 are fed with Vo in response to the "H" write.

Of the second word lines W00 to W07, the selected one second word line W00 is fed with the earth potential (0 V) by the switch SW0 whereas the remaining seven second word lines are fed with the potential of Vo/2.

As a result, the ferroelectric capacitors C0 to C7 corresponding to the second word line W00 are polarized in the direction of arrows. The remaining capacitors connected with the aforementioned second word lines W01 to W07 are held in the previous polarized state because they are fed with with such a voltage of Vo/2 as will cause no polarization in the ferroelectric capacitors.

Although not shown in FIG. 4, in the memory block in which the switch elements connected with the unselected first word line are OFF, all the second word lines are at the earth potential of 0 V of the circuit, and the unselected ferroelectric capacitors are kept away from the stress by precharging the aforementioned sub-data lines d0 to d7 with the same potential of 0 V. Thus, the stress upon the unselected ferroelectric capacitors can be reduced by giving the X-decoders or write amplifiers the ternary voltages of 0, Vo/2 and Vo and by combining these voltages.

And, of the bit pattern of "H", "L", "L", "H", "H", "L", "L" and "H" of the write data to be fed from the external terminals DIO-0 to DIO-7, the write corresponding to the data "L" is carried out as the second writing operation. This operation is carried out as in FIG. 3.

As shown in FIG. 3, the data lines corresponding to the aforementioned data "L" are fed with the voltage of 0 V from the switches SD1, SD2, SD5 and SD6. At this time, the written data lines corresponding to the data "H" are fed with the voltage of Vo/2 (NOT) as such an unselect voltage as will cause no inversion of polarization in the ferroelectric capacitors.

In this second writing operation, too, the first word line WB0 is raised to the high level to turn ON the switch MOSFETs Q0 to Q7. As a result, of the sub-data lines d0 to d7 connected through the switch MOSFETs Q0 to Q7, some written with the data "L" are fed with 0 V whereas the unwritten others are fed with Vo/2.

Of the second word lines W00 to W07, the selected one second word line W00 is fed with the aforementioned write voltage Vo by the switch SW0 whereas the remaining seven second word lines are fed with the potential of Vo/2.

As a result of the ferroelectric capacitors C0 to C7 corresponding to the second word line W00, the ferroelectric capacitors C1, C2, C5 and C6 fed reversely with the voltage of Vo are polarized in the directions of arrows. The remaining capacitors C0, C3, C4 and C7 connected with the aforementioned second word line W00 are held in the polarized direction by the batch write, because they are fed with such a voltage of Vo/2 as will cause no polarization in the ferroelectric capacitors.

Of the select blocks having their switch MOSFETs Q0 to Q7 turned ON and their second word lines unselected, those connected with the sub-data lines d1, d2, d5 and d6 to be subjected to the aforementioned writing operation are held in the previous polarized state like before because what they are fed with is the voltage of Vo/2 at the highest. Moreover, the ferroelectric capacitors connected with the remaining sub-data tines d0, d3, d4 and d7 not to be subjected to the writing operation are subject to no stress, because their two electrodes are at the same potential of Vo/2 so that they receive no voltage.

Although not shown in FIG. 4, in the memory block in which the switch elements connected with the unselected first word line are OFF, all the second word lines are at the earth potential of 0 V of the circuit, and the unselected ferroelectric capacitors are kept away from the stress by precharging the aforementioned sub-data lines d0 to d7 with the same potential of 0 V.

Incidentally, the potential of Vo/2 may be fed to the data lines by setting the potential of the data lines corresponding to the data "H" to Vo/2 of unselection (NOT) not like the aforementioned first writing operation but by the Y-select of FIG. 1.

Figure 5:
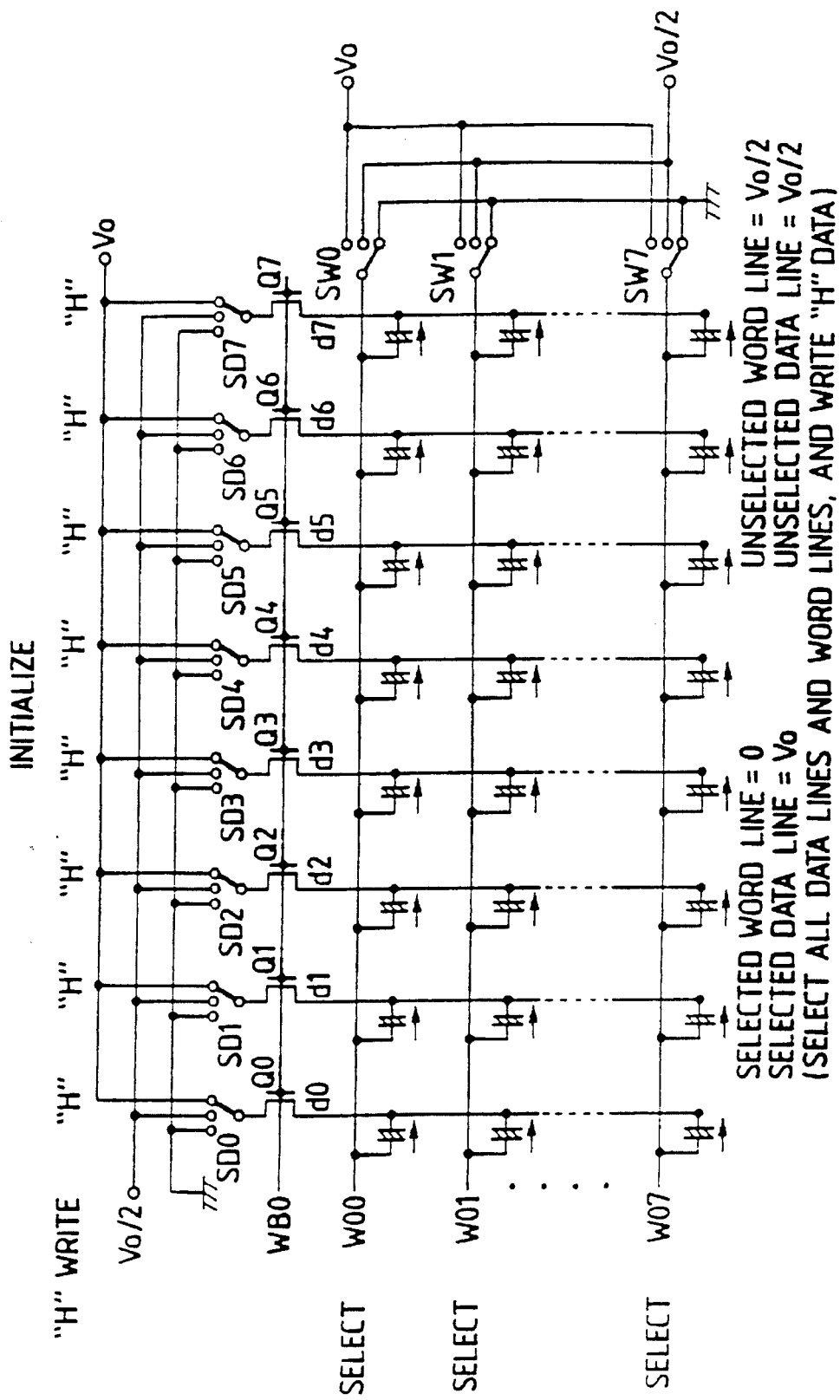
FIG. 5 is a circuit diagram for explaining an initializing operation of still another embodiment of the writing method of the semiconductor memory system.

FIG. 5 is a circuit diagram for explaining still another embodiment of the writing method of the aforementioned semiconductor memory system. In FIG. 5, there are mainly shown the relations among the first word line, the second word line and the data lines in case of initializing all the ferroelectric capacitors of one memory block. In FIG. 5, as before, the portions, as indicated by switches SW0 to SW7, show the operations of the X-decoder XDEC, and the portions, as indicated by switches SD0 to SD7, show the operations of the write/read circuit WRC.

In this embodiment, the memory block is initialized before the writing operation. In other words, the writing operation is so carried out that all the ferroelectric capacitors may be polarized to one polarity. This embodiment is exemplified by writing the data "H" for the initialization. In short, all the data lines are fed with the voltage Vo corresponding to "H". This voltage Vo may be either outputted from the write amplifier or fed to all the data lines by the Y-select.

When the first word line WB0 is set to the high level to turn ON the switch MOSFETs Q0 to Q7, the sub-data lines d0 to d7 connected through the MOSFETs Q0 to Q7 are fed with Vo in response to the writing of "H". And, the second word lines W00 to W07 are fed altogether with the earth potential (0 V) by the switches SW0 to SW7. As a result, all the ferroelectric capacitors in the memory block are polarized in the directions of arrows.

Although not shown in FIG. 5, in the memory block which is not initialized by turning OFF the switch elements connected with the unselected first word lines, all the second word lines are at the earth potential of 0 V of the circuit, and the unselected ferroelectric capacitors are kept away from the stress by precharging the aforementioned sub-data lines d0 to d7 with the same potential of 0 V.

Moreover, when the ferroelectric capacitors C0 to C7 of the memory block, as corresponding to the second word line, are written with the data "H", "L", "L", "H", "H", "L", "L" and "H" in response to the write data fed from the external terminals DIO-0 to DIO-7, what is carried out is the writing operation corresponding to "L" of those data. This operation is carried out as in FIG. 3.

As shown in FIG. 3, the data lines corresponding to the aforementioned data "L" are fed with the voltage of 0 V from the switches SD1, SD2, SD5 and SD6. At this time, the written data lines corresponding to the data "H" are fed with the voltage of Vo/2 (NOT) as such an unselect voltage as will cause no inversion of polarization in the ferroelectric capacitors.

In this writing operation, too, the first word line WB0 is raised to the high level to turn ON the switch MOSFETs Q0 to Q7. As a result, of the sub-data lines d0 to d7 connected through the switch MOSFETs Q0 to Q7, some written with the data "L" are fed with 0 V whereas the unwritten others are fed with Vo/2.

Of the second word lines W00 to W07, the selected one second word line W00 is fed with the aforementioned write voltage Vo by the switch SW0 whereas the remaining seven second word lines are fed with the potential of Vo/2. As a result, of the ferroelectric capacitors C0 to C7 corresponding to the second word line W00, the ferroelectric capacitors C1, C2, C5 and C6 fed reversely with the voltage of Vo are polarized in the directions of arrows. The remaining capacitors C0, C3, C4 and C7 connected with the aforementioned second word line W00 are held in the polarized direction by the initialization, because they are fed with such a voltage of Vo/2 as will cause no polarization in the ferroelectric capacitors.

Of the select blocks having their switch MOSFETs Q0 to Q7 turned ON and their second word lines unselected, those connected with the sub-data lines d1, d2, d5 and d6 to be subjected to the aforementioned writing operation are held in the previous polarized state like before because what they are fed with is the voltage of Vo/2 at the highest. Moreover, the ferroelectric capacitors connected with the remaining sub-data lines d0, d3, d4 and d7 not to be subjected to the writing operation are subject to no stress, because their two electrodes are at the same potential of Vo/2 so that they receive no voltage. In the construction of this initialization, the power consumption can be reduced because the data corresponding the direction opposed to the polarization direction for the initialization are not actually written, and the writing time period can be substantially shortened by the initialization of the block unit.

Although not shown in FIG. 5, in the memory block in which the switch elements connected with the unselected first word line are OFF, all the second word lines are at the earth potential of 0 V of the circuit, and the unselected ferroelectric capacitors are kept away from the stress by precharging the aforementioned sub-data lines d0 to d7 with the same potential of 0 V.

Figure 6:
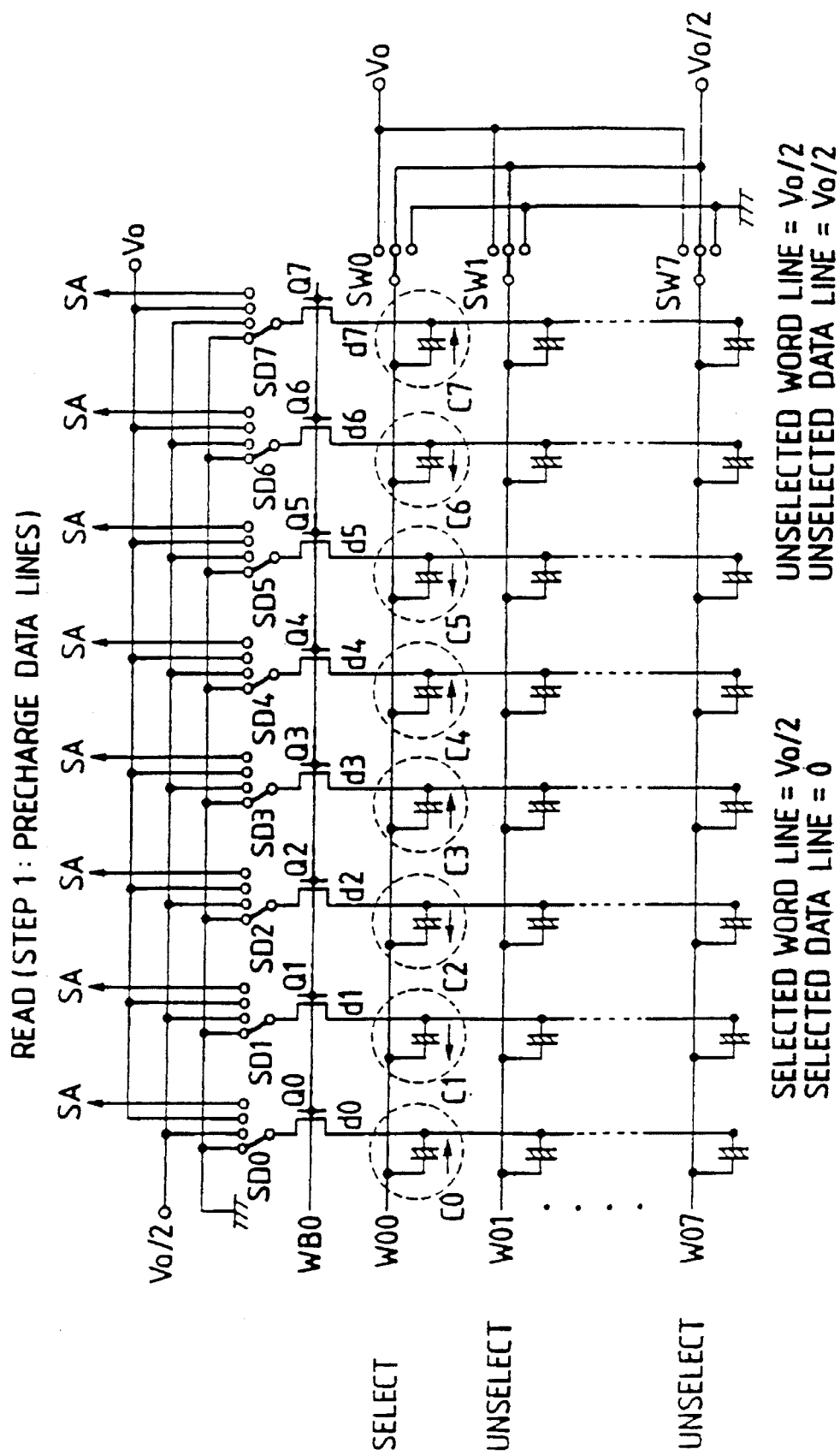
FIG. 6 is a circuit diagram for explaining the operation of Step 1 (of precharging data lines) and shows one embodiment of the reading method of the semiconductor memory system.

FIG. 6 is a circuit diagram for explaining the operations of Step 1 (of precharging the data lines) of one embodiment of the aforementioned semiconductor memory system reading method. In FIG. 6, there are mainly shown the relations among the potential to be fed to the data lines, which are individually selected from the eight memory blocks by the Y-select, and the first word lines and the second word lines at the first for reading the ferroelectric capacitors. In FIG. 5, as before, the portions, as indicated by switches SW0 to SW7, show the operations of the X-decoder XDEC, and the portions, as indicated by switches SD0 to SD7, show the operations of the write/read circuit WRC.

At Step 1, the selected data line is fed with the precharge voltage such as the earth potential of the circuit. At this time, the first word line WB0 is set to the high selection level, and the switch MOSFETs Q0 to Q7 are turned ON. As a result, the sub-data lines d0 to d7 of the selected unit memory circuit are fed with the precharge voltage of 0 V or the like. This precharge voltage is fed by the MOSFET Q0 which is made receptive of the timing signal φ of FIG. 1. At this time, the second word lines W00 to W07 are fed with the potential of Vo/2 no matter whether they might be selected or unselected. Although not shown in FIG. 6, the unselected data lines of each memory block are fed with the voltage of Vo/2 or the like.

At Step 1 described above, any of the ferroelectric capacitors is fed with the voltage of Vo/2 at the highest so that the direction of polarization is held according to the stored data, for example, as indicated by arrows in FIG. 6.

Figure 7:
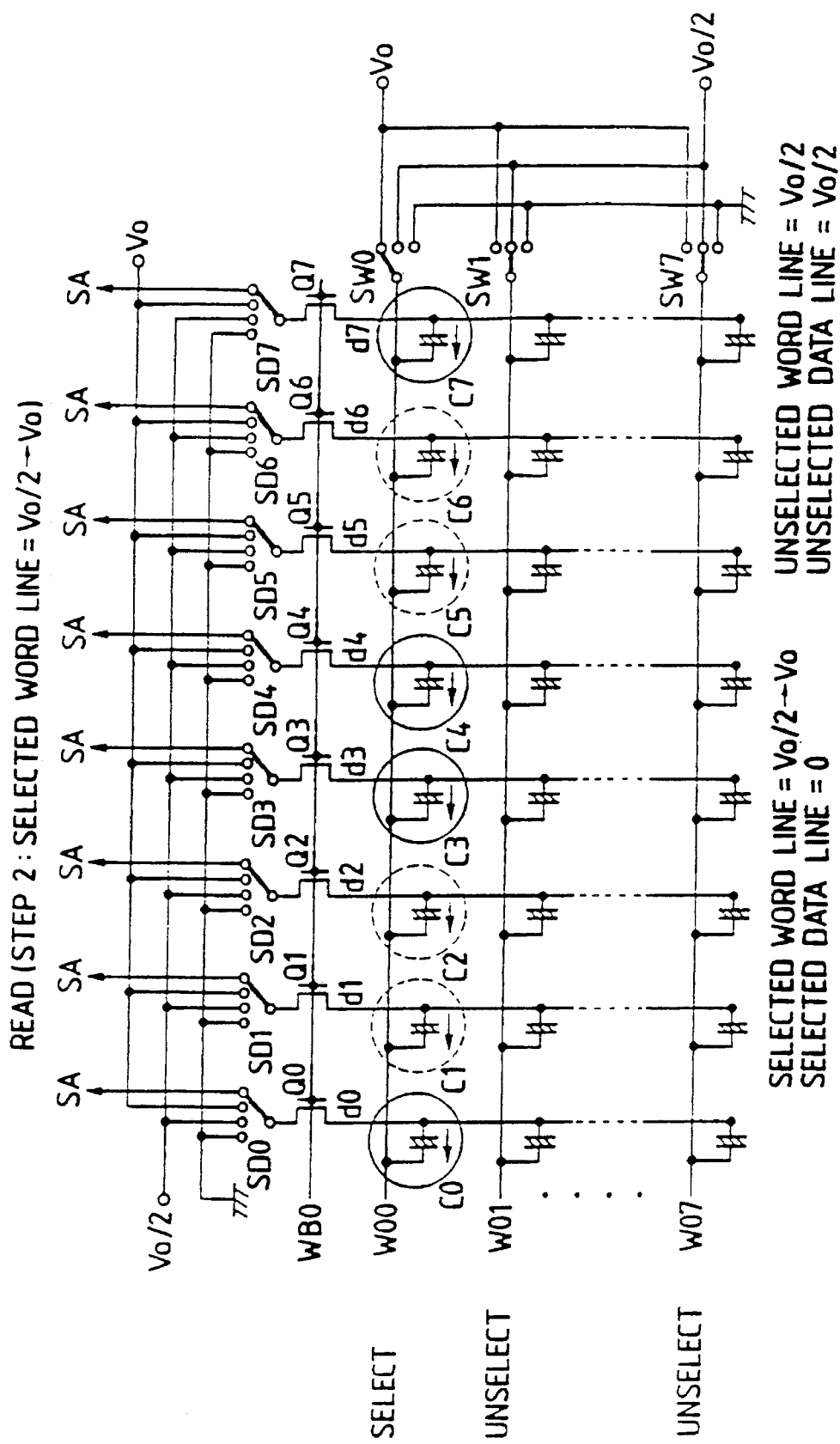
FIG. 7 is a circuit diagram for explaining the operation of Step 2 (of selecting word lines) and shows one embodiment of the reading method of the semiconductor memory system.

FIG. 7 is a circuit diagram for explaining the operations of Step 2 (of selecting the word lines) of one embodiment of the method of reading the aforementioned semiconductor memory system. In case the stored data of the ferroelectric capacitors connected with the second word line W00 are to be read, as shown in FIG. 7, the second word line W00 has its potential changed from Vo/2 to Vo. In accordance with this, the selected data line is coupled to the input of the sense amplifier SA. In accordance with the potential change of the selected word line, the ferroelectric capacitors C0, C3, C4 and C7, as enclosed by circles of solid lines in FIG. 7, are fed with the polarization inverting voltage so that their polarizations are inverted. As a result of this polarization inversion, the ferroelectric capacitors C0, C3, C4 and C7 are passed therethrough by the electric current corresponding to the migration of charge consumed for the polarization inversion, and this current is sensed by the sense amplifier SA.

On the contrary, the ferroelectric capacitors C1, C2, C5 and C6, which intrinsically hold the polarization in the same direction (i.e., leftward of FIG. 7) against the aforementioned precharge voltage and the voltage fed to the second word line W00, neither have any charge migration due to the polarization inversion nor transmit any current. This absence of current is sensed by the sense amplifier SA.

FIG. 8 is a circuit diagram for explaining the operations of Step 3 (of rewriting) of one embodiment of reading the aforementioned semiconductor memory system. In FIG. 7, the memory states of the ferroelectric capacitors are destructively read in dependence upon whether the polarization is inverted or not. This makes it necessary to restore the initial memory states. Thus, the sensed data are outputted to the outside through the latch circuit DOL and fed back to the DIL. On the basis of these read data, the data lines corresponding to the ferroelectric capacitors C0, C3, C4 and C7 requiring the rewrite are fed with the voltage Vo, whereas the data lines corresponding to the ferroelectric capacitors C1, C2, C5 and C6 requiring no rewrite are fed with the voltage Vo/2. In short, the "H" write like that shown in FIG. 2 is carried out.

FIGS. 9(A) to 9(C) show is a waveforms chart corresponding to the writing method shown in FIGS. 2 and 3. The first word line, which is connected with the gates of the transfer (or switch) MOSFETs, is fed with a select voltage Vw. This voltage Vw is set to such a high voltage as is an addition of at least the aforementioned write voltage Vo and the effective threshold voltage of the transfer MOSFETs. As a result, the write voltage Vo to be transferred to the data lines is transmitted to the sub-data lines of the unit memory circuit without being influenced by the threshold voltage of the transfer MOSFETs.

For the first and second writing period, the first word line connected with the gates of the aforementioned transfer MOSFETs has its potential held at the select potential such as Vw. In the first "H" writing operation the selected second word line has its potential changed from the unselect level such as Vo/2 to the select voltage such as Vo. In synchronism with this, the data lines have their potentials changed from the unselect level such as Vo/2 to the write voltage such as Vo. As a result, the selected ferroelectric capacitors are fed with the voltage Vo so that they are polarized in one direction.

In the subsequent second "L" writing operation, the selected word line has its potential changed from 0 V to Vo so that the data lines have their potentials changed from Vo to 0 V. As a result, the selected ferroelectric capacitors are fed with the write voltage Vo in the opposite polarity so that they are polarized in the opposite direction.

At the end of the writing operation described above, the potentials of the second word line and the data lines are set at first to the unselect level such as Vo/2. After the ferroelectric capacitors thus have their inter-electrode potentials equalized, the select voltage Vw of the first word line connected with the gates of-the transfer MOSFETs is set to the unselect potential such as 0 V to turn OFF the transfer MOSFETs. As a result, no stress is applied to the ferroelectric capacitors in the data holding state.

In place of this construction, at the end of the writing operation described above, both the second word line and the data lines are set to the earth potential of the circuit such as 0 V, and the select voltage Vw of the first word line connected with the gates of the transfer MOSFETs is then set to the unselect potential such as 0 V to turn OFF the transfer MOSFETs. Since the sub-data lines in the floating state have their potentials set to 0 V in this construction, the memory block to which this unit memory circuit belongs is placed in the unselected state, so that no stress can be applied to the ferroelectric capacitors even if the second word line is set to the earth potential of the circuit, as described above.

Incidentally, in case the second word line and the data lines are at the unselected level of Vo/2, as shown in FIGS. 9(A) and 9(B), the stress can also be prevented from being applied, if the potential of the second word line corresponding to the unselected memory block is set to the unselected level such as Vo/2 unlike the foregoing construction. However, the sub-data lines in the floating state are subject not to the inversion of polarization after lapse of a predetermined time period but to the stress due to the steady application of the voltage such as Vo/2, if they are changed to the earth potential of the circuit such as 0 V by the leakage current. Therefore, the sub-data lines may desirably reset to 0 V at the end of the aforementioned writing operation.

FIGS. 10(A) to 10(C) show waveforms chart corresponding to the aforementioned reading methods shown in FIGS. 6 to 8. The first word line connected with the gates of the transfer (or switch) MOSFETs is fed with the select voltage Vw for a series of reading periods.

In the data line precharge corresponding to Step 1, the data lines are exclusively set to the potential such as 0 V while the selected second word line is held at the unselected level such as Vo/2.

In the reading operation corresponding to Step 2, the selected second word line has its potential set to the write voltage such as Vo. As a result, in the ferroelectric capacitors to have polarizations inverted, the potential change corresponding to the migration of charge due to the polarization inversion appears in the data lines and is sensed by the sense amplifier. On the contrary, no potential change is caused in the data lines which are connected with the ferroelectric capacitors having no polarization inversion.

In the rewriting operation corresponding to Step 3, the potential of the second word line or the data lines is changed to return the inversion of polarizations to the initial state. At the end of this reading operation, too, the potential of the data lines and the second word line is held in the predetermined reset potential like the end of the writing operation before the transfer MOSFETs are turned OFF.

Figure 11:
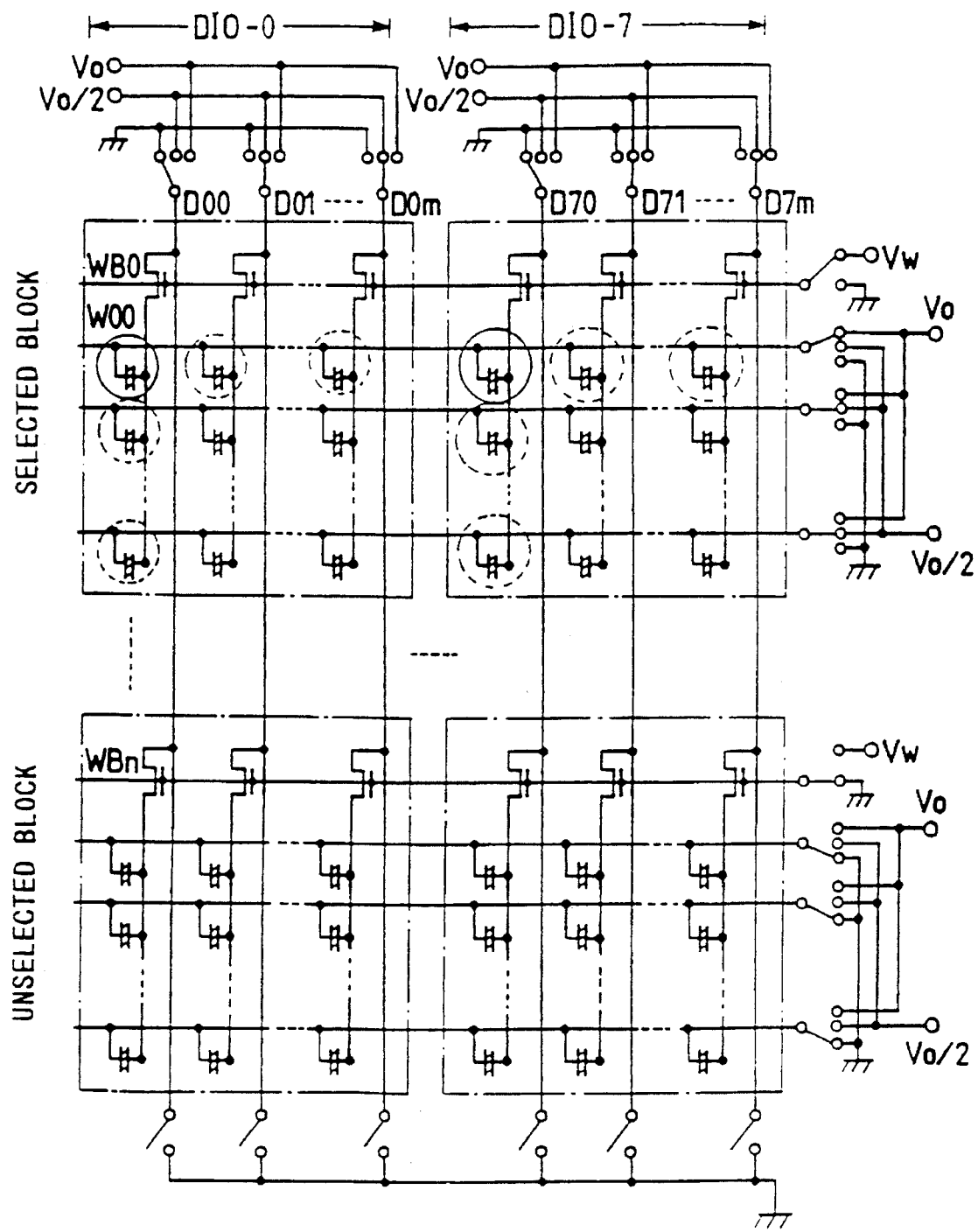
FIG. 11 is a circuit diagram for explaining one embodiment of the writing operation of the semiconductor memory system.

FIG. 11 is a circuit diagram for explaining one embodiment of the writing method of the aforementioned semiconductor memory system. In FIG. 11, there are separately shown a selected block to be subjected to the writing operation and an unselected block to be subjected to no writing operation. Eight blocks are provided to correspond in the row direction to the memory access at the aforementioned unit of 8 bits. In FIG. 11, there are representatively shown the blocks corresponding to the data terminals DIO-0 and DIO-7. Of the memory blocks 0 to n corresponding to the data lines, there are shown the 0-th block to be selected and the n-th block to be unselected representatively as the remaining ones.

Each block has (m+1) data lines 0 to m, and FIG. 11 shows as representatives the data lines D00 and D01 to D0m corresponding to the data terminal DIO-0 and the data lines D70 and D71 to D7m corresponding to the data terminal DIO-7.

There are shown in the aforementioned blocks 0 and n by way of example three word line: the first word lines WB0 and WBn for controlling the transfer MOSFETs; and three of the plurality of second word lines connected with the other terminals of the individual ferroelectric capacitors.

Although not especially limited, in this embodiment, after the initialization of FIG. 5, the block 0 and the first second word line are selected to be written as the X-system, and the 0-th data lines D00 and D70 are selected to be written as the Y-system. In FIG. 11, too, what is shown in the mode of each switch indicates like before the operations of the X-decoder XDEC, the Y-selector and the write/read circuit WRC.

In the selected block, the first word line WB0 is fed with the select level such as Vw. As a result, the transfer MOSFETs of the selected block 0 are turned ON. The second word line connected with the ferroelectric capacitor to be written is fed with the write voltage Vo. The remaining second word lines are fed with the unselect voltage Vo/2. The selected data lines D00 to D70 are fed with the earth potential Vo of the circuit whereas the remaining unselected data lines D01 to D0m and D71 to D7m are fed with the unselect voltage Vo/2 by the aforementioned Y-selector.

As a result, in the selected block, the ferroelectric capacitors, as enclosed by circles of solid lines, are so written as have their polarization direction inverted from that of the initialization. On the other hand, the ferroelectric capacitors, for which either the data lines or the second word lines are selected as enclosed by circles of broken lines, are fed with only the unselect voltage Vo/2 so that they are held in the aforementioned state of initialization. Thus, the aforementioned unselect voltage Vo/2 is applied as the stress. In the selected block, on the other hand, the ferroelectric capacitors, which are connected with the second word lines and the data lines at the common unselect level Vo/2, are not fed with any DC voltage so that they are not subject to any stress although they are in the selected block.

In the unselected block n, the transfer MOSFETs of the unselected block n are turned OFF because the first word line WBn is set to the unselect level such as the earth potential of the circuit. Likewise, the second word lines are also set to the unselect level such as the earth potential of the circuit. Thus, in the unselected block, the ferroelectric capacitors are not fed with any DC voltage.

In this embodiment, each data line is equipped with a resetting switch. This resetting switch operates the corresponding data line to 0 V or the earth potential of the circuit. Moreover, the Y-selector is steadily fed with the unselect level Vo/2 when in the unselected state, if the switch MOSFET made receptive of the output of the Y-decoder YDEC and the switch MOSFET for having the decoder output inverted by the inverter circuit are paired, as in the embodiment of FIG. 1.

In the aforementioned construction, the sub-data lines of the block cannot be reset to 0 V so that a DC stress is applied to the ferroelectric capacitors of the unselected block. Therefore, the Y-decoder or selector of this embodiment is constructed such that the paired switch elements of the data lines are simultaneously turned OFF.

Thus, as will be described with reference to the timing chart, the first word lines are held in the state of the select level Vw after the end of the writing operation. In this state, the switch MOSFETs of the Y-selector are turned OFF, and the resetting switches of the individual data lines are turned ON. As a result, the sub-data lines of the selected block have their potentials reset to 0 V. Substantially in synchronism with this, the second word lines in the selected block also have their potentials reset to a potential such as 0 V. After these data lines and sub-data lines have been discharged, the first word line WB0 is set to the unselect level such as 0 V to turn OFF the transfer MOSFETs.

Figure 12:
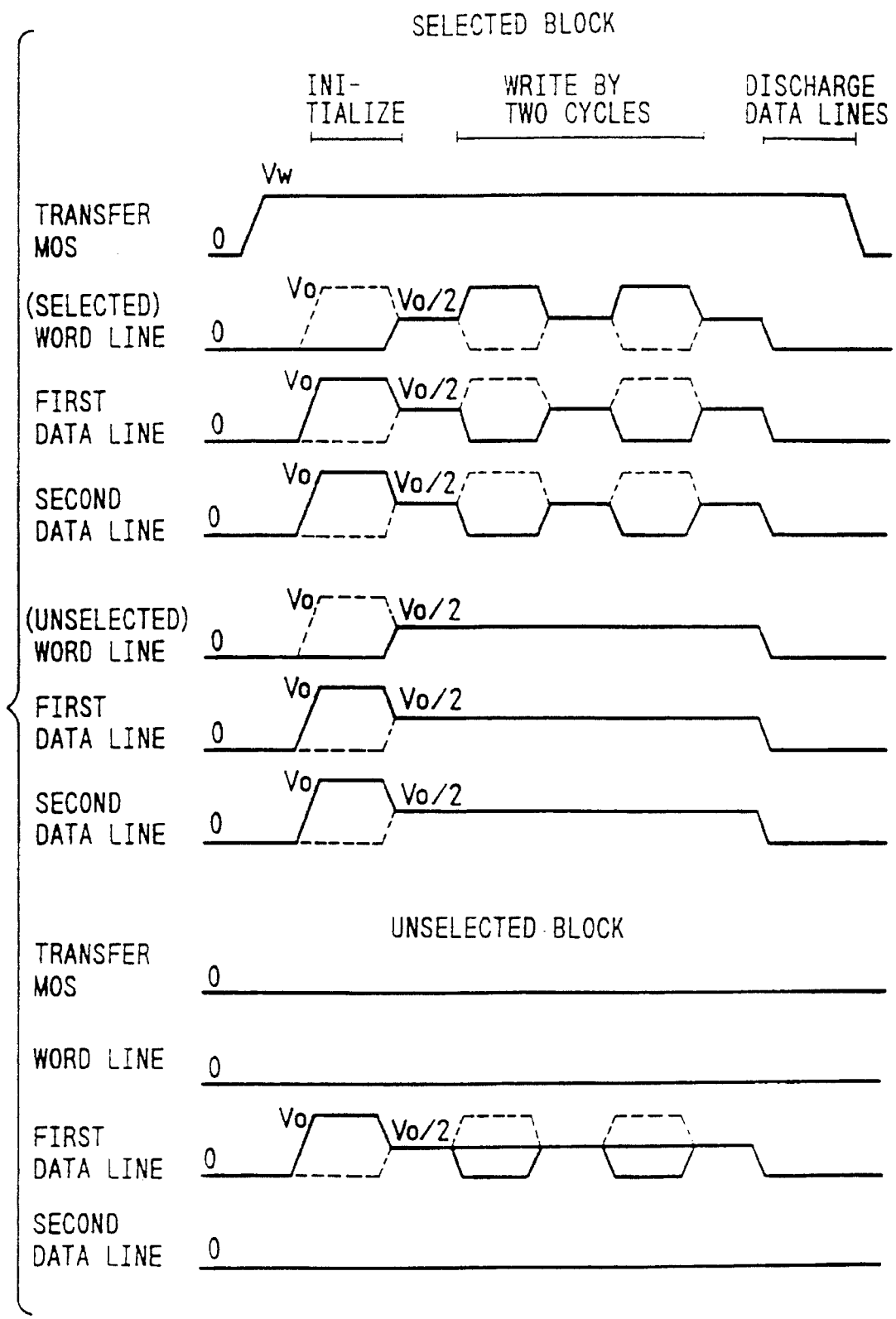
FIG. 12 is a timing chart for explaining one example of the writing operation of FIG. 11.

FIG. 12 is a timing chart for explaining one example of the aforementioned writing operation. What is indicated by broken lines in FIG. 12 shows the case, in which the direction of polarization is inverted at the time of initialization. In FIG. 12, the waveforms of initializations are also presented but do not mean that the memory access never fails to be followed by the initializations. These initializations are, so to speak, the deleting operations so that the data are instantly written without any initialization in case some unwritten ferroelectric capacitors in one block are to be written.

In FIG. 12, the transfer MOSFET corresponds to the first word line, and the word line corresponds to the second word line. When the writing operation by two cycles ends, like before, the individual second word lines and data lines in the selected block have their potentials set to the unselect level Vo/2 and then changed to 0 V in the discharge operation, to reset the sub-data lines or mainly the second data lines. After this, the first word line is set to the unselect level to turn OFF the transfer MOSFET.

In the unselected block, only the first data line has its potential changed in response to the memory access to the aforementioned selected block, and the potentials of both the second word line (or word line) and the sub-data line (or second data line) are at 0 V so that the stress due to the DC voltage is not applied in the least. The potential changes of the first data line are illustrated for both the selected and unselected ones.

Figure 13:
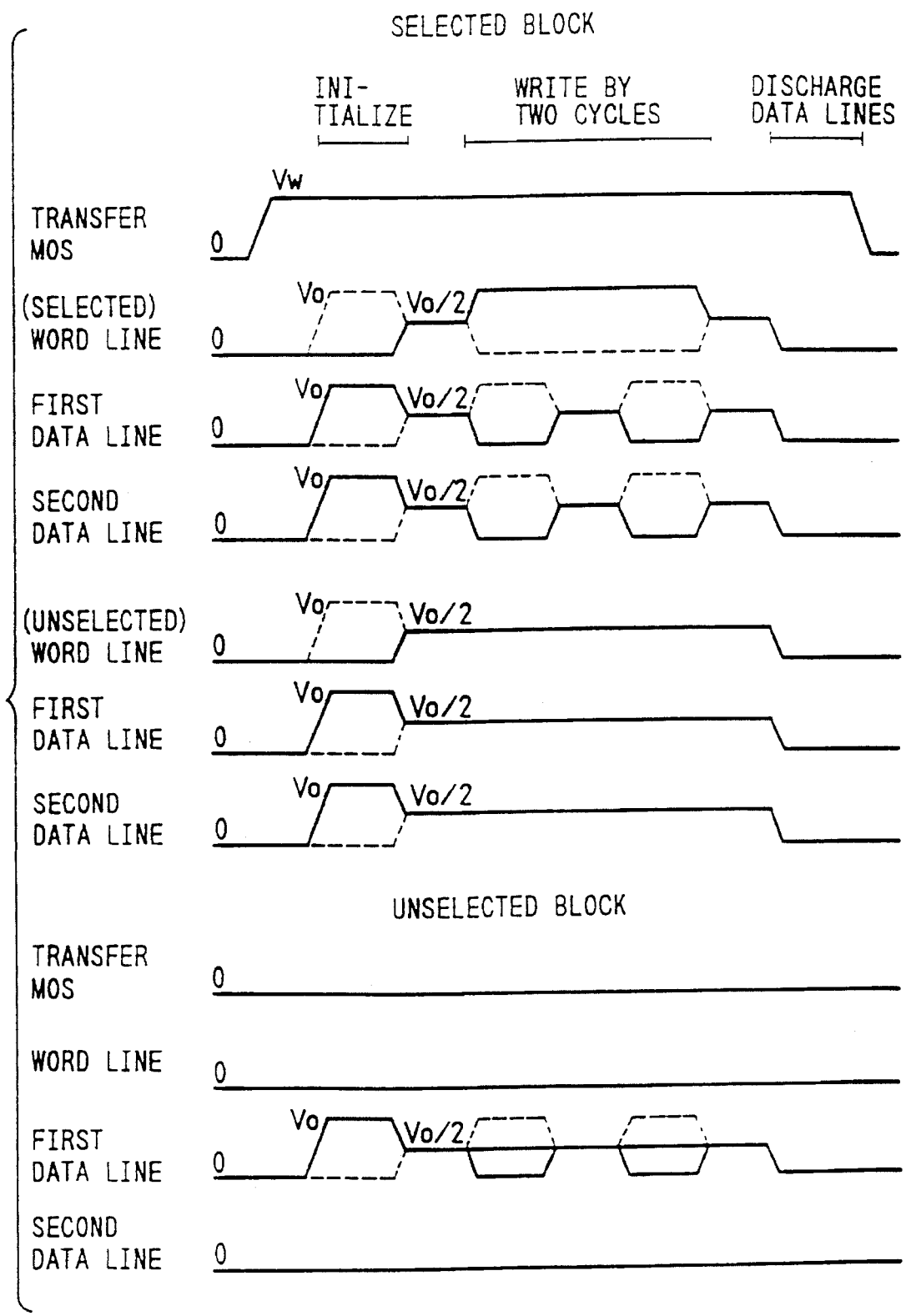
FIG. 13 is a timing chart for explaining another example of the writing operation of FIG. 11.

FIG. 13 is a timing chart for explaining another example of the aforementioned writing operation. The writing operation of FIG. 13 is slightly different from but substantially similar to that of FIG. 12. Specifically, in case of the writing operation of two cycles or more, the potentials of the word lines are not changed for each cycle unlike FIG. 12 but are left at the write voltage Vo, and the potentials at the data lines are changed. In this construction, too, the writing operation is carried out so that the ferroelectric capacitors are subjected to the writing operation for the time period corresponding to the potential changes in the first data lines.

Figure 14:
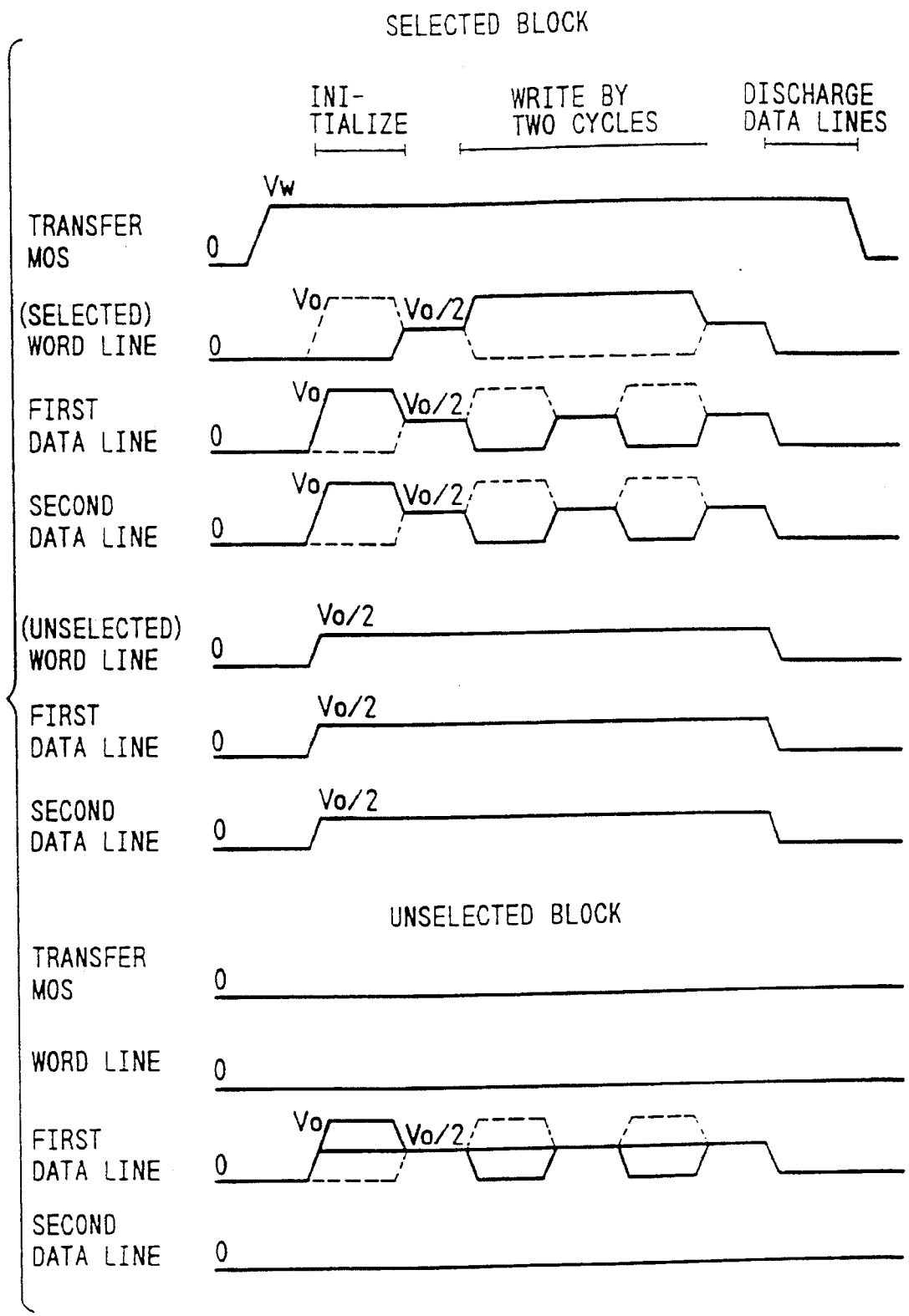
FIG. 14 is a timing chart for explaining still another example of the writing operation of FIG. 11.

FIG. 14 is a timing chart for explaining still another example of the aforementioned writing operation. The operation of FIG. 14 is similar to that of FIG. 13 excepting that the potentials at the initializations of the unselected word line and data line in the selected block are slightly differently set. Specifically, at the initialization of the selected block, the word line (or second word line), the first data line and the second data line to be unselected have their potentials held at the unselect level Vo/2.

Thus, the ferroelectric capacitors to be unwritten are held in the previous direction of polarization. Specifically, in one block, only a specific ferroelectric capacitor to be written is initialized. In this construction, the writing operation never fails to be followed by the initialization and is carried out as in the RAM (i.e., Random Access Memory). On the contrary, the aforementioned method of writing after the batch initializations is an access method such as the EPROM of batch deletion type.

Figure 15:
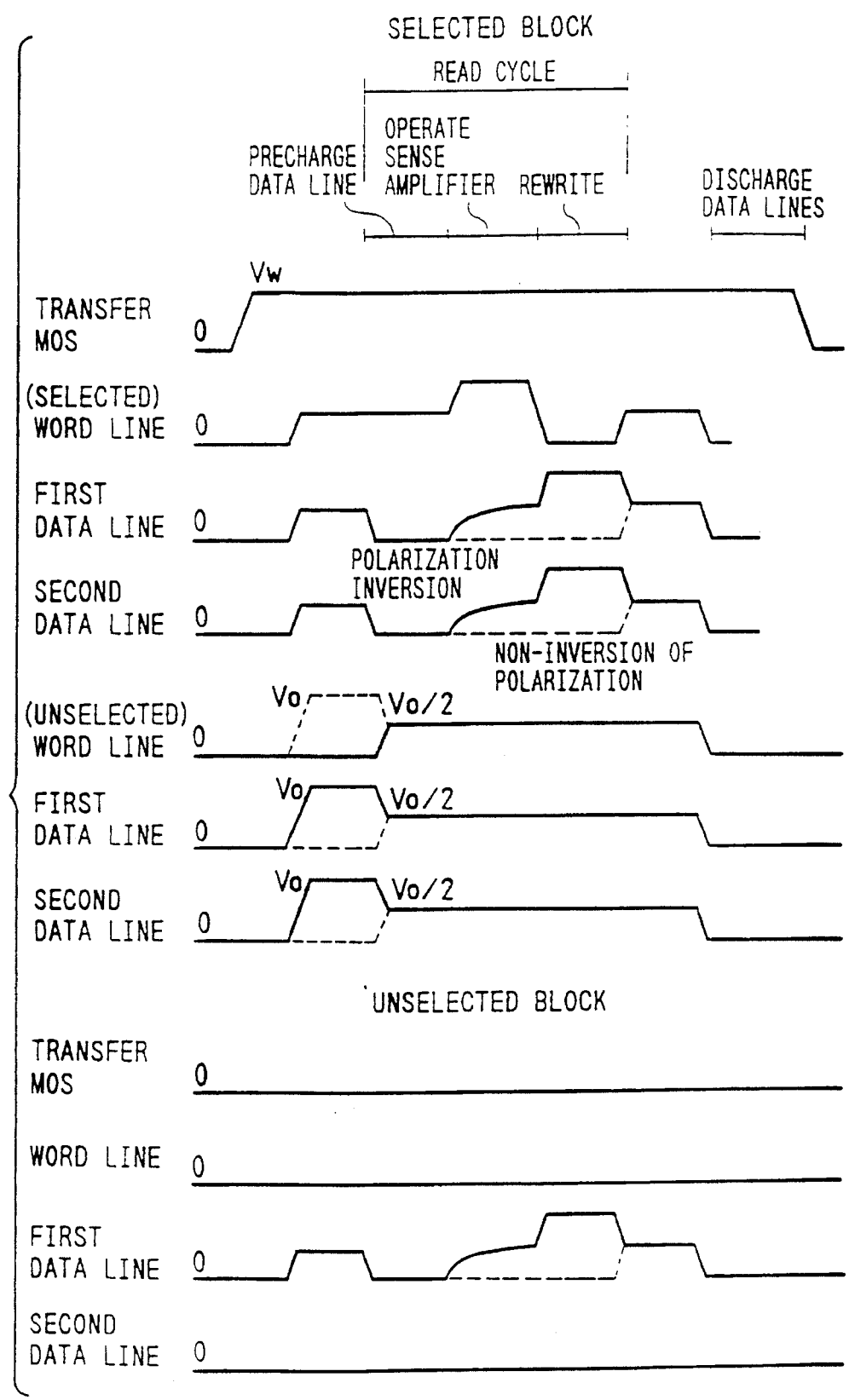
FIG. 15 is a timing chart for explaining one example of the reading operation.

FIG. 15 is a timing chart for explaining one example of the aforementioned reading operation. In FIG. 15, what is indicated by broken lines shows the case of no polarization inversion. The reading operation includes: three steps of reading cycles of precharging the data lines, operating the sense amplifier and rewriting; and a subsequent discharge of the data lines as in the writing operation. The potential settings of the individual word lines and data lines are basically similar to the foregoing ones of FIGS. 6 to 8 and FIG. 10, and their description will be omitted.

Here will be investigated the stress of Vo/2 which is applied to the ferroelectric capacitors to be unselected at the time of the memory access. This unselect voltage Vo/2 will not invert the polarizations of the ferroelectric capacitors directly but cannot be neglected if their number is increased or if their time period is elongated. As a result, the unselect voltage Vo/2 deteriorates the holding characteristics of the residual polarizations in the hysteresis characteristics of the ferroelectric capacitors between the polarization and the electric field.

TABLE 1

| | Word Line/Data Line | Invention | Prior Art 1 | Prior Art 2 | Prior Art 3 |
|---|---|---|---|---|---|
| Selected Block | Sel/Unsel | N-1 | N-1 | N-1 | N-1 |
| | Unsel/Sel | m-1 | M-1 | 0 | m-1 |
| | Unsel/Unsel | 0 | NM-1 | 0 | |
| Unselected Block | Sel/Unsel | — | — | — | — |
| | Unsel/Sel | — | — | — | — |
| | Unsel/Unsel | 0 | — | — | # |

In the Table:
"Sel": Selected; "Unsel": Unselected; and "#": N·m(M/m-1).

The semiconductor memory system of this embodiment is exemplified by connecting an m number (e.g., 8 ferroelectric capacitors with one switch element and by giving an N number (e.g., 128) of data lines and 1.024 second word lines. If a memory array having a total memory capacity of about 1 Mbits is imagined and if all the bits are subjected to one writing or reading operation, the stress of Vo/2 can be computed, as enumerated in Table 1.

In Table 1, there are tabulated for comparing purposes: the prior art (1) which has its ferroelectric capacitors equipped with no switch element but disposed at the nodes between the data lines and the word lines, as shown in FIG. 2 of Japanese Patent Laid-Open No. 2019998/1988; the prior art (2) which has its each ferroelectric capacitor equipped with one switch, as disclosed in Japanese Patent Laid-Open No. 36763/1990; and the prior art (3) which is constructed to have its each switch equipped with a plurality of ferroelectric capacitors, as disclosed in Japanese Patent Laid-Open No. 90189/1991, so that the voltage of Vo/2 is steadily fed as the unselect level, although not apparent from the Laid-Open.

The numbers of maximum stress are expressed by the following formulas (1) to (4):

$$\text{Maximum Stress of the Invention} = (N-1)+(m-1) \quad (1);$$

$$\text{Maximum Stress of the Prior Art } 1 = NM-1 \quad (2);$$

$$\text{Maximum Stress of the Prior Art } 2 = N-1 \quad (3);$$

and $$\text{Maximum Stress of the Prior Art } 3 = 1+(m-1)/(N-1)+Nm/(N-1)\cdot(M/m-1) \quad (4).$$

The ratios of the maximum stress to the Prior Art are expressed by the following formulas (5) to (7):

$$\text{Ratio of the Invention} = 1+(m-1)/(N-1) \quad (5);$$

$$\text{Ratio of the Prior Art } 1 = (NM-1)/(N-1) \quad (6);$$

and $$\text{Ratio of the Prior Art } 3 = 1+(m-1)/(N-1)+Nm/(N-1)\cdot(M/m-1) \quad (7).$$

The ratios for N=128, M=1,024 and m=8, as described above, are 1.06 in the present invention, which is substantially equal to 1 in the Prior Art 2, but are as high as 1,025 in the Prior Arts 1 and 3. Thus in the present invention, the stress of Vo/2 applied to the ferroelectric capacitors to be unselected at the time of memory access can be substantially equalized to that of the one-switch capacitor of the Prior Art 2 while raising the degree of integration by providing one switch element with the plurality of ferroelectric capacitors.

Incidentally, in case the memory access is carried out at the unit of 8 bits, there are provided totally eight memory arrays having constructions similar to the aforementioned one. As a result, the memory capacity given to the semiconductor memory system is as high as about 8 Mbits.

Figure 16:
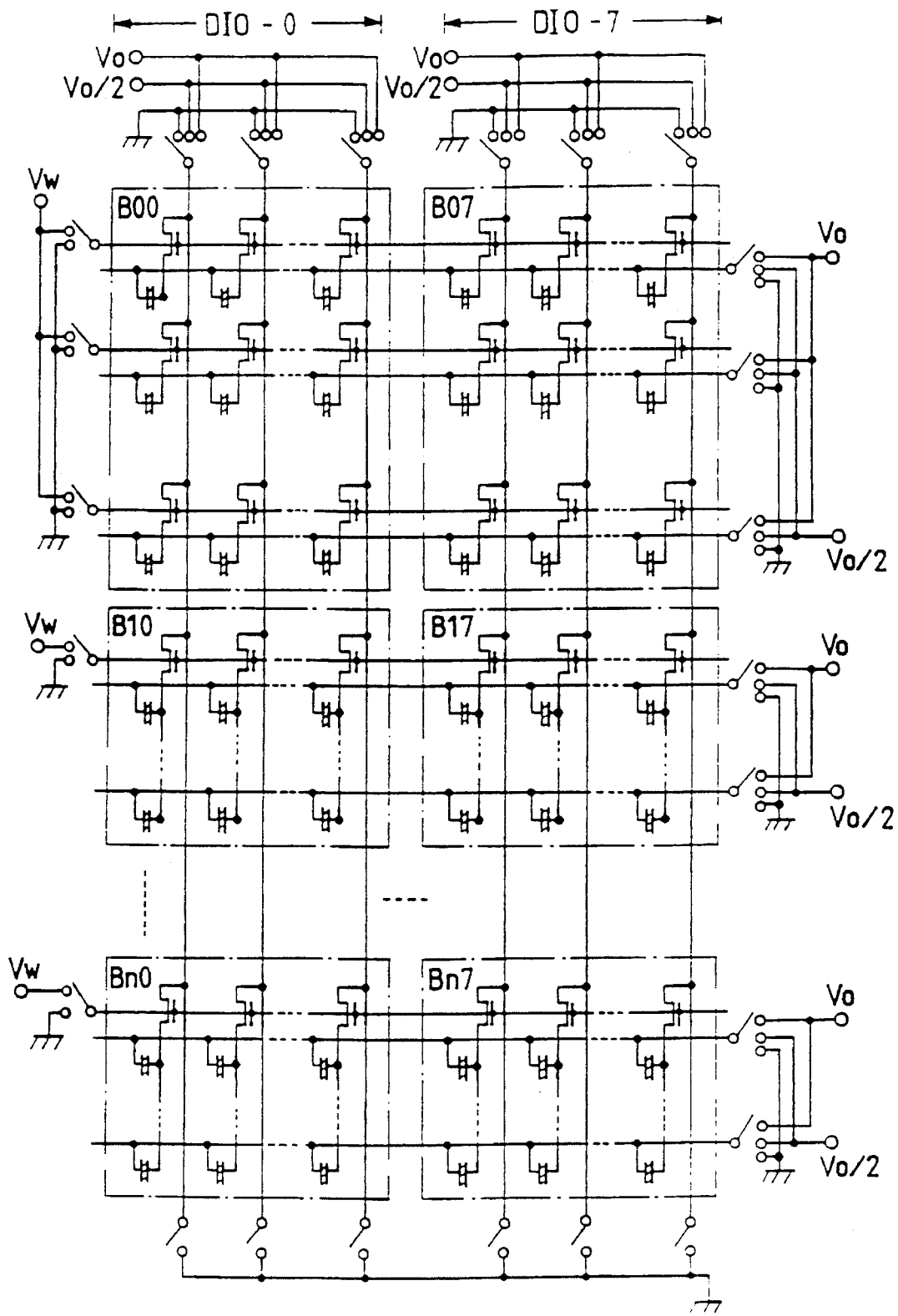
FIG. 16 is a circuit diagram showing another embodiment of the semiconductor memory system according to the present invention.

FIG. 16 is a circuit diagram showing another embodiment of the semiconductor memory system according to the present invention. In this embodiment, there are made together the multi-capacitor construction, in which a MOSFET acting as one switch element is equipped with a plurality of ferroelectric capacitors, and the multi-capacitor construction, in which a MOSFET acting as one switch element is equipped with one ferroelectric capacitor.

Specifically, there are provided in the row direction eight blocks for the aforementioned memory access at the unit of 8 bits. In FIG. 16, however, there are representatively shown the blocks corresponding to the data terminals DIO-0 and DIO-7. Of the memory blocks 0 to n connected with the data lines, moreover, there are representatively shown the blocks B00 to B07 equipped with the one-capacitor type memory cells and the blocks B10 to B17 and Bn0 to Bn7 equipped with the multi-capacitor type memory cells.

The select/unselect operations of the first word lines and the second word lines by the blocks B10 to B17 and Bn0 to Bn7 are similar to those of the foregoing embodiment and will not be described. The memory cells of the block B0 are constructed by one MOSFET and one capacitor. In this embodiment, these memory blocks B00 to B07 are subjected to the select/unselect operations by the ternary levels like the multi-capacitor type memory cells in other memory blocks.

Since only one ferroelectric capacitor is basically provided for one switch element, the unselect level of Vo/2 or the so-called "partially selected state" is not necessary unlike the aforementioned multi-capacitor type memory cells.

In this embodiment, noting that no inversion of polarization will not occur at the aforementioned unselect level of Vo/2 in the ferroelectric capacitors, the aforementioned memory cells are caused to operate as the dynamic memory cells by using the aforementioned unselect level Vo/2 as the select level. In this construction, the ferroelectric capacitors can latch high information storage charge because of their high dielectric constant. In the dynamic type memory cells, however, the information charge latched as the time elapses will be lose by the leakage current or the like. Thus, the dynamic type memory cells require the refreshing operation, in which the information charge is read and amplified, before it is lost, and is written in the initial memory cells.

Thanks to the high-speed memory access despite of this requirement for the refreshing operation, the data to be rewritten many times are written not in the multi-capacitor type memory cells accompanied by the aforementioned inversion of polarization but in the aforementioned dynamic type memory cells. In this structure, the areas of the blocks B00 to B07 can be used as buffer memories for temporary storage. As a result, the memory accesses can be carried out according to the kinds of memory data.

In case of usage merely as the dynamic type memory cells, as described above, it is sufficient to feed the plate voltage as Vo/2 to the common electrode of the ferroelectric capacitors. In this embodiment, however, the X-decoder is given the ternary output function like before so that it can also be used as a nonvolatile memory. When the data are used as temporary ones so that the final data may be left nonvolatile, as described above, the write voltage to be fed establishes a potential difference of Vo from that of the data lines as in case of the aforementioned multi-capacitor type memory cells.

Incidentally, in case of use as the dynamic type memory cells, the sense amplifier is so modified from one for sensing the current accompanying the inversion of polarization of the multi-capacitor type ferroelectric capacitors as to have a special sense amplifier for sensing the change in the potential of the data lines. This sense amplifier has its output signal fed back from the data latch DOL to DIL, as shown in FIG. 1, to effect the rewriting operation in which the memory charge broken by the aforementioned reading operation is returned to the original state.

As in the dynamic RAM of the prior art, a sense amplifier may be provided in the data lines to effect the sensing operation and the rewriting operation in one cycle. If a problem is raised by the noise resulting from the coupling to the first word lines, the memory cells may be alternately arranged by using a pair of data lines as the complementary data lines so that the read signals may be amplified and rewritten (or refreshed) by the sense amplifiers disposed in the complementary data lines.

Figure 17:
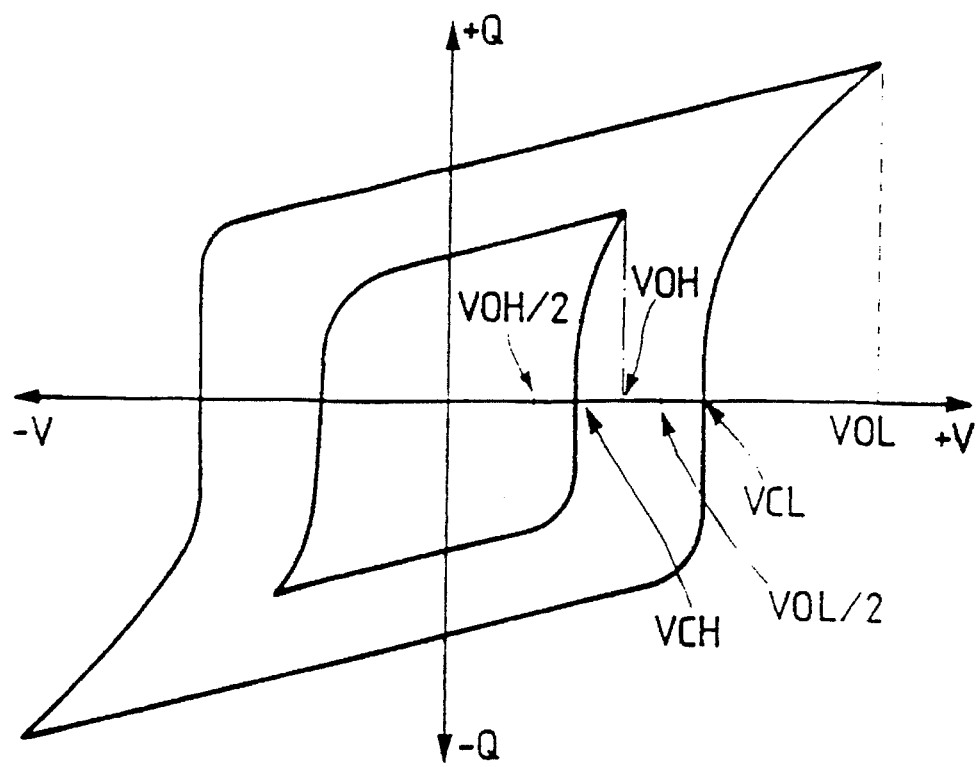
FIG. 17 is a characteristic diagram showing relations between an electric field and a polarization in a ferroelectric capacitor.

FIG. 17 is a characteristic diagram showing relations between an electric field and a polarization in the ferroelectric capacitor. Although this hysteresis will not be described in detail because it is well known in the art, a polarization is caused in one direction of +Q if a voltage VOL is applied in a positive direction of +V. This polarization is not reduced to 0 even for the electric field of 0 but latches a constant residual polarization. If a similar voltage is applied in the opposite or negative direction of −V. The polarization is inverted to the opposite direction of −Q.

The hysteresis characteristics described above has a temperature dependency. The voltage VOL indicates the voltage to which is necessary for the aforementioned inversion of polarization at a low temperature. On the contrary, the voltage necessary for the polarization inversion drops to a low voltage of at a high temperature. Thus, if the write voltage Vo is set according to the characteristic at a low temperature, the unselect level of Vo/2 (i.e., VOL/2), at which the polarization is not inverted at a low temperature, exceeds the voltage VOH so that the ferroelectric capacitors to be in the unselected state have their polarizations inverted.

In order to prevent the undesired erroneous writing due to the temperature change, therefore, it is necessary to see the aforementioned write voltage Vo with the negative temperature dependency conforming to the aforementioned temperature characteristic.

Figure 18:
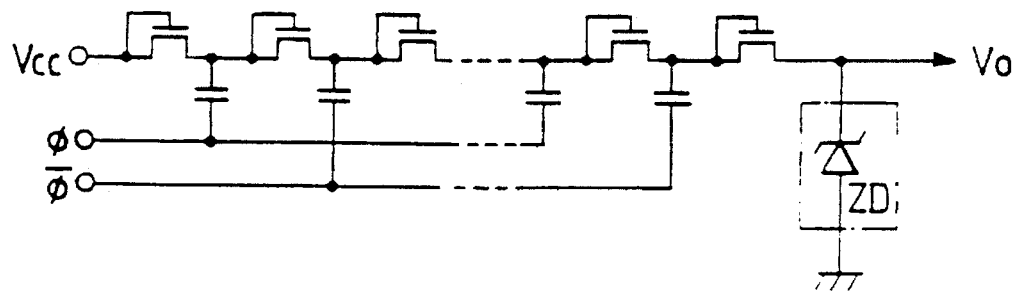
FIG. 18 is a circuit diagram showing one embodiment of a voltage generator for generating a write voltage.

FIG. 18 is a circuit diagram showing one embodiment of a voltage generator for generating the write voltage. In this embodiment, the write voltage Vo is generated by a booster circuit using MOSFETs of diode shape and capacitors. This write voltage Vo has its level stabilized by a Zener diode ZD. With a negative temperature coefficient at which the Zener voltage drops as the temperature rises, the Zener diode ZD can establish the write voltage to corresponding to the aforementioned negative temperature dependency owned by the ferroelectric capacitors. Incidentally, the unselect level of Vo/2 is divided, although not shown, by dividing the aforementioned write voltage by impedance means such as a resistor or a capacitor. As a result, the unselect level can be given a similar negative temperature coefficient. Of course, the temperature compensation may resort to a method other than the aforementioned one.

FIG. 19 presents circuit diagrams each showing one embodiment of the multi-capacitor type unit memory circuit according to the present invention. The circuit elements of FIG. 19 are shown to conform to their geographical arrangement when they are formed over a semiconductor substrate.

Figure 19A:
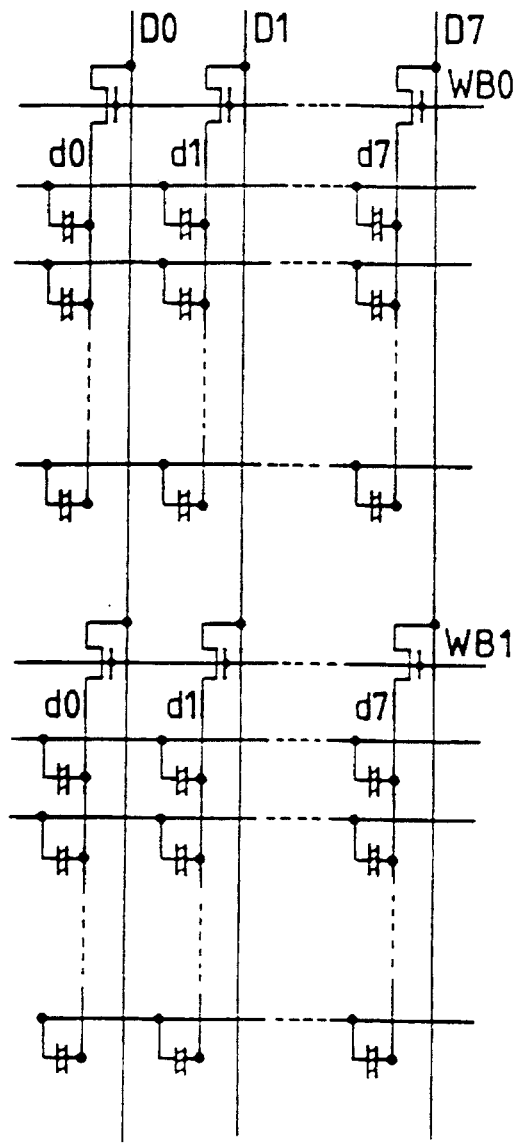
FIGS. 19(A) and 19(B) are circuit diagrams each showing one embodiment of a multi-capacitor type unit memory circuit according to the present invention.
Figure 19B:
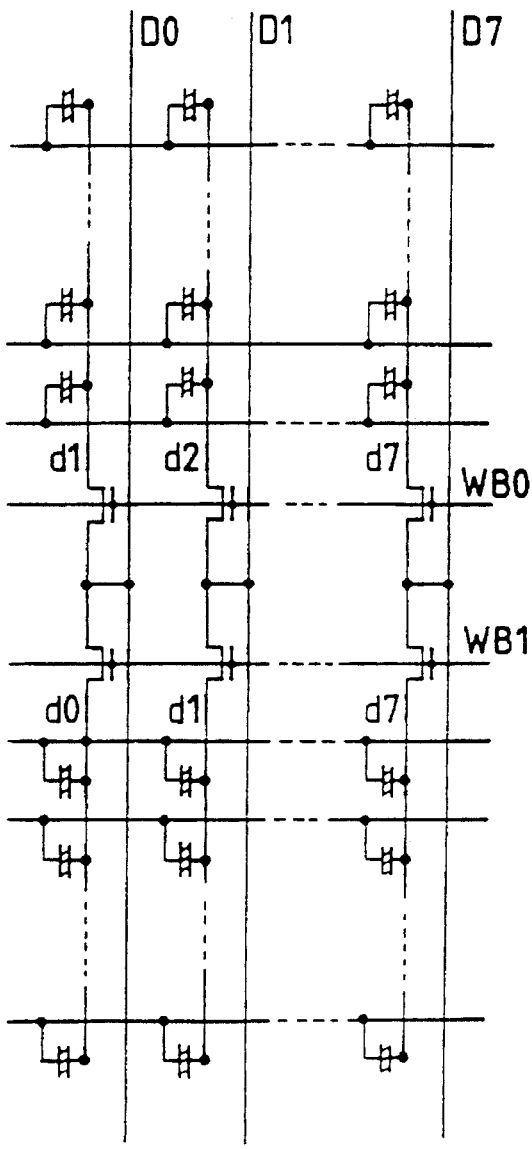

In FIG. 19(A), the transfer MOSFETs and a plurality of ferroelectric capacitors connected with the former are constructed in the common array. In FIG. 19(B), on the other hand, the transfer MOSFETs and a plurality of ferroelectric capacitors connected with the former are arranged vertically symmetrically with respect to the nodes between the transfer MOSFETs and the data lines.

The construction of FIG. 19(B) is featured by that one connection between the drains (or sources) of the transfer MOSFETs and the data lines may be shared between two unit memory circuits. In the construction of FIG. 19(A), on the other hand, the drains (or sources) of the transfer MOSFETs and the data lines have to be connected for each unit memory circuit.

Figure 20:
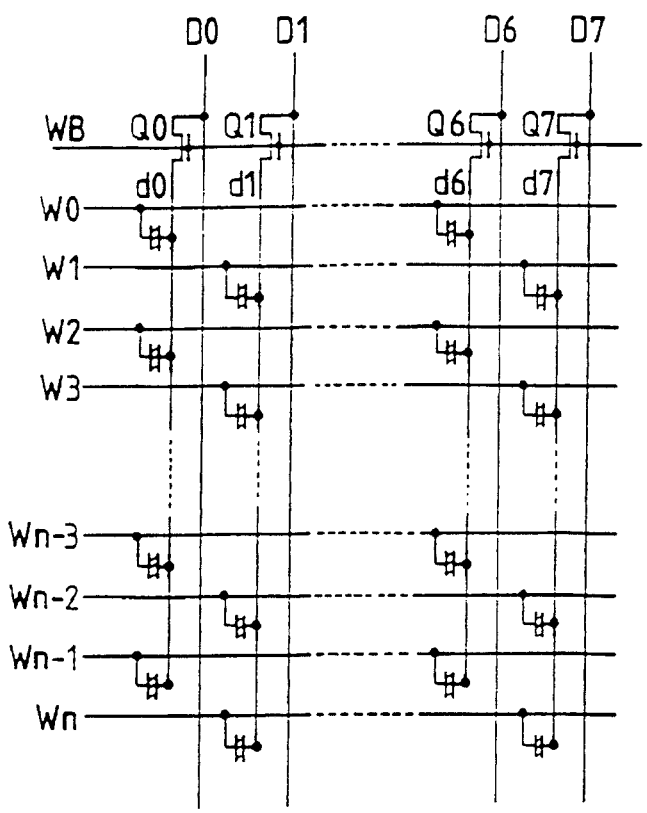
FIG. 20 is a circuit diagram showing another embodiment of the multi-capacitor type unit memory circuit according to the present invention.

FIG. 20 is a circuit diagram showing another embodiment of the multi-capacitor type unit memory circuit according to the present invention. The circuit elements of FIG. 20 are shown like before to conform to their geographical arrangement when they are formed over a semiconductor substrate.

In this embodiment, the adjacent second data lines (i.e., sub-data lines) are equipped with the ferroelectric capacitors which are arranged alternately of the direction of the second word lines. This construction is similar to the arrangement of the dynamic type memory cells of folded bit line type. Thanks to this arrangement of the ferroelectric capacitors, the adjacent data lines D0 and D1 can be accessed to as the complementary data lines. Specifically, when the second word line W0 is selected, the read signal is obtained from the data line D0 whereas the precharge voltage is outputted from the data line D1. Thus, the read signal from the aforementioned data line D0 can be sensed by the differential amplifier which uses that precharge voltage as the reference voltage.

Thanks to this arrangement of the ferroelectric capacitors, the coupling noises among the second word lines, the sub-data lines and the data lines are in a common mode so that they can be offset by the aforementioned differential type sense amplifier.

Figure 21:
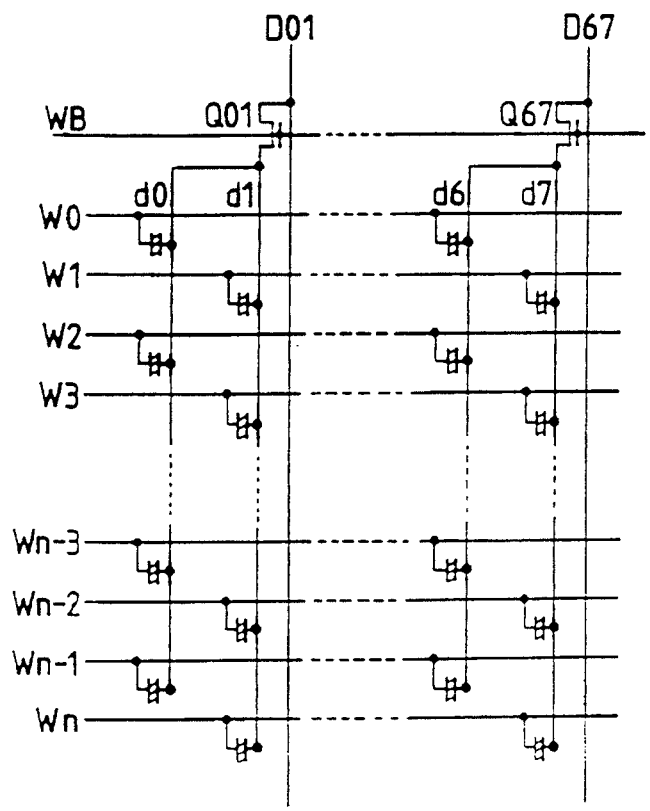
FIG. 21 is a circuit diagram showing still another embodiment of the multi-capacitor type unit memory circuit according to the present invention.

FIG. 21 is a circuit diagram showing still another embodiment of the multi-capacitor type unit memory circuit according to the present invention. The circuit elements of FIG. 20 are shown like before to conform to their geographical arrangement when they are formed over a semiconductor substrate.

In this embodiment, for one transfer MOSFET Q01, there are arranged in parallel two sub-data lines d0 and d1. In order to select either of two sub-data lines, there are provided ferroelectric capacitors which are arranged alternately of the array direction of the second word lines. As a result, if the second word line W0 is selected, the ferroelectric capacitor connected with the sub-data line d0 is selected. If the second word line W1 is selected, the ferroelectric capacitor connected with the sub-data line 1 is selected.

Thanks to the construction described above, the number of the transfer MOSFETs can be reduced to reduce the number of circuit elements. The number of the aforementioned sub-data lines may be three or more. In this case, one ferroelectric capacitor is provided in each sub-data lines for every three second word lines.

Figure 22:
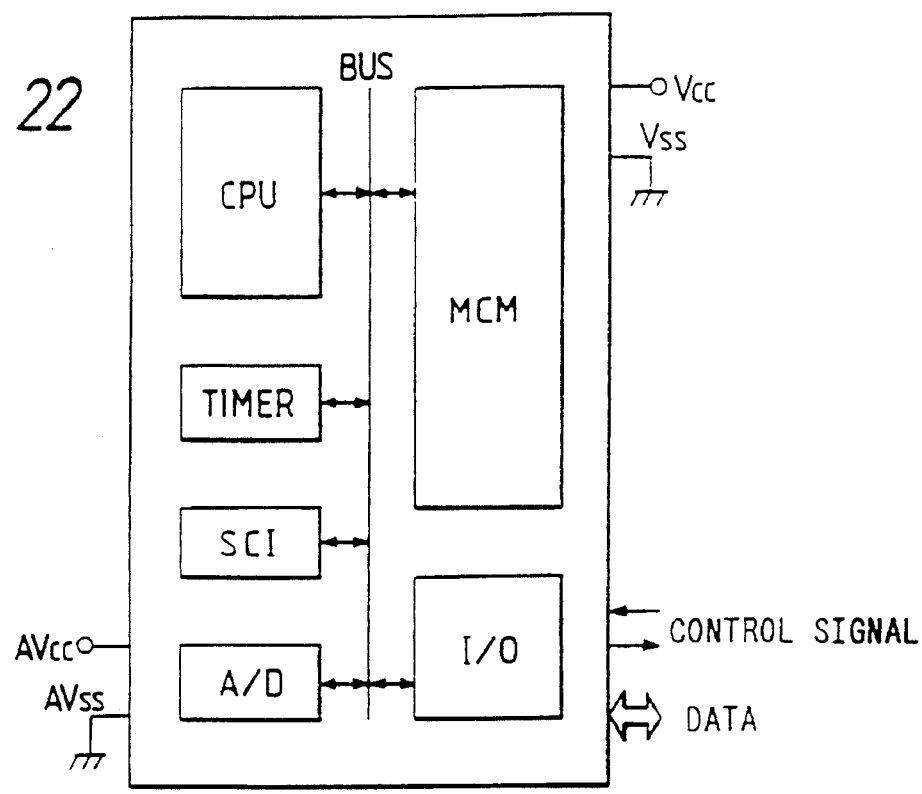
FIG. 22 is a block diagram, showing one embodiment of a microcomputer using the semiconductor memory system according to the present invention.

FIG. 22 is a block diagram showing one embodiment of a microcomputer using the semiconductor memory system according to the present invention. Although not especially limitative the microcomputer of this embodiment is constructed of a one-chip semiconductor integrated circuit device.

Reference letters CPU designate a microprocessor (or central processing unit) for processing data in accordance with a series of data processing programs. This CPU is surrounded through a bus BUS by a timer circuit TIMER, a serial communication interface SCI and an analog/digital converter A/D as peripheral circuits and by a semiconductor memory system MCM as an internal memory circuit according to the present invention. Letters I/O designate an input/output circuit.

The aforementioned semiconductor memory system MCM has a multi-capacitor type unit memory circuit which is equipped with a plurality of ferroelectric capacitors for one switch element, and is used as a nonvolatile memory.

Supply terminals Vcc and Vss are set to about 5 V and 0 V, which are used as the supply voltages for the aforementioned digital circuit. The write voltages of Vo and Vo/2 necessary for the operations of the aforementioned semiconductor memory system MCM and the select voltage Vw to be fed to the first word lines are produced by the internal boost circuit.

Supply terminals AVcc and AVss are supply voltages for the analog circuit. Since the supply powers are thus divided for the digital circuit and the analog circuit, the noise at a relatively high level to be produced in the supply line at the digital circuit side can be prevented from leaking into the supply lines at the analog circuit side.

Since the nonvolatile memory is thus used as the internal memory circuit, the microcomputer of this embodiment can be used as an IC card such as a bank card.

This microcomputer may naturally be constructed of one semiconductor integrated circuit device and formed over a board such as a packaging substrate or a printed substrate. In this case, the memory circuit MCM can be constructed of a plurality of semiconductor memory systems so that it can be given a high memory capacity. Moreover, a RAM or the like may be connected as an external memory.

Figure 23:
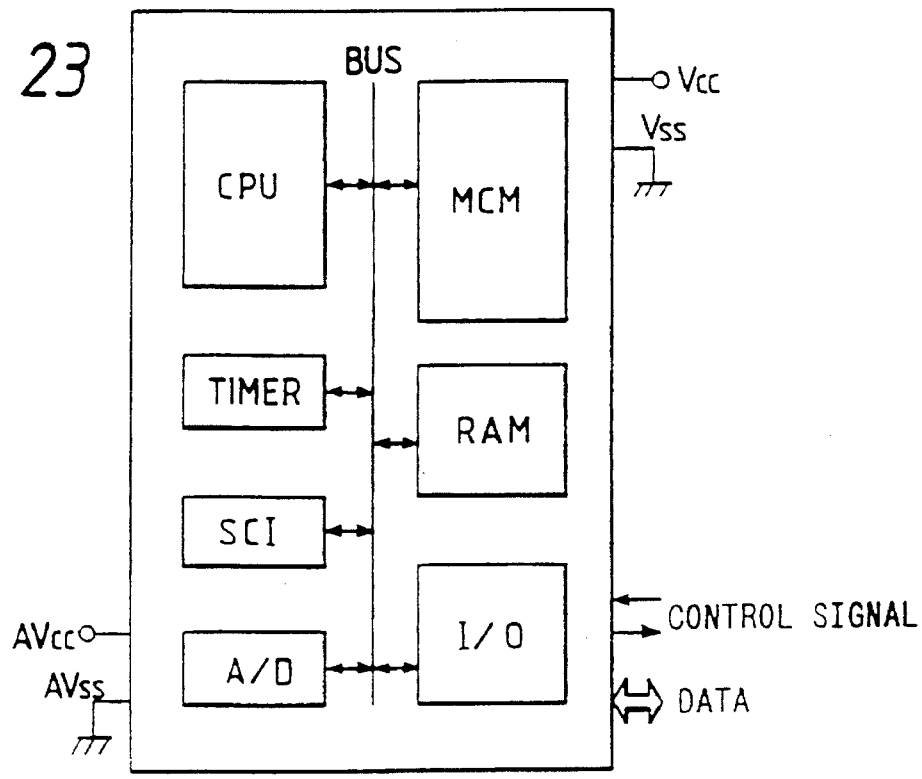
FIG. 23 is a block diagram showing another embodiment of the microcomputer using the semiconductor memory system according to the present invention.

FIG. 23 is a block diagram showing another embodiment of the microcomputer using the semiconductor memory system according to the present invention. In this embodiment, the memory circuit is exemplified by the aforementioned semiconductor memory systems MCM and RAM juxtaposed to each other. As a result, the data processing followed by the write/read operations can be accomplished at a high speed by using the RAM when the microcomputer is rendered operative by the electric power.

Before the aforementioned microcomputer is to be deenergized, those of the data stored in the RAM, which have to be turned nonvolatile, are transferred to the MCM. As a result, the necessary data can be stored in the MCM even the power supply is disconnected. When the microcomputer has its operation started again by the electric power, the data saved in the aforementioned MCM are read out and transferred to the RAM, and the high-speed data processing is carried out again by the RAM.

Thanks to this construction, the number of rewriting operations of the MCM can be drastically reduced. This construction is suitable for the IC card. Specifically, the IC card can have its necessary stored data made nonvolatile without any battery so that it can be used without being substantially restricted in the number of rewriting the nonvolatile memory.

Figure 24:
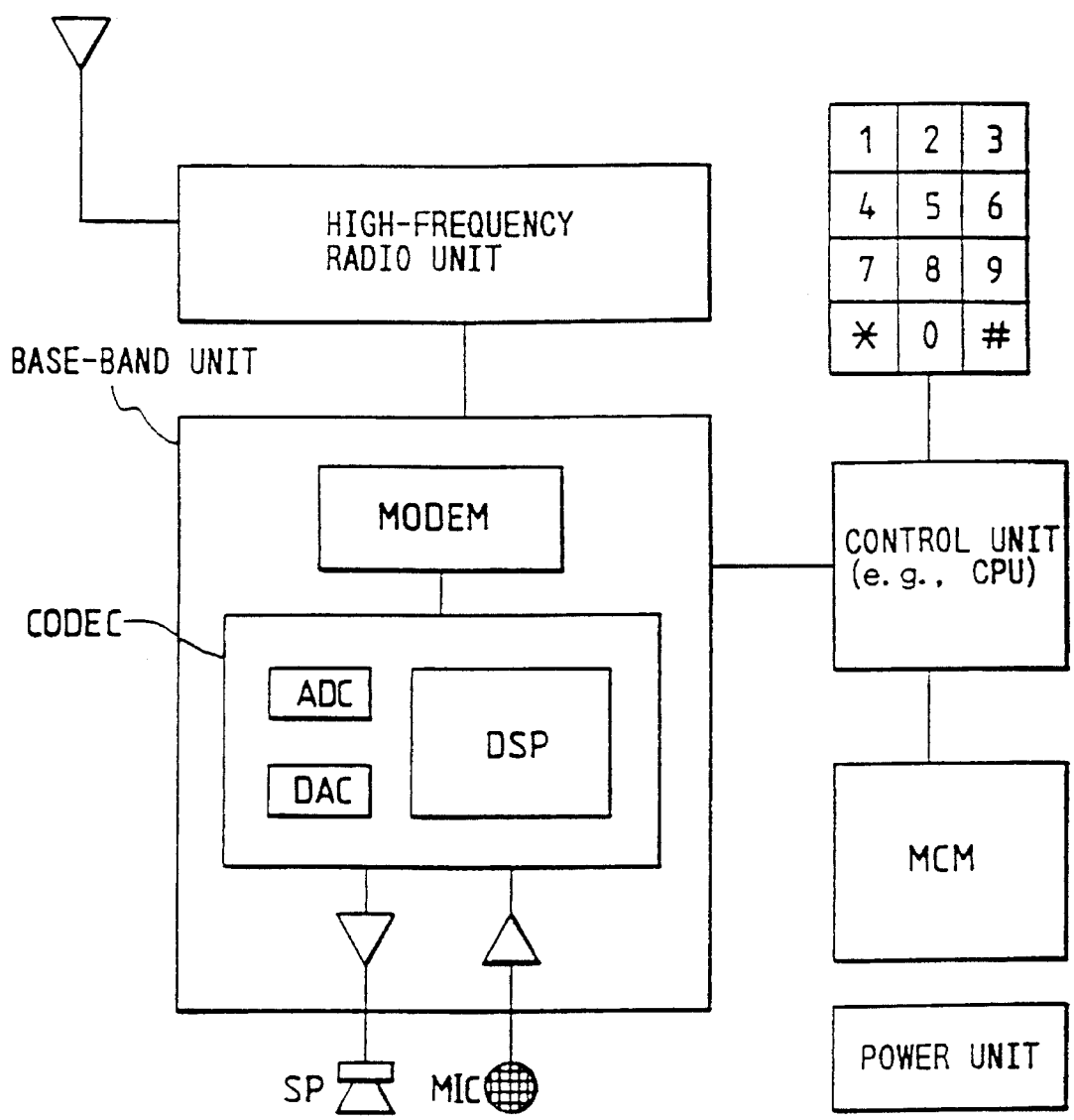
FIG. 24 is a block diagram showing one embodiment of a mobile radio communication system such as a cordless telephone using the semiconductor memory system according to the present invention.

FIG. 24 is a block diagram showing one embodiment of a mobile radio communication system such as a cordless telephone using the semiconductor memory system according to the present invention. In this embodiment, the semiconductor memory system MCM according to the present invention is used as a memory device employed in a control unit. This memory circuit stores telephone numbers for abbreviated dialing or necessary memory information, for example. In addition, the following vocal information may be stored as the memory information: (1) The necessary information of the partner or caller himself is stored when in an automatic answering operation or in an actual speech; (2) The speech of the caller himself is memorized while the communication is off; and (3) The content memorized in (1) and (2) is automatically transferred to the telephone of the partner. The aforementioned semiconductor memory system MCM may be made removable, or another semiconductor memory system MCM may be added.

The mobile radio communication system such as the cordless telephone has to be made small and light. One of the components obstructing the reduction of the size and weight is a power supply (i.e., a battery). Since the semiconductor memory system of this embodiment performs the memorizing operation in a nonvolatile state, no current is consumed for latching the data so that the capacity of the battery can be accordingly reduced. In other words, the battery having an equal capacity can be used for a longer time for a single charge.

The mobile radio communication system thus far described is constructed as a base-band unit to include: a coder-decoder CODEC having a digital signal processor DSP, an analog/digital converter ADC and a digital/analog converter DAC; and a modem MODEM. Letters SP designate an output speaker, and letters MIC designates an input microphone. The control unit is set with dials or various modes by means of keys. The signals thus produced in the base-band unit are converted to electric waves through a high-frequency radio unit so that they are received and transmitted.

FIG. 25 presents circuit diagrams a memory array portion of a RAM packaged in the microcomputer shown in FIG. 23. In this embodiment, the RAM is exemplified by not a static RAM but a dynamic RAM. Moreover, the capacitors composing the dynamic memory cell use the ferroelectric material as their dielectric material. In case the microcomputer of FIG. 23 is to be constructed of a one-chip semiconductor integrated circuit device, the memory cells of the RAM are formed by making use of the step of forming the MCM. As a result, a high capacity can be achieved with small capacitors when the RAM is used only as the dynamic one, so that the area to be occupied by the RAM portion can be drastically reduced.

Figure 25A:
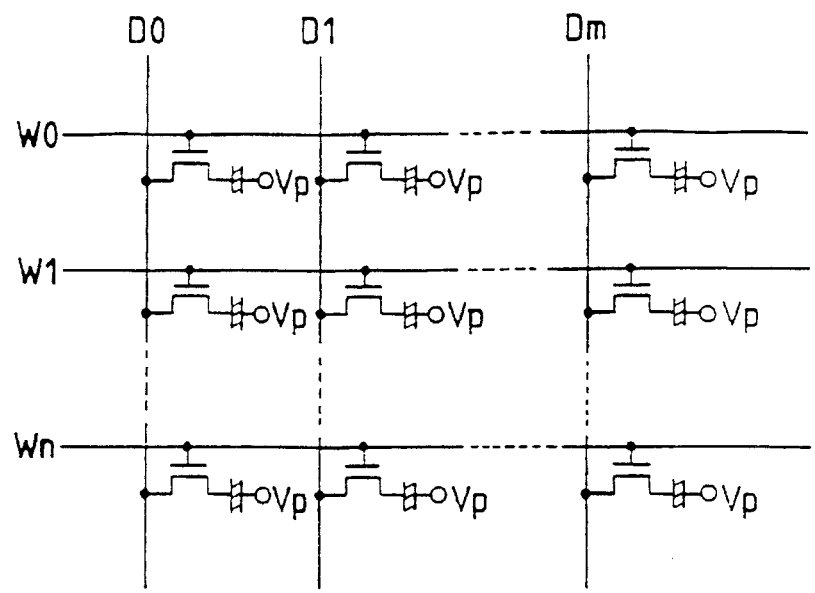
FIGS. 25(A) and 25(B) are circuit diagrams each showing one embodiment of a memory array portion of a RAM packaged in the microcomputer shown in FIG. 23.

In case the ferroelectric capacitors are used as those of the dynamic memory cells, the charge of information can be increased, and the memory cells are arranged at every intersections of the data lines and the word lines, as shown in FIG. 25(A). As a result, a number of memory cells can be formed in a small area occupied. According to this construction, however, the sense amplifier has to be devised because the reading operation to be carried out is not that of the dynamic RAM of the folded bit line type of the prior art.

Figure 25B:
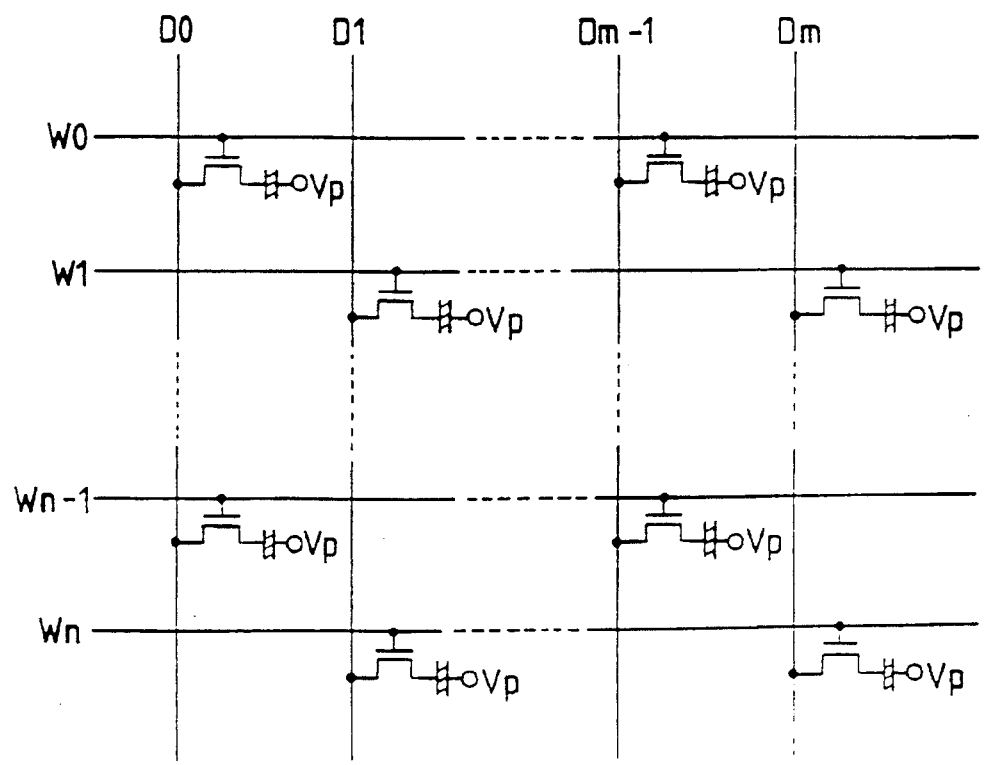

In FIG. 25(B), the adjacent data lines D0 and D1 are formed as complementary data lines. In short, the memory cells are arranged alternately of the array direction of the word lines. Specifically, this construction is identical to that of the arrangement of the memory array of the dynamic RAM of the prior art and can employ the circuit of the dynamic RAM which is enabled to perform the reading operation and the rewriting (or refreshing) operation by interposing a sense amplifier of latch type between the data lines D0 and D1 made complementary.

Figure 26:
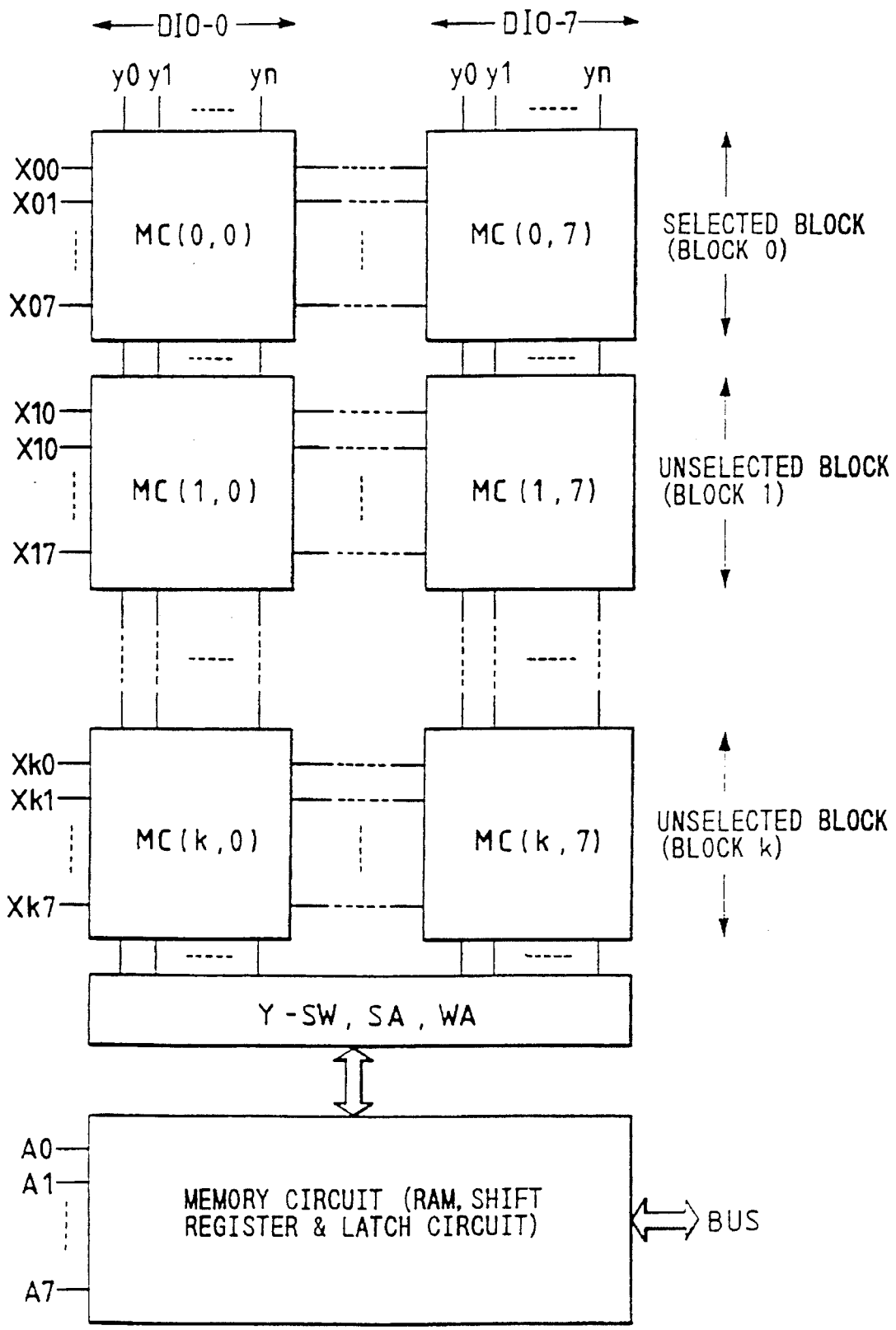
FIG. 26 is a block diagram for explaining one embodiment of the reading system of the semiconductor memory system according to the present invention.

FIG. 26 is a block diagram for explaining one embodiment of the reading system of the semiconductor memory system according to the present invention. This embodiment has its memory array portion arranged with memory blocks 0 to k in the data line direction and memory blocks 0 to 7 in the word line direction. The memory array blocks arrayed in the word line direction correspond to the data terminals DIO-0 to DIO-7 so that the memory array portion is subjected to an memory access at the unit of 8 bits.

Of the aforementioned construction of the memory array, as shown in FIG. 26, the memory blocks 0, 1, - - -, and k are representatively shown in the data line direction, and the memory blocks 0 to 7 are representatively shown in the word line direction.

One memory block MC (0, 0) is equipped with eight second word lines X00 to X07 and (n+1) data lines y0 to yn. The first word lines for selecting the blocks are omitted from FIG. 26. Therefore, eight ferroelectric capacitors are provided as the unit memory circuits for one switch MOSFET. The remaining memory blocks are given similar constructions.

If the number of the aforementioned data lines y0 to yn is exemplified by 32, one block is given a memory capacity of 8×32=256 bits. If the eight memory blocks 0 to 7 juxtaposed in the word line direction are simultaneously selected, each block is given a memory capacity of 256 bytes.

In this embodiment, the memory access is carried out at the block unit. Specifically, the block address and the data of 256 bytes are inputted from or outputted to the outside.

For this memory access at the unit of 256 bytes, there is packaged a memory circuit. This memory circuit is constructed of a RAM, a shift register or a latch circuit. Specifically, 256 block designations by addresses A0 to A7 and the corresponding data are inputted or outputted from the outside to the memory circuit. For these block addresses, 256 memory blocks are arranged in the data line direction. In short, the letter K appearing in FIG. 26 is set to 255.

For data writing operations, one memory block is assigned with the addresses A0 to A7 so that data of 256 bytes are inputted to the memory circuit. Then, the internal decoder decodes the addresses A0 to A7 to produce a first word line selecting signal corresponding to the block. The second word selecting signals are sequentially produced by the internal address generator. Likewise, the Y-selector selecting signals for producing the data line selecting signals are also sequentially produced by the internal address generator.

In the selected block, all the ferroelectric capacitors are polarized in one direction by the batch initializations at the aforementioned block unit while the data of 256 bytes are inputted to the memory circuit. Of the data of 256 bytes once fetched by the memory circuit, the leading 1 byte is written in the ferroelectric capacitors corresponding to X00 and y0. At this time, what is actually written in the ferroelectric capacitors is that corresponding to the data in the opposite direction to that of the aforementioned initializations.

For the address increments for the successive accesses at the aforementioned one block unit, the 32 bytes of the first row are written by changing the data lines y0 to yn sequentially while the second word line X00 being held in the selected state. Subsequently, the second word line X01 is changed to the selected state so that the 32 bytes are written by the similar address increments of the Y lines. From then, the 256 bytes are written by repeating the similar operations to the second word line X07.

For the reading operations, on the other hand, the data are read byte by byte, if the address of the read block is given, by the address increments similar to those of the aforementioned writing operations. The signals thus read are not sent out as they are to the outside but are once latched in the memory circuit. When all the data are prepared, they are read out to the CPU or the like through the bus BUS if the reading operations are allowed. Simultaneously as the data are outputted to the CPU, the internal circuit executes the rewriting operations for recovering the data destructed by the reading operations.

In case the accessing method at the block unit is adopted as in this embodiment, the accessing rate can be apparently raised. For example, when the CPU or the like has its memory circuit written with the data, the semiconductor memory system of this embodiment can be isolated from the bus BUS so that it can process the data efficiently while being accompanied by the data transfers with other peripheral circuits. In the data reading operations, the CPU or the like instructs the semiconductor memory system of this embodiment the reading mode and the block addressing and can then enter another data processing. And, the CPU or the like fetches the data read out to the memory circuit, when it is informed that the data can be read out from the interruption or polling.

The microcomputer system can be made efficient because the CPU is not restricted for a relatively long time by the semiconductor memory system MCM, as viewed from the system side.

The block access method described above gives the semiconductor memory system the following advantages. Since the semiconductor memory system of this embodiment has its one switch MOSFET connected with the plurality of ferroelectric capacitors, the aforementioned stress of Vo/2 is necessarily applied to the unselected ferroelectric capacitors having either the second word lines or the data lines selected. Thus, the access at the block unit can reduce the stress drastically because the blocks are separated into the selected ones and the unselected ones. This could be easily understood if it is imagined that the data of 256 bytes are written/read by each byte for different memory blocks.

The rewriting operations by the destructive reading operations may be carried out at the byte unit. In other words, after the reading operation of 1 byte, the address should not be implemented to a next one before a rewriting operation.

Figure 27:
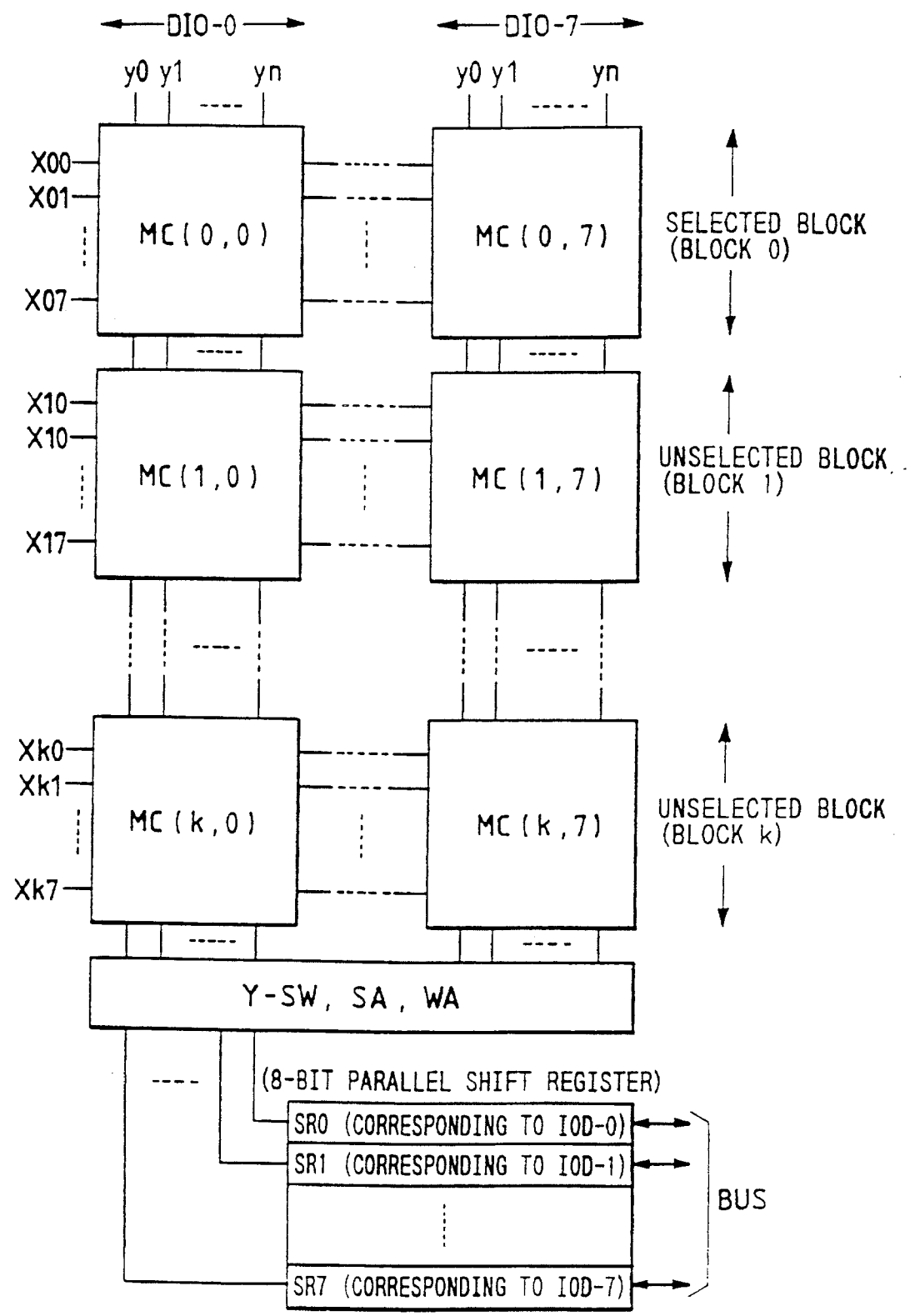
FIG. 27 is a block diagram for explaining another embodiment of the reading system of the semiconductor memory system according to the present invention.

FIG. 27 is a block diagram for explaining another embodiment of the reading system of the semiconductor memory system according to the present invention. In this embodiment, a serial shift register of 8 bits is employed as the memory circuit. Although representatively shown: the shift register SR0 corresponds to the data terminal DIO-0; the shift register SR1 corresponds to the data terminal DIO-1; and the shift register SR7 corresponds to the data terminal DIO-1. The remaining constructions are similar to those of the foregoing embodiment of FIG. 26.

Figure 28:
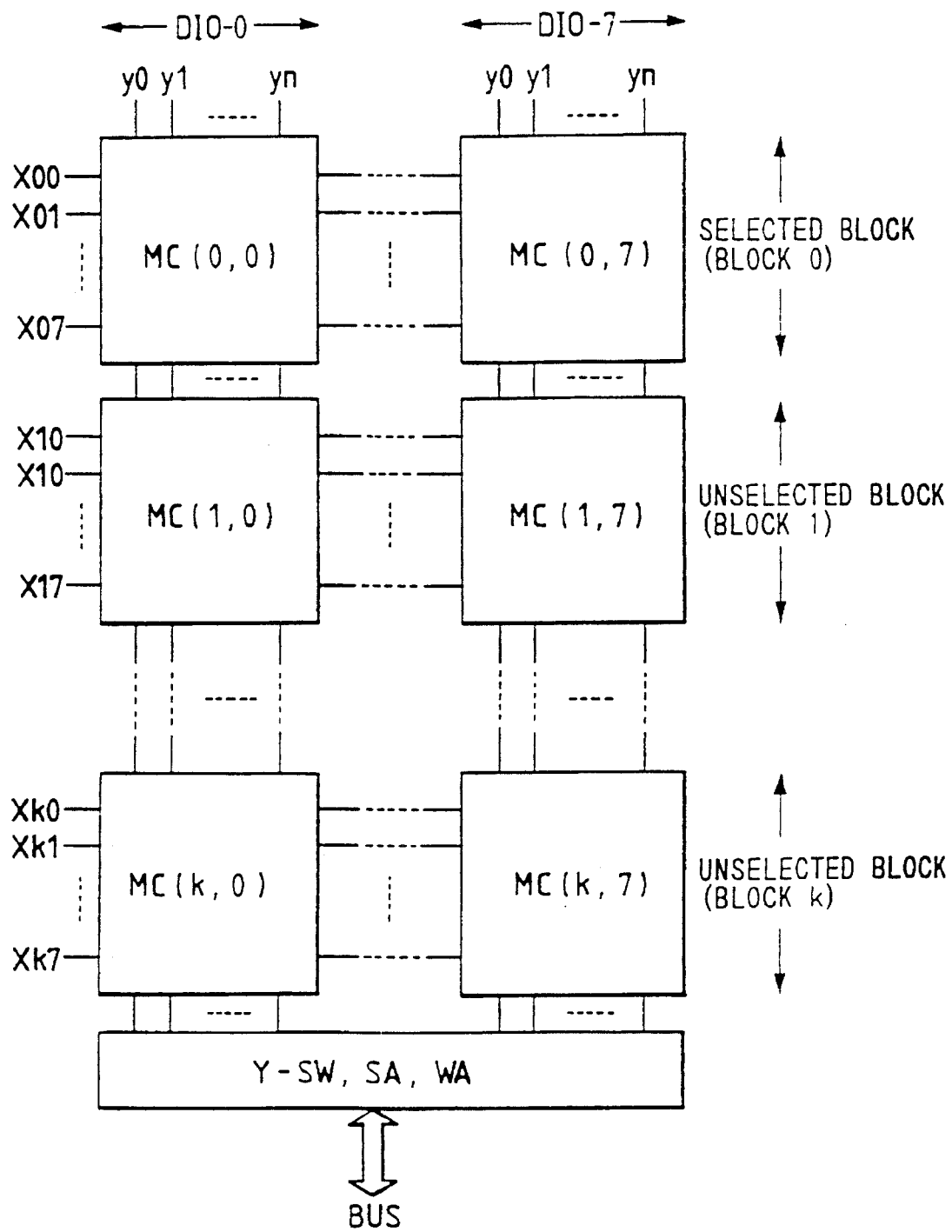
FIG. 28 is a block diagram for explaining another embodiment of the reading system of the semiconductor memory system according to the present invention.

FIG. 28 is a block diagram for explaining another embodiment of the reading system of the semiconductor memory system according to the present invention. In this embodiment, the memory circuit is omitted. In other words, the access is carried out at the unit of 8 bytes or the like through a column select Y-SW and a sense amplifier SA or a write amplifier WA. According to this construction, the sequential address input and the data input or output are carried out. As a result, the outside bears a heavier load, but the construction is suitable for a microcomputer system of a small circuit scale. In this small-scale microcomputer, the aforementioned address increments may be performed by the CPU itself because the data are processed at a low rate.

Since the memory accesses can be carried out in any manner by the external addressing operations or the increments, according to this construction, the memory accessing operations can take various modes according to the programs or the like of the CPU.

Figure 29:
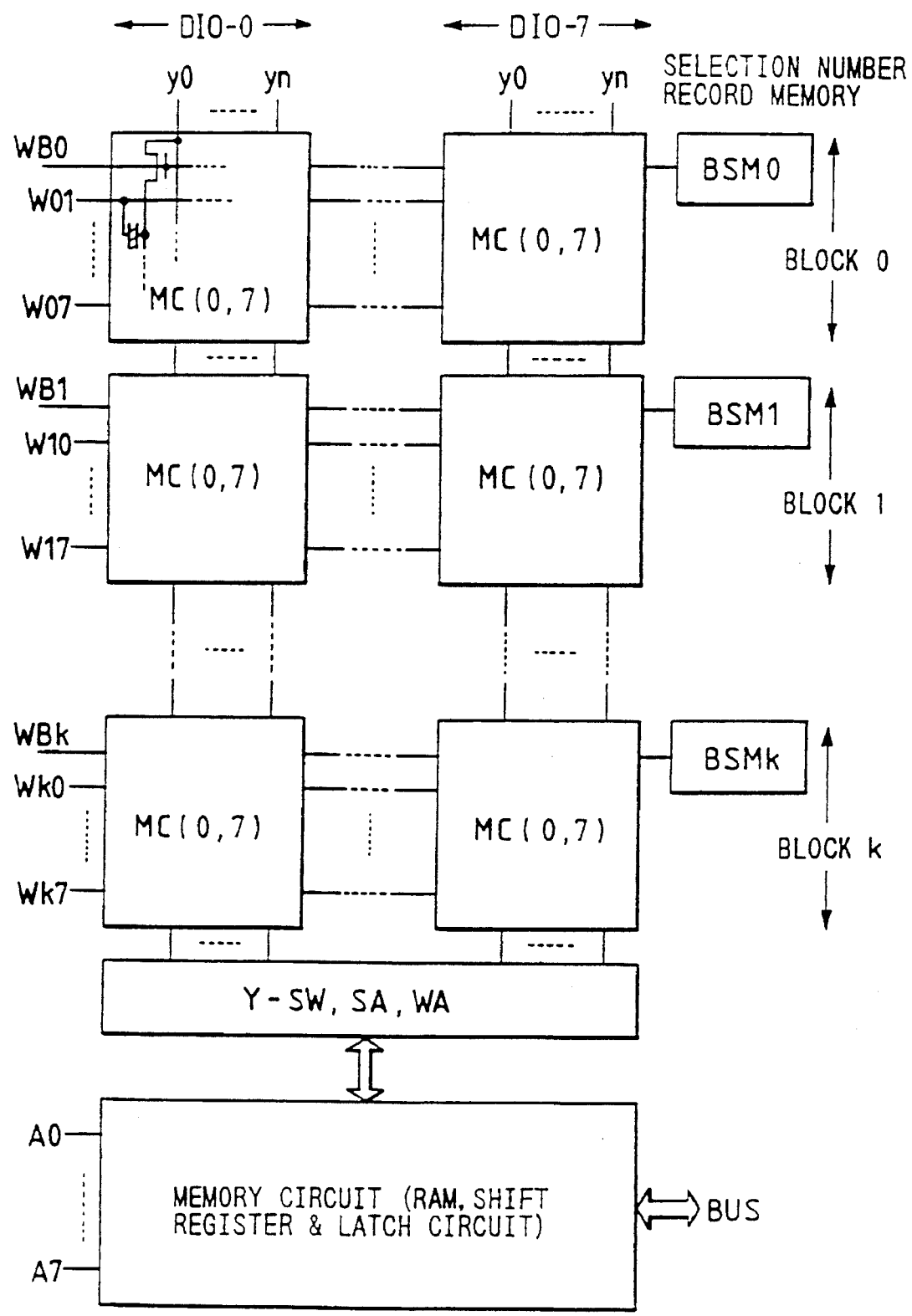
FIG. 29 is a block diagram for explaining still another embodiment of the reading system of the semiconductor memory system according to the present invention.

FIG. 29 is a block diagram for explaining still another embodiment of the reading system of the semiconductor memory system according to the present invention. In this embodiment, each block is equipped with selection number recording memories BSM0 to BSMk.

Although not especially limitative, the recording memories BSM0 and BSM1 to BSMk are connected with the first word lines WB0 and WB1 to WBk of the corresponding blocks 0 and 1 to k so that they may be implemented by +1 when the first word lines are set to the select level. These increments are carried out by a counter circuit. This counter circuit loses counted value if it is deenergized. Thus, the counted value of the counter is saved, when deenergized, in a suitable memory circuit using the ferroelectric capacitors.

For example, the memory circuit to be used for saving the counted value may be a dynamic type memory cell of the foregoing block B00 of FIG. 18, in which each of the ferroelectric capacitors is equipped with a switch MOSFET. This memory cell is caused to save the counted value by operating it as a RAM, while the semiconductor memory system is energized, and to establish the polarization corresponding to the counted value in the ferroelectric capacitors when the same is deenergized.

The counted value of each of the aforementioned blocks can be used for refreshing the ferroelectric capacitors forcedly. If the counted value reaches to a rewrite limiting number of $10^9$, for example, the forced refreshing operation is carried out to return the voluntary polarization, which has been reduced to a lower value due to the rewriting fatigue, to an initial value by applying a voltage Vp higher than the write voltage Vo. This restoration of the voluntary polarization may be called the polling in some papers.

In the memory access at the block unit, the deteriorations of the voluntary polarization for the individual blocks become different correspondingly to the rewrite number if the memory accessing is carried out concentrated into one block. Thus, the recording memory storing the aforementioned rewrite number is prepared to be written to the outside so that all the blocks may be subjected to a memory access for equalizing the rewrite numbers. Alternatively, a control circuit may be disposed inside to-add a function to give an equal rewrite number to the individual blocks by performing an address translating operation. The remaining constructions are similar to those of the embodiment of FIG. 26, and the writing operations and the reading operations will be omitted.

Figure 30:
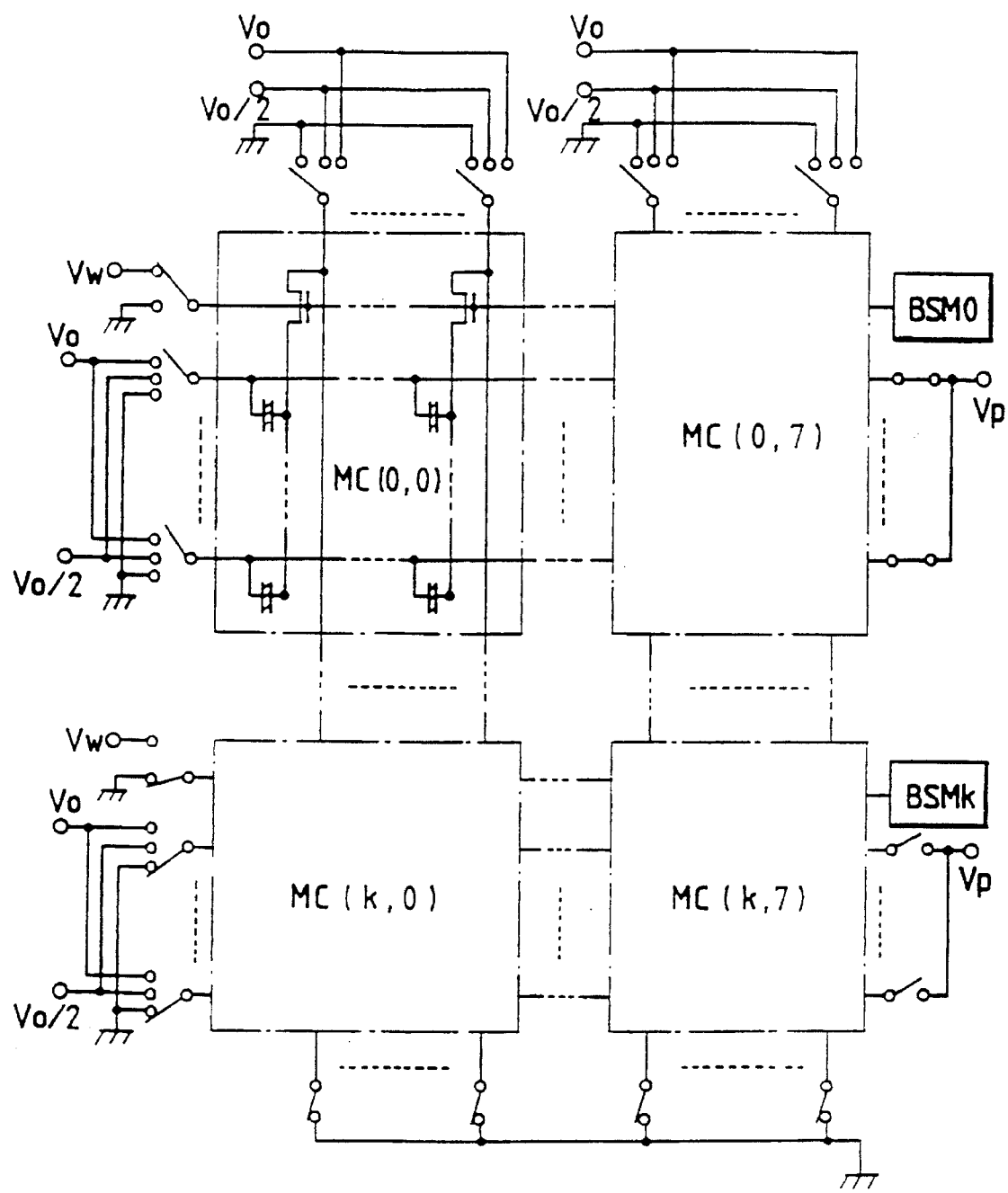
FIG. 30 is a block diagram for explaining one embodiment of the forced refreshing operation of the semiconductor memory system according to the present invention.

FIG. 30 is a block diagram for explaining one embodiment of the forced refreshing operation of the semiconductor memory system according to the present invention. In this embodiment, for the forced refreshing operations, the second word lines of each memory block are additionally equipped with switches for feeding the high voltage Vp. In other words, the second word lines are equipped at the other terminals (at the righthand side of FIG. 30), as viewed from the X-decoder side, with the switches for feeding the forced refreshing high voltage Vp, although not especially limitative thereto.

Figure 31:
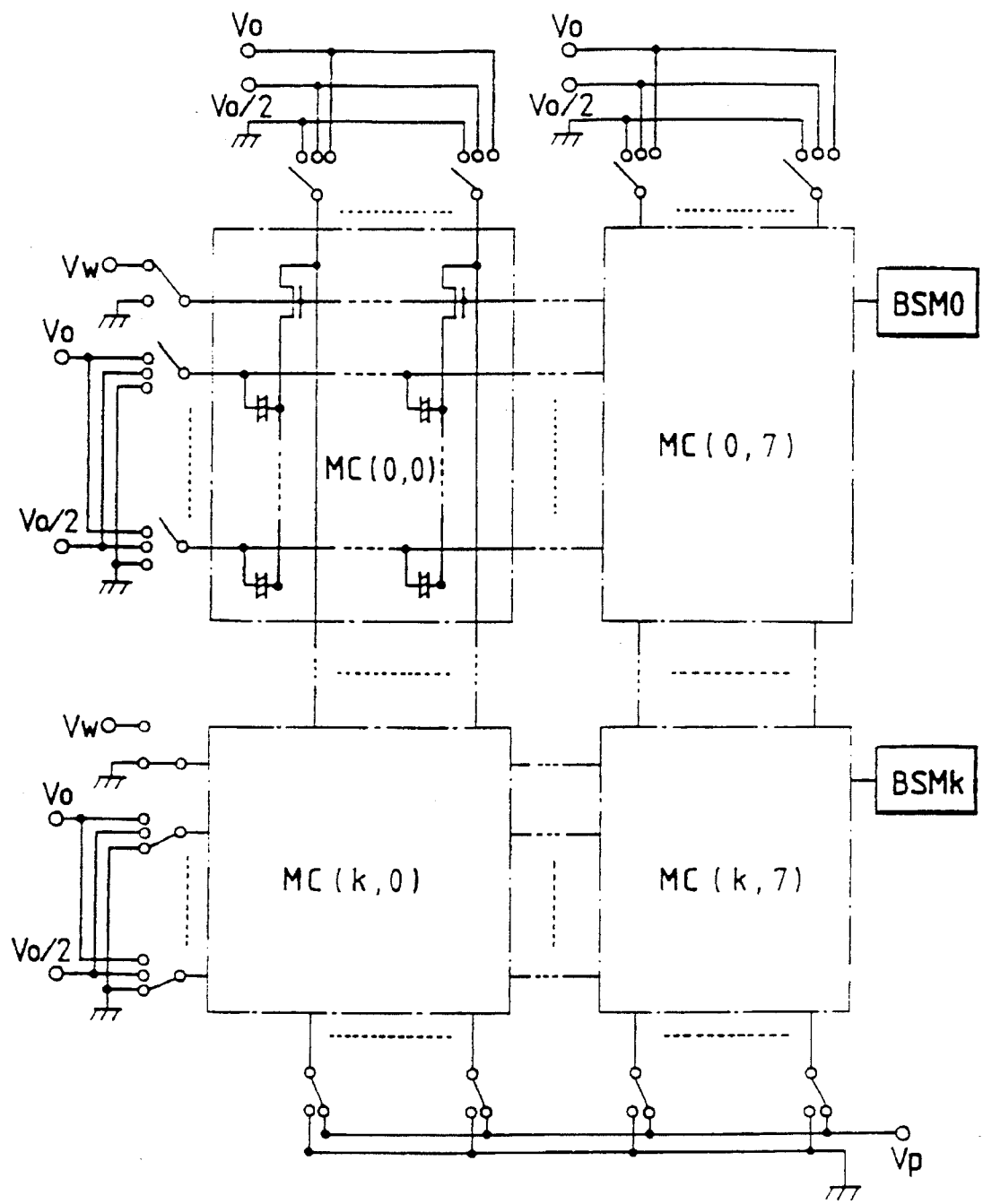
FIG. 31 is a block diagram for explaining another embodiment of the forced refreshing operation of the semiconductor memory system according to the present invention.

FIG. 31 is a block diagram for explaining another embodiment of the forced refreshing operation of the semiconductor memory system according to the present invention. In this embodiment, for the forced refreshing operations, the data lines are equipped at their other terminals (at the lower side of FIG. 31), as viewed from the Y-select side, with switches for feeding the forced refreshing high voltage Vp, although not especially limitative thereto. In FIG. 30, there are also shown switches for the data line discharging operations for the aforementioned memory accessing. In this embodiment, the voltage to be applied to the ferroelectric capacitors at the forced refreshing time is reversed from that of FIG. 30. In short, it should be noted that the direction of polarization by the forced refreshing operation is reversed from that of FIG. 30.

Figure 32:
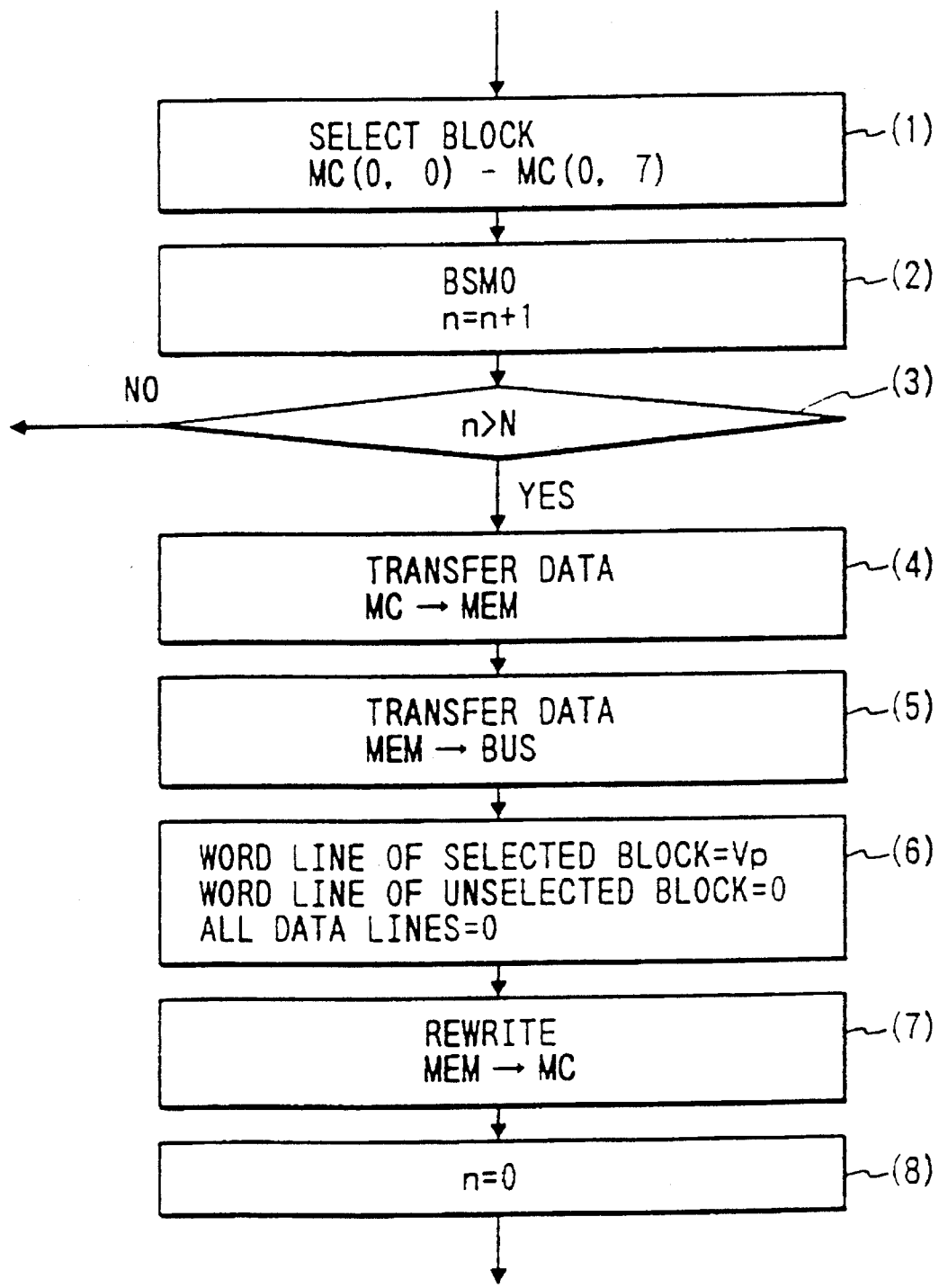
FIG. 32 is a flow chart for explaining one example of the reading operation of a semiconductor memory system having a rewrite numbering function and a forced refreshing function.

FIG. 32 is a flow chart for explaining one example of the reading operation of a semiconductor memory system having the aforementioned rewrite numbering function and forced refreshing function, as shown in FIGS. 30 and 31.

At Step (1), the block 0 is selected by a memory accessing. At Step (2), the counted value of the write number storing memory BSM0 corresponding to the selected block 0 is set to n=n+1. At Step (3), the write limiting number N and the counted number n are compared, and an ordinary memory accessing is carried out if n<N (NO). If n>N (YES), the routine enters a next forced refreshing operation.

At Step (4), the stored data are saved prior to the forced refreshing. Specifically, the stored data of the corresponding memory block MC are transferred to the memory circuit MEM. If the reading mode is instructed, the data are outputted at Step (5) through the bus BUS. Incidentally, in case of the writing operation at the block unit, the so-called initializations are carried out by the forced refreshing. Thus, the previous stored data need not be latched, and the routine skips from Step (3) to Step (6).

At Step (6), in case of FIG. 30, all the word lines (i.e., second word lines) of the selected block are set to the high voltage Vp, and all the data lines are set to 0 V. In case of FIG. 31, although not shown, all the data lines are set to the high voltage Vp, and the word lines (i.e., second word lines) are set to 0 V. As a result, a high electric field established by the aforementioned high voltage Vp is exerted upon the ferroelectric capacitors of the selected block so that the rewrite fatigue can be relieved to return the voluntary polarization of the initial state to the initial large value. At this time, the first word lines in the unselected block are turned OFF and left fed with 0 V so that the ferroelectric capacitors are fed with no voltage and held in the storing state.

At Step (7), the stored data saved in the memory circuit are rewritten in the memory block MC0 which has been relieved from the fatigue by the forced refreshing. Simultaneously with this, the counted value n of the rewrite number storing memory BSM0 is reset to 0.

We have found out that the reading operation of the ferroelectric capacitors is to decide whether or not the polarizations are inverted, by applying the write voltage Vo, as described above, that is, to sense the migration of charge (i.e., electric current) resulting from the inversion of polarization, and that the reading operation is substantially identical to the writing operation. Therefore, we have conceived the utilization of the write verifying function.

Figure 33:
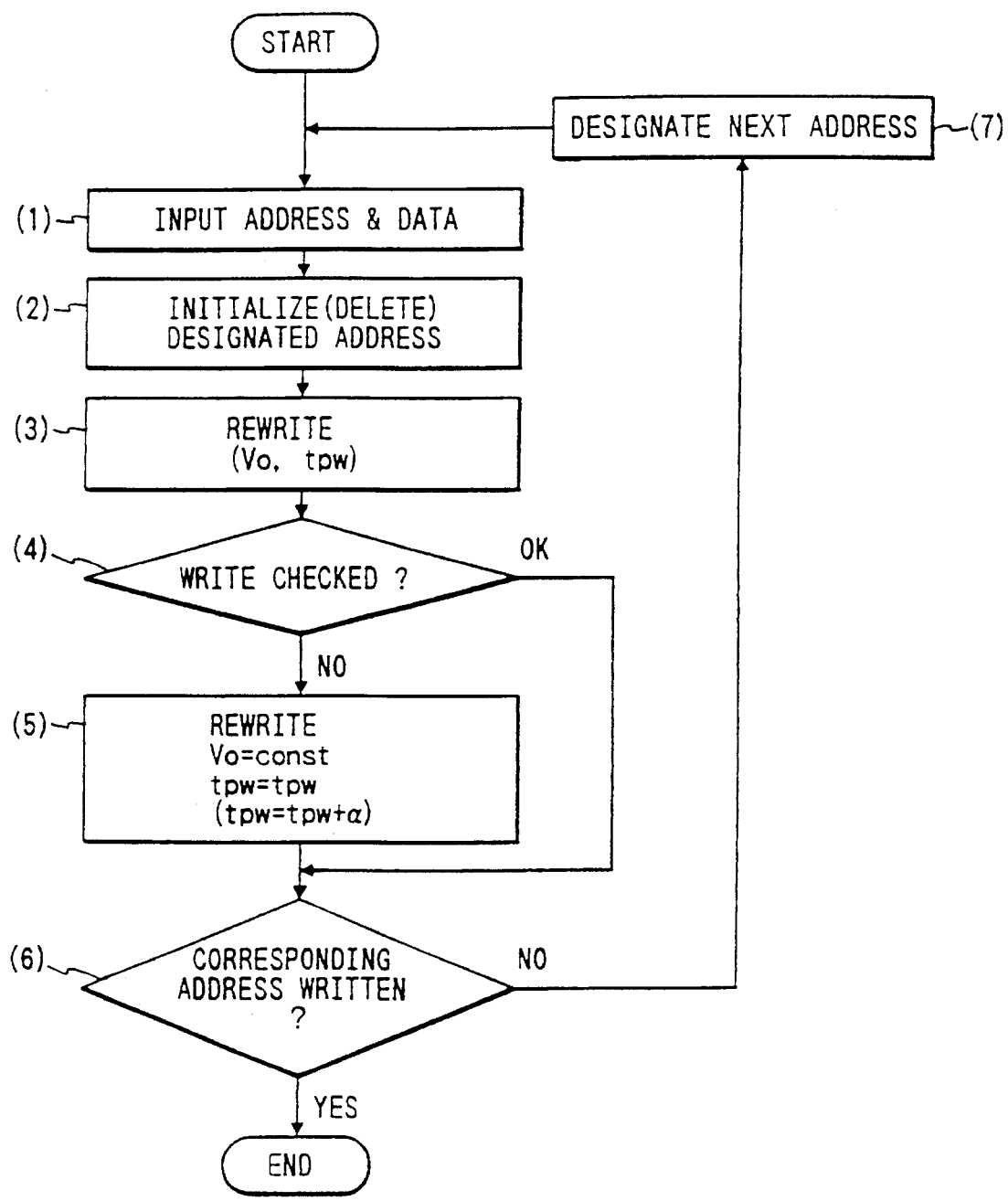
FIG. 33 is a flow chart showing one embodiment of the writing operation according to the present invention.

FIG. 33 is a flow chart showing one embodiment of the writing operation according to the present invention. This embodiment is directed to the write verifying function making use of the aforementioned fact that the writing operation and the reading operation are substantially identical to each other.

When the memory accessing is started, the address and data are inputted at Step (1). In the aforementioned block selecting method, at Step (2), the initialization (or the deletion of previous data) is carried out prior to the writing operation. In the writing operation like a random accessing, this initialization is omitted if the area to be written is already initialized.

At Step (3), the voltage Vo for inverting the polarization is applied for a writing time tpw to the data for inverting the polarization at the time of initialization. Simultaneously with this, the sense amplifier is rendered operative as in the reading operation. Specifically, the migration of the charge in the ferroelectric capacitors in accordance with the aforementioned polarization inversion is sensed by the sense amplifier as in the reading operation.

At Step (4), the aforementioned sense level is checked. If (OK) a predetermined sense level is obtained, the routine transfers to Step (6), at which it is decided whether or not the corresponding block has been written to the final address. If the predetermined sense level is not obtained, a rewrite is carried out at Step (5). At this time, the write voltage Vo remains as it were, and the writing operation is carried out again under the same condition of the writing time tpw. This writing operation under the same condition is reasoned because its shortage comes from the fact that the writing pulse is not sufficiently applied to the ferroelectric capacitors due to the noise or the like at the writing time. Specifically, the elements having defective characteristics such as the defective ferroelectric capacitors are turned defective even if they are rewritten many times, so that the writing verification makes no substantial meaning. These defects can be omitted by other tests, and their relief cannot be achieved unless it resorts to a redundancy circuit. Considering the more or less deterioration or dispersion of the characteristics of the ferroelectric capacitors, the rewriting time may be increased to (tpw+$\alpha$).

If the writing operation is not completed at Step (6) up to the final address of the selected block, next address is designated at Step (7) so that a similar writing operation is carried out. When the writing operation is ended up to the final address, the responding block is completely written.

Figure 34:
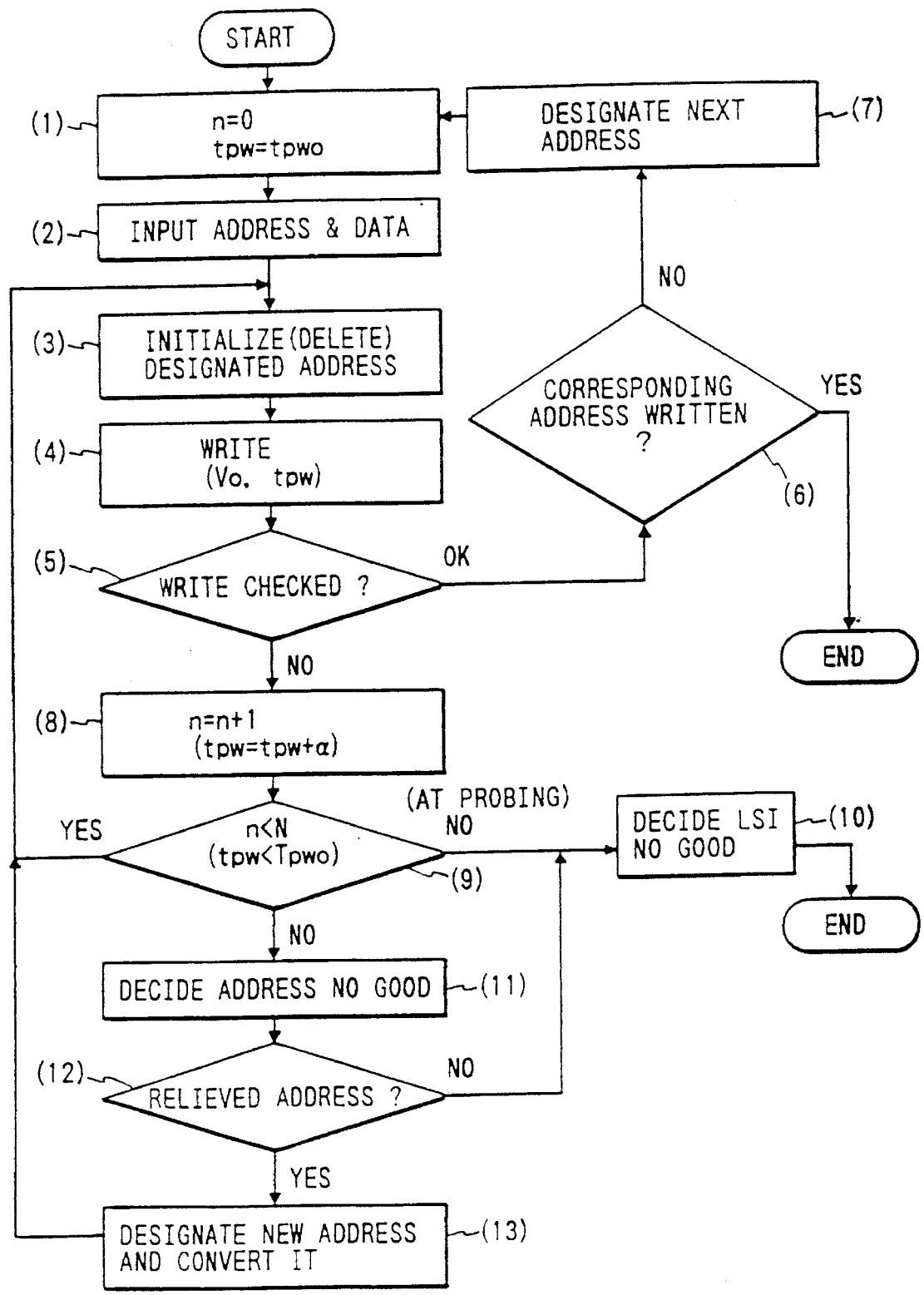
FIG. 34 is a flow chart showing another embodiment of the writing operation according to the present invention.

FIG. 34 is a flow chart showing another embodiment of the writing operation according to the present invention. This embodiment is directed to that the aforementioned write verifying function is extended to the probing test of the semiconductor memory system or the defect relief at the using time of the user.

When the memory accessing is started, at Step (1), the access number N is stored, and the writing time is set tpwo. The subsequent operations of Step (2) to Step (7) are similar to those of the aforementioned write verification of FIG. 32, and their description will be omitted. At Step (8), the rewriting operation is carried out by incrementing the write by number+1 when the result of the rewrite check is No Good (at this time, the writing time may be increased to (tpw+$\alpha$). At Step (9), it is decided whether or not a predetermined number N is exceeded (or whether or not the writing time reaches a maximum value Tpwo). At the probing step, what causes a defective even if the predetermined number N is exceeded or if the maximum time Tpwo is reached is decided, at Step (10), as a defective of the LSI (i.e., semiconductor memory system).

At the using time of the user, at Step (9), what causes a defective even if the predetermined number N is exceeded or if the maximum time Tpwo is reached is decided, at Step (11), as a defective of the selected block. At Step (12), the presence of the relieved address is examined. If the relieved address is absent, the corresponding LSI is likewise decided as a defective and is replaced.

In order to effect the aforementioned relief, the aforementioned blocks are formed in advance with one or more redundant blocks. If an unused redundant block is present, that is, if it is decided that the relieved address is present, a new address is designated at Step (13) to translate the address. Even if an identical address is designated from the outside, such an address translation is carried out in the internal circuit as will access to a redundant block in place of the aforementioned defective block.

For this address translation, it is convenient to use an address translator in which the logic of a decoder is changed by the aforementioned ferroelectric capacitors according to the stored data of the capacitors. However, this address translation should not be limited thereto but may be effected by switching the address by means of an electric disconnection such as fuse. After this address translation, the routine is returned to Step (3), at which a similar writing operation is checked.

Figure 35:
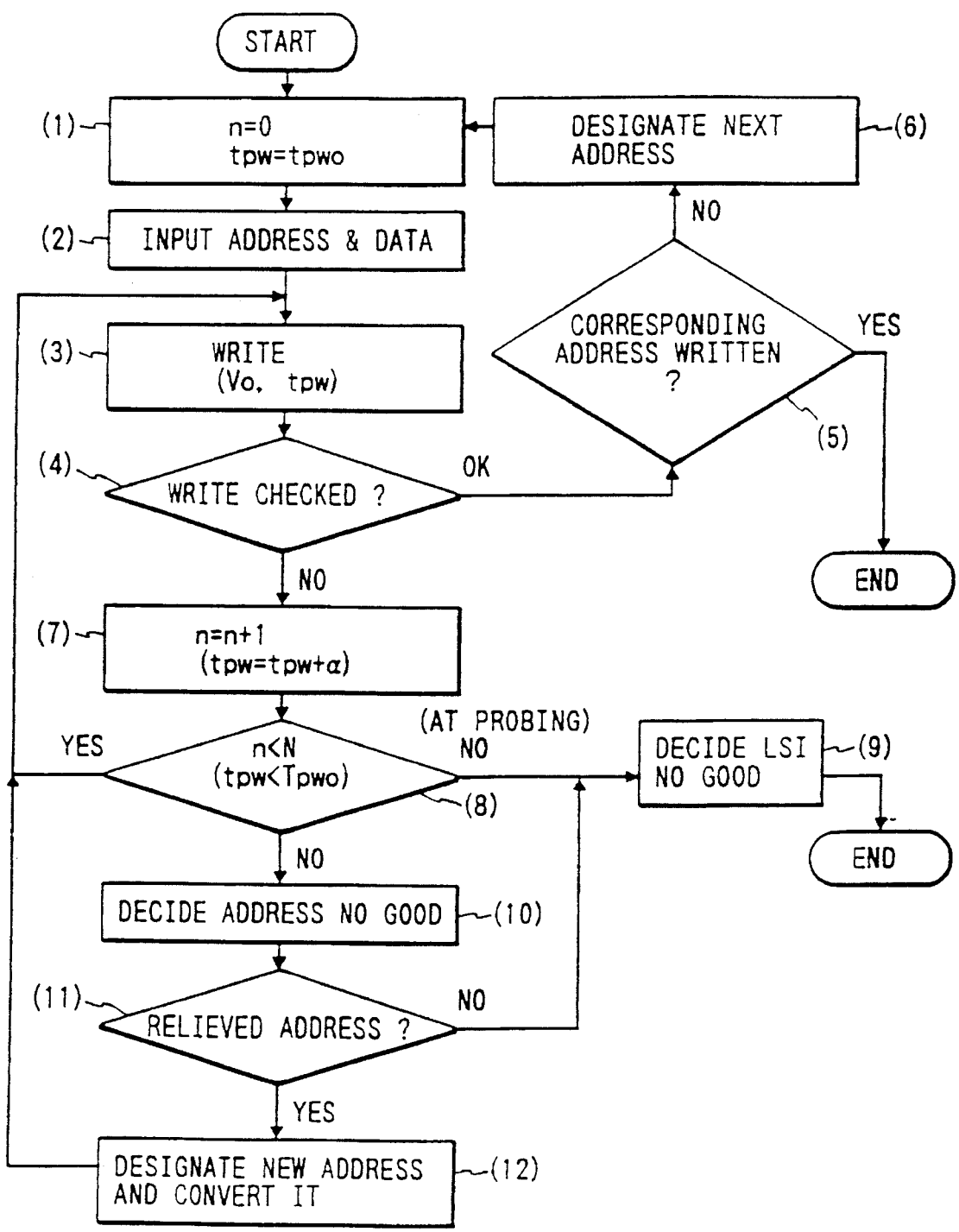
FIG. 35 is a flow chart showing another embodiment of the writing operation according to the present invention.

FIG. 35 is a flow chart showing another embodiment of the writing operation according to the present invention. This embodiment is directed like before to that the aforementioned write verifying function is extended to the probing test of the semiconductor memory system or the defect relief at the using time of the user.

In this embodiment, the check of the writing operation at Step (4) is carried out not by operating the sense amplifier when in the writing operation unlike the foregoing embodiment to decide the sensed amount but by reading the ferroelectric capacitors nondestructively. This nondestructive reading operation is exemplified by the technology which is disclosed in FIG. 18 of Japanese Patent Laid-Open No. 90189/1991.

This nondestructive reading operation will be briefly described in the following. In this reading operation, the memory cells are made by combining the ferroelectric capacitors and the paraelectric capacitors. These paraelectric capacitors are given about one ninth as high as the capacity of the ferroelectric capacitors. If two capacitors are connected in series for the reading operation, the applied voltage is divided in a manner to correspond to the inverse number of the capacity ratio so that the ferroelectric capacitors can be freed from the inversion of polarization. The divided voltage at this time is outputted through the switch MOSFET to the data lines so that a minute voltage corresponding to the polarizing direction can be established. When in the writing operation, the aforementioned two capacitors are connected in parallel with respect to the writing voltage to be fed through the switch MOSFET so that a writing voltage necessary for the polarity inversion can be applied to the ferroelectric capacitors.

By taking the write checking method described above, the initialization of Step (3) of FIG. 34 is omitted. The remaining operations are similar to those of FIG. 34, and their description will be omitted.

Figure 36:
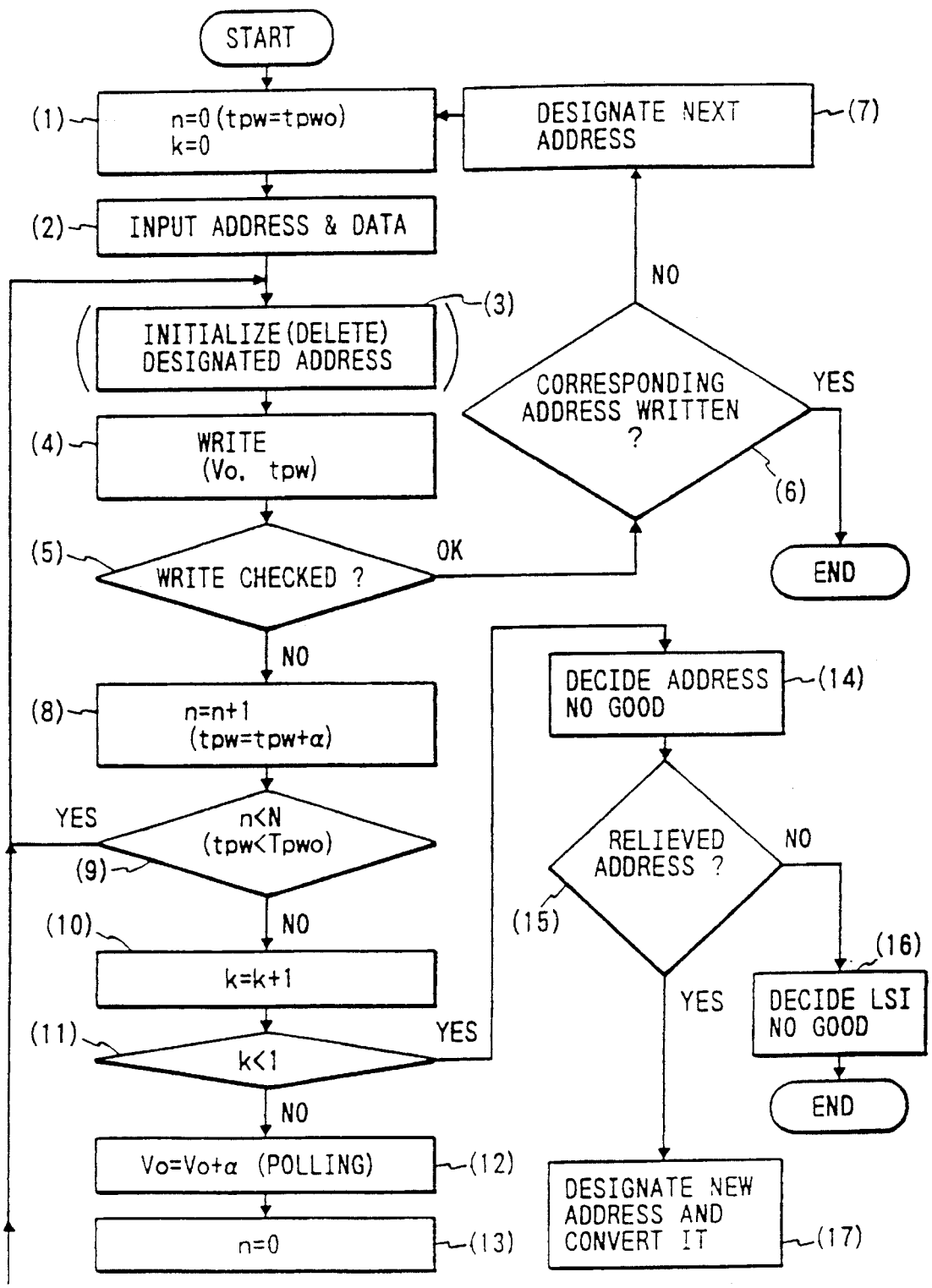
FIG. 36 is a flow chart showing still another embodiment of the writing operation according to the present invention.

FIG. 36 is a flow chart showing another embodiment of the writing operation according to the present invention. This embodiment is directed like before to that the aforementioned write verifying function is extended to the probing test of the semiconductor memory system or the defect relief at the using time of the user, and to that a forced refreshing (or polling) is executed to check the writing defective due to the write number fatigue.

In order to examine the writing defective which is caused by the write number fatigue, the number of polling operations is counted. At Step (1), the polling number k is additionally set to 0 as the initializing setting.

If it is decided at Step (9) that the writing operation is defective even if the allowable number N is reached, the polling number k is set to (k+1) at Step (10). If it is found at Step (11) that the polling number k is 0, the polling operation is carried out at Step (12). Specifically, the writing voltage is set to (Vo+$\alpha$) to execute the aforementioned polling (or forced refreshing) operation. After this, the number n is reset to 0 at Step (13), and the routine is returned to Step (3), i.e., the similar writing operation. The operation of this Step (3) is omitted if the writing check of Step (5)

resorts to the nondestructive reading operation. The remaining decisions and operations are similar to the aforementioned ones of FIGS. 34 and 35, and their description will be omitted.

Figure 37:
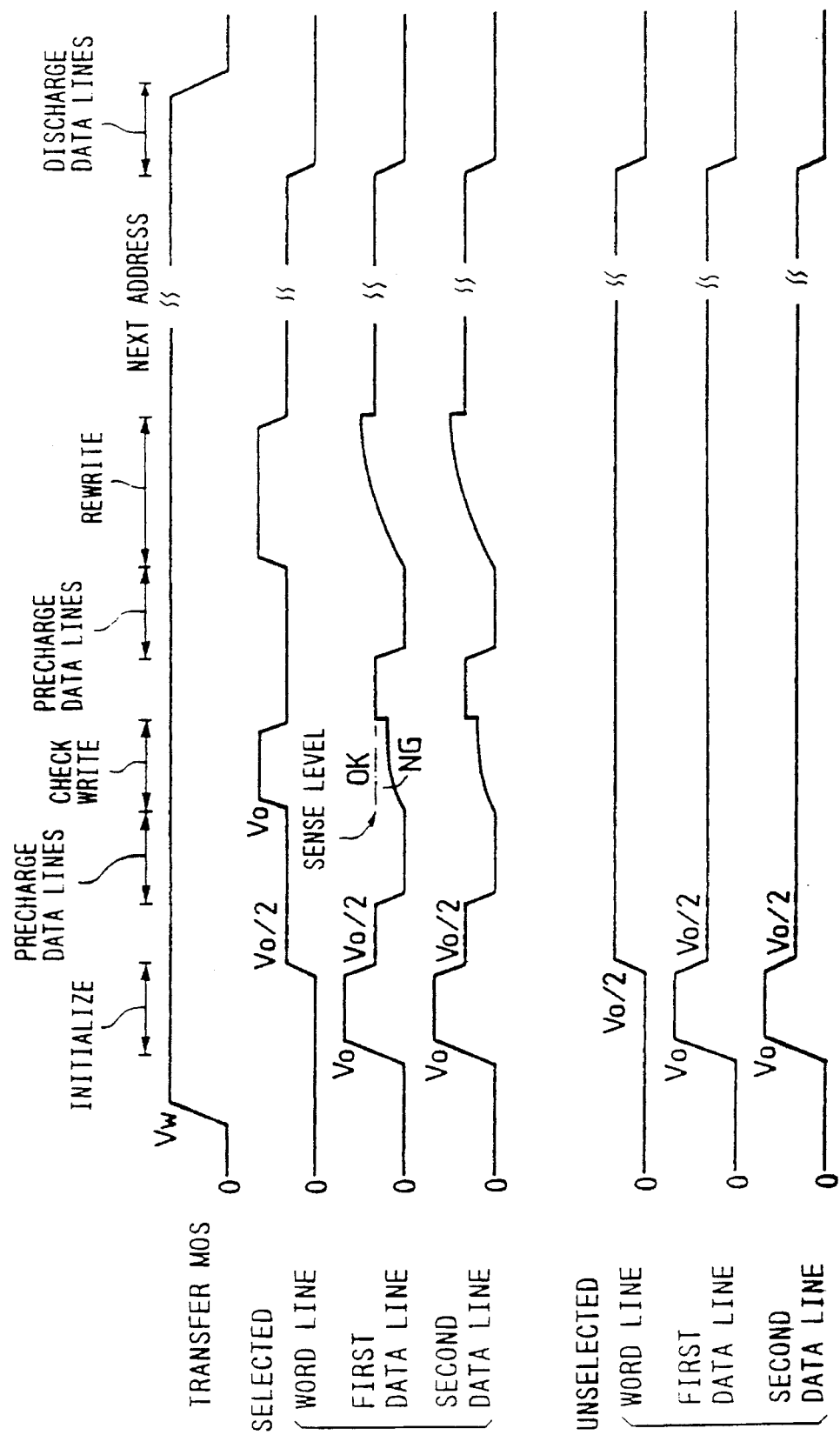
FIG. 37 is a waveform chart for explaining a write verifying operation corresponding to FIG. 33.

FIG. 37 is a waveform chart for explaining a write verifying operation corresponding to FIG. 33. FIG. 37 shows a waveform chart of the selected block. The word lines are the second word lines as in the foregoing waveform chart, and the transfer MOS corresponds to the first word line. The first data lines are those connected commonly with the individual blocks, and the second data lines are the sub-data lines in the blocks. The waveforms of the unselected block will be omitted because they are similar to those of FIG. 12.

In this embodiment, unlike the aforementioned writing operations of FIG. 12, a data line precharging operation is inserted to operate the sense amplifier thereby to effect the reading operation substantially. However, what is different from the reading operation is that the rewriting operation is omitted and left as the nondestructive reading operation, and that this reading operation is held as the writing operation.

The write check is carried out with the level sensed by the aforementioned writing operation (or polarization inversion). If a predetermined sense level is not exceeded, the data lines are precharged to execute the rewriting operation. When the aforementioned writing operation is ended for all the addresses of the block, the data lines are discharged before the first word lines (or the transfer MOS) are turned OFF. As a result, no voltage is applied to the ferroelectric capacitors in the block when that block is unselected.

Figure 38:
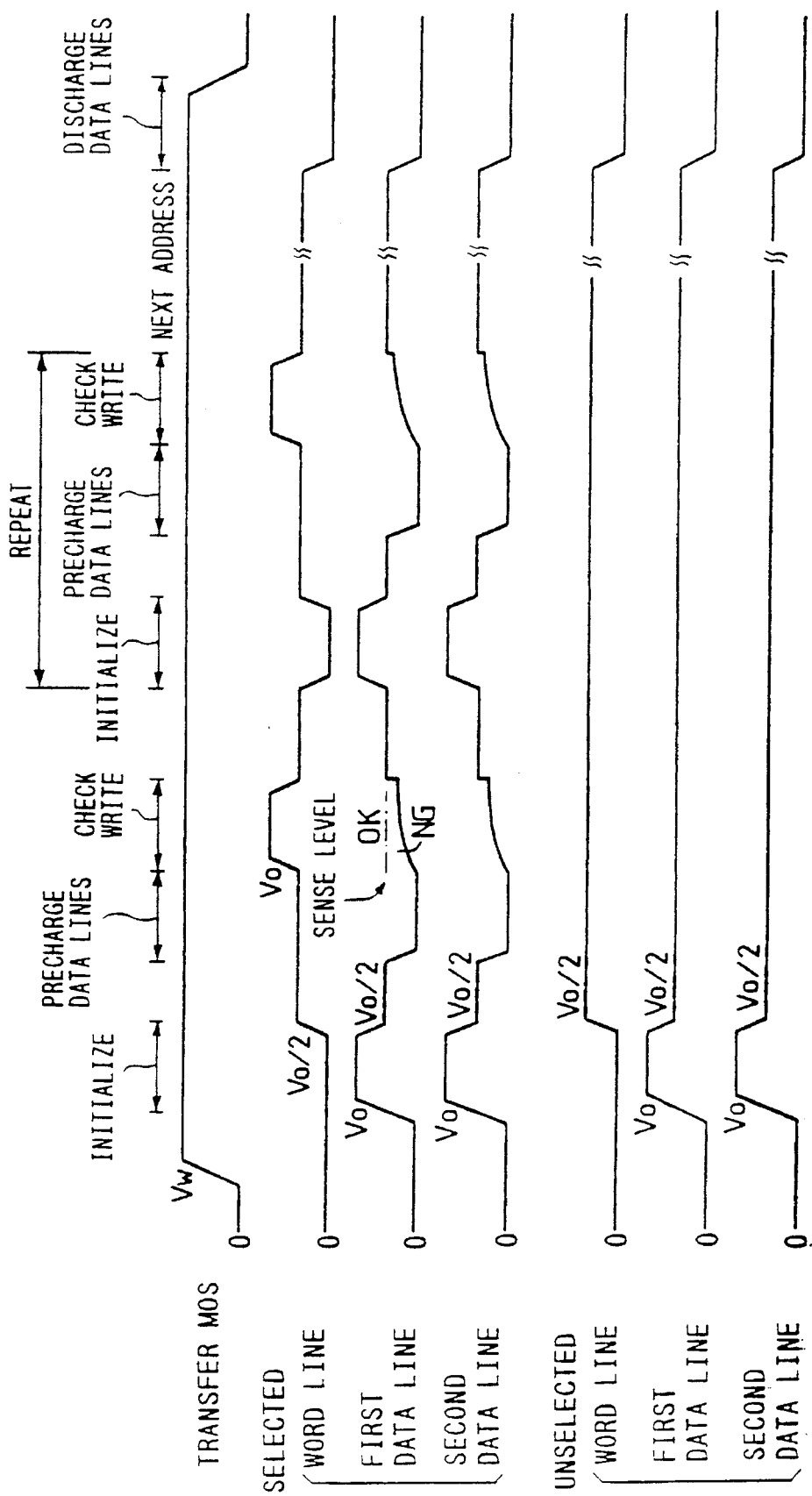
FIG. 38 is a waveform chart for explaining a write verifying operation corresponding to FIG. 34.

FIG. 38 is a waveform chart for explaining a write verifying operation corresponding to FIG. 34. FIG. 37 is basically similar to FIG. 37 but is different in that the rewrite number n is repeated to N.

Figure 39:
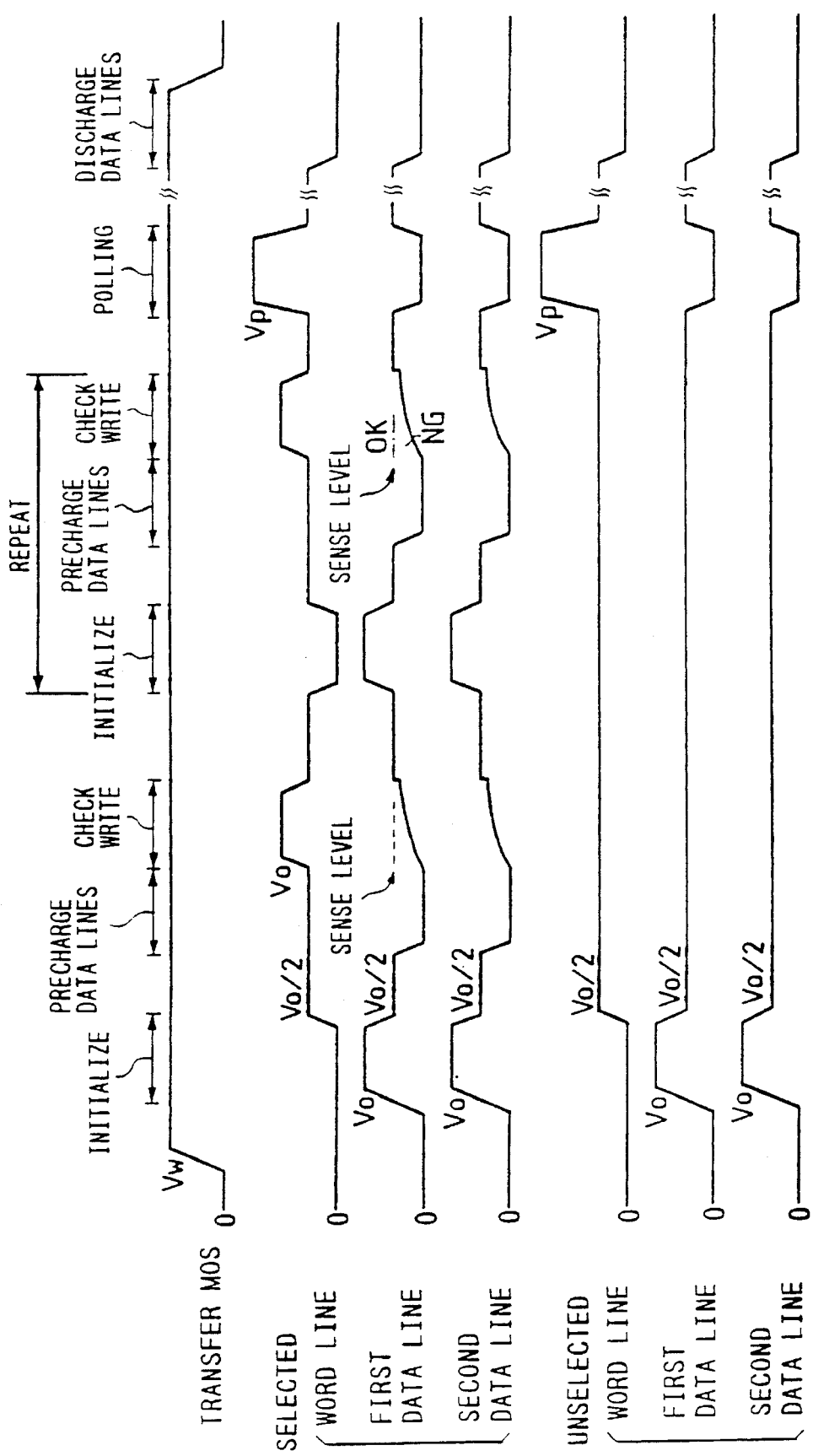
FIG. 39 is a waveform chart for explaining a write verifying operation corresponding to FIG. 36.

FIG. 39 is a waveform chart for explaining a write verifying operation corresponding to FIG. 36. FIG. 39 is basically similar to FIG. 38 but is different in that the rewrite number n is repeated to N and that the polling operation is carried out when a defective is found even the rewriting operation is repeated to N.

Figure 40:
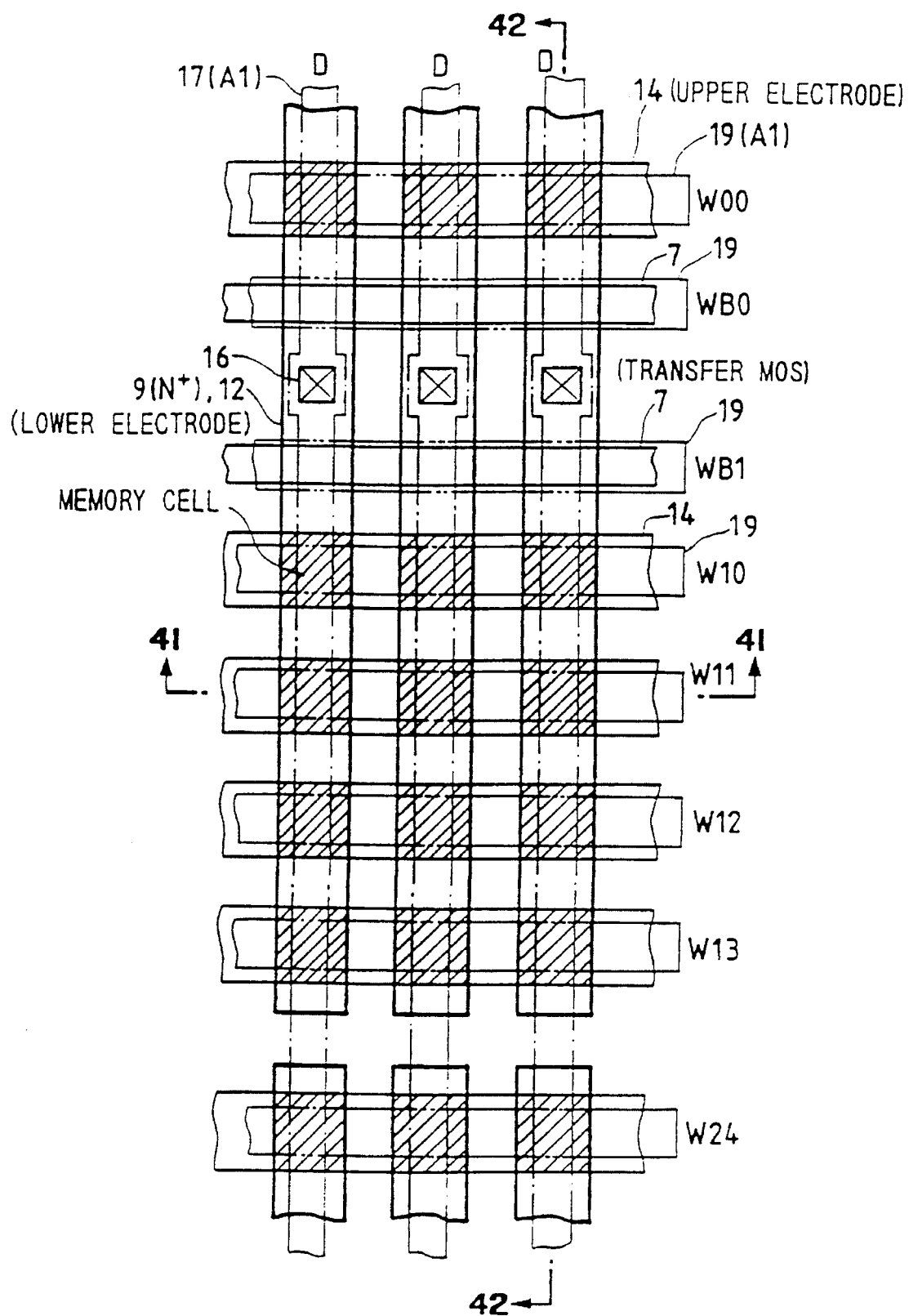
FIG. 40 is a layout diagram showing one embodiment of the memory array portion of the semiconductor memory system according to the present invention.

FIG. 40 is a layout diagram showing one embodiment of the memory array portion of the semiconductor memory system according to the present invention. In FIG. 40, there are representatively shown three data lines, two first word lines and six second word lines.

This embodiment is basically similar to the arrangement of the unit memory circuit of FIG. 19(B). However, one transfer MOSFET is equipped with four ferroelectric capacitors. Therefore, four second word lines, as designated at W10 to W13, are extended in the transverse direction of FIG. 40 and arranged in parallel. These word lines W10 to W14 are formed, as will become apparent from the following sectional views, with upper electrodes 14 of the ferroelectric capacitors and a shunting aluminum layer 19 formed through an inter-layer insulating film or another wiring layer and are suitably connected with one another.

The transfer MOSFET is composed of an $N^+$-type layer 9 formed to extend in the longitudinal direction and a wiring layer 7 formed with the first word line WB1 which is formed to intersect the $N^+$-type layer 9 at a right angle and integrally with the gate electrode. The wiring layers 7 are formed like the aforementioned second word lines W10 and so on with shunting aluminum layers 19 extending thereover in parallel and are suitably connected with one another.

The aforementioned $N^+$-type diffusion layers 9 are connected with contact portions 16 with the data lines D which are formed of aluminum layers (Al) extended In parallel and in the longitudinal direction over the $N^+$-type diffusion layers 9. About these contact portions 16, there are arranged the first and second word lines WB0 and W00 which are formed integrally with the gate electrodes of the transfer MOSFETs constituting the adjacent block 0 vertically symmetrically.

The ferroelectric capacitors as the memory cells for storing 1 bit are formed by using as their lower electrodes the silicide layers 12, which are formed over the $N^+$-type diffusion layers extended in the aforementioned longitudinal direction, and are arranged in the overlap portions, as hatched, in which the silicide layers 12 are overlapped with the second word lines extended in the transverse direction to intersect the silicide layers 12 at a right angle.

Figure 41:
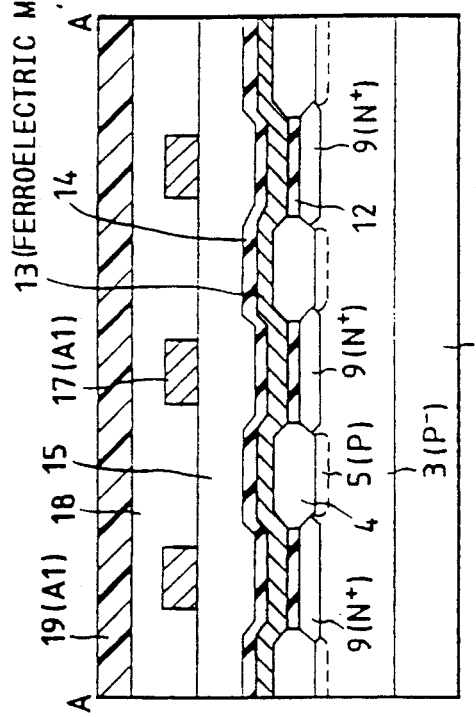
FIG. 41 is a section taken along line A—A' of FIG. 40.
Figure 42:
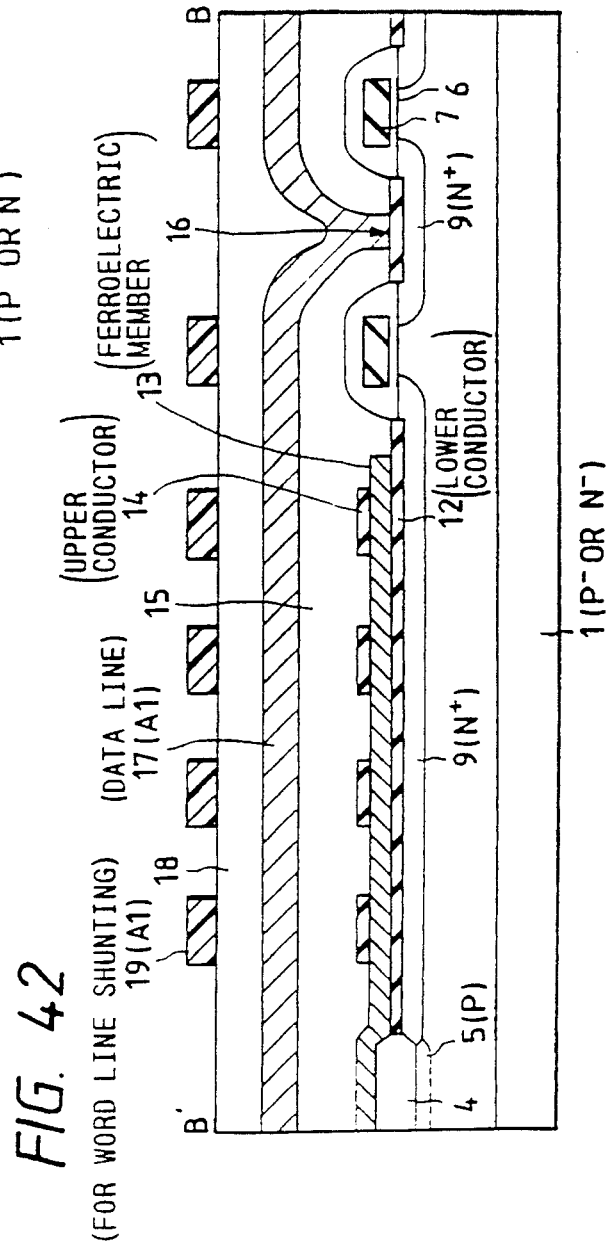
FIG. 42 is a section showing one unit memory circuit and taken along line B—B' of FIG. 40.

FIG. 41 is a section taken along line A—A' of FIG. 40, and FIG. 42 is a section showing one unit memory circuit and taken along line B—B' of FIG. 40. The unit memory circuit of the multi-capacitor type of this embodiment is characterized in that it is arranged in the transverse direction although the unit memory circuit of the prior art has a stacked structure.

FIGS. 43 and 44 are sections one embodiment of a process for manufacturing the aforementioned semiconductor memory system. The detail of the structure of the semiconductor memory system having the aforementioned construction will be more easily understood from the following manufacture process. FIGS. 43 and 44 show not only a unit memory circuit MC-FRAM but also the process for manufacturing an N-channel type MOSFET and a P-channel type MOSFET, which are used in the peripheral circuit of the former unit memory circuit.

By the technology for manufacturing the well-known CMOS integrated circuit, as shown in FIG. 43(A), those portions over a $P^-$- or $N^-$-type semiconductor substrate, which are to be formed with the aforementioned unit memory circuit MC-RAM and N-channel type MOSFET, are formed with a $P^-$-type layer 3, and the portions to be formed with the P-channel type MOSFET are formed with an $N^-$-type layer 2.

Field insulating films 4 are formed excepting the portions for the diffusion layers for forming the elements. Below the field insulating films 4, there are formed P-type channel stoppers 5. The surfaces of the element forming regions, as enclosed by the aforementioned field insulating films, are formed with thin gate insulating films 6, which are overlaid by gate electrodes 7 made of poly-silicon or polycide. These gate electrodes 7 and field insulating films 4 are used as masks to form the $N^+$-type diffusion layers 9 for constructing the sources and drains of the N-channel type MOSFETs. The P-channel type MOSFETs are formed with $P^+$-type diffusion layers 10 for constructing the sources and drains at different steps. CVD-$SiO_2$ are formed over the aforementioned gate insulating films 7. The MOSFETs may naturally be formed to have the LDD structure or the like. This LDD structure will be able to provide a fine structure and improve the reliability.

In FIG. 43(B), the side walls of CVD-$SiO_2$ are formed for the gate electrodes 7, and the silicide films 12 made of Pt or the like are formed by the well-known method over the surfaces of the diffusion layers 9. For example, the silicide films 12 are formed by removing the insulating films from the surfaces of the diffusion layers 9, by depositing Pt or the like on the diffusion layers 9 to form the silicide and by removing the Pt left unreacted.

As shown in FIG. 44(A), a ferroelectric material 13 such as $BaMgF_4$ is deposited by the well-known method, and the unnecessary portions are removed. The forming method of this ferroelectric layer is described in detail on pp. 122 to 125 of Magazine "Semiconductor World", February, 1991.

In FIG. 44(B), the upper electrodes 14 of Pt or the like are formed by the well-known method. As a result, there are formed the N-channel type MOSFETs as the transfer MOSFETs and the ferroelectric capacitors, which are necessary for the unit memory circuit. From then, inter-layer insulating films are formed, and the data lines are formed of aluminum or the like and are connected with the drains (or sources) of the transfer MOSFETs. If necessary, moreover, the inter-layer insulating films of the aforementioned embodiment are formed to form the shunting metal wiring layers 19 of aluminum or the like for reducing the resistances of the word lines.

Figure 46:
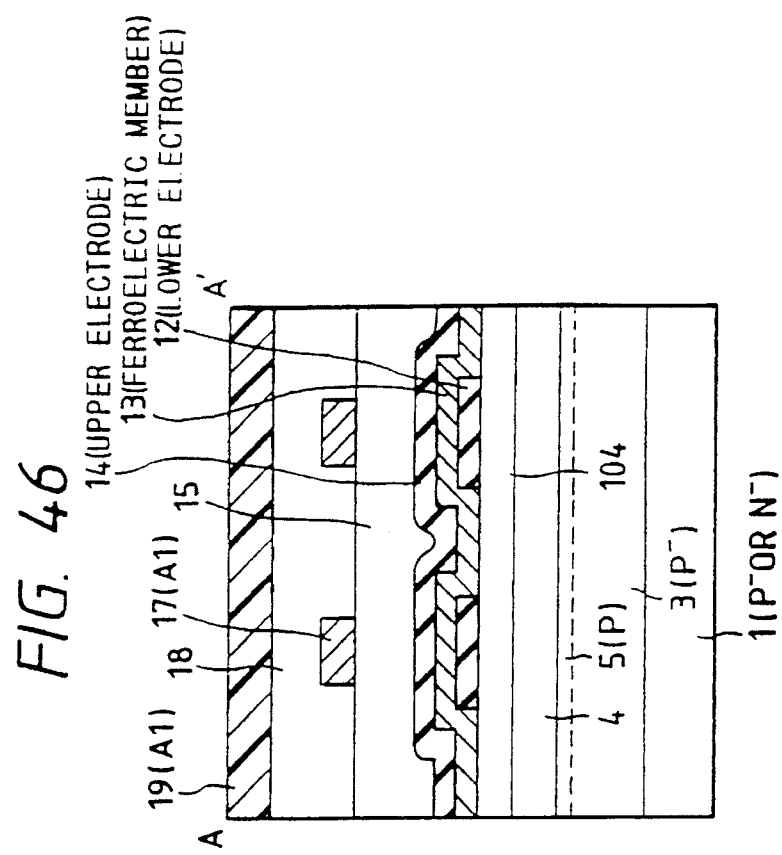
FIG. 46 is a section taken along line A—A' of FIG. 45.
Figure 45:
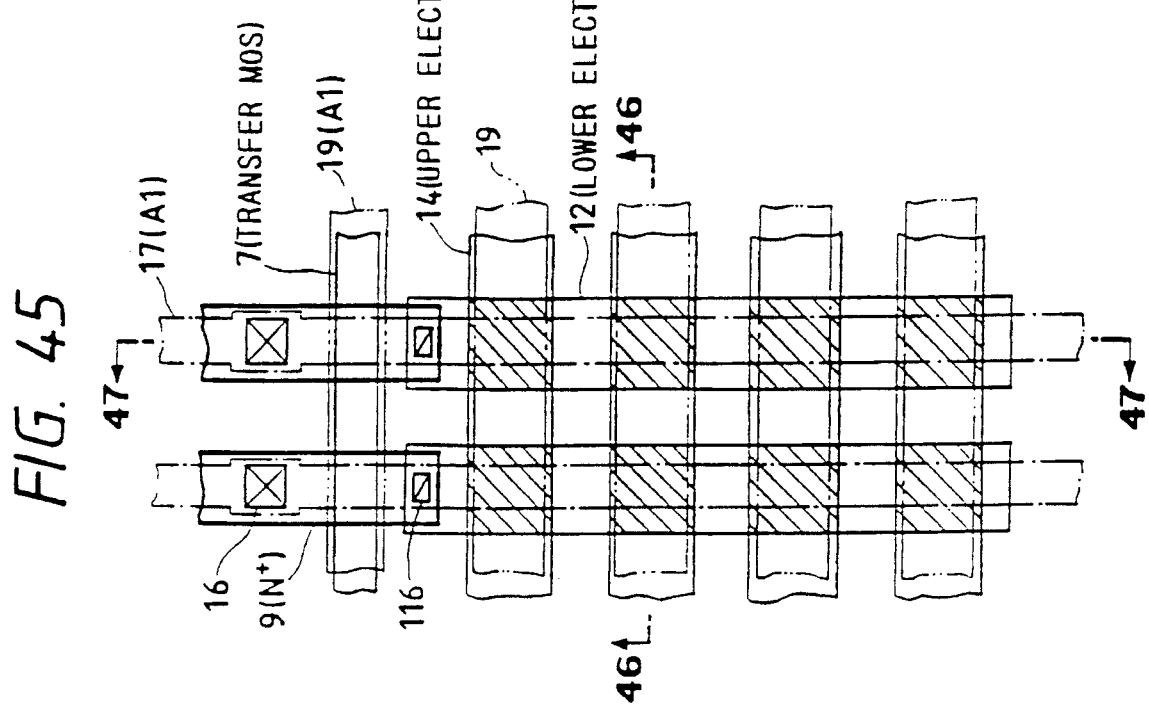
FIG. 45 is a layout diagram showing another embodiment of the memory array portion of the semiconductor memory system according to the present invention.

FIG. 45 is a layout diagram showing another embodiment of the memory array portion of the semiconductor memory system according to the present invention. FIG. 46 is a section taken along line A—A' of FIG. 45, and FIG. 47 is a section taken along line B—B' of FIG. 45.

Figure 47:
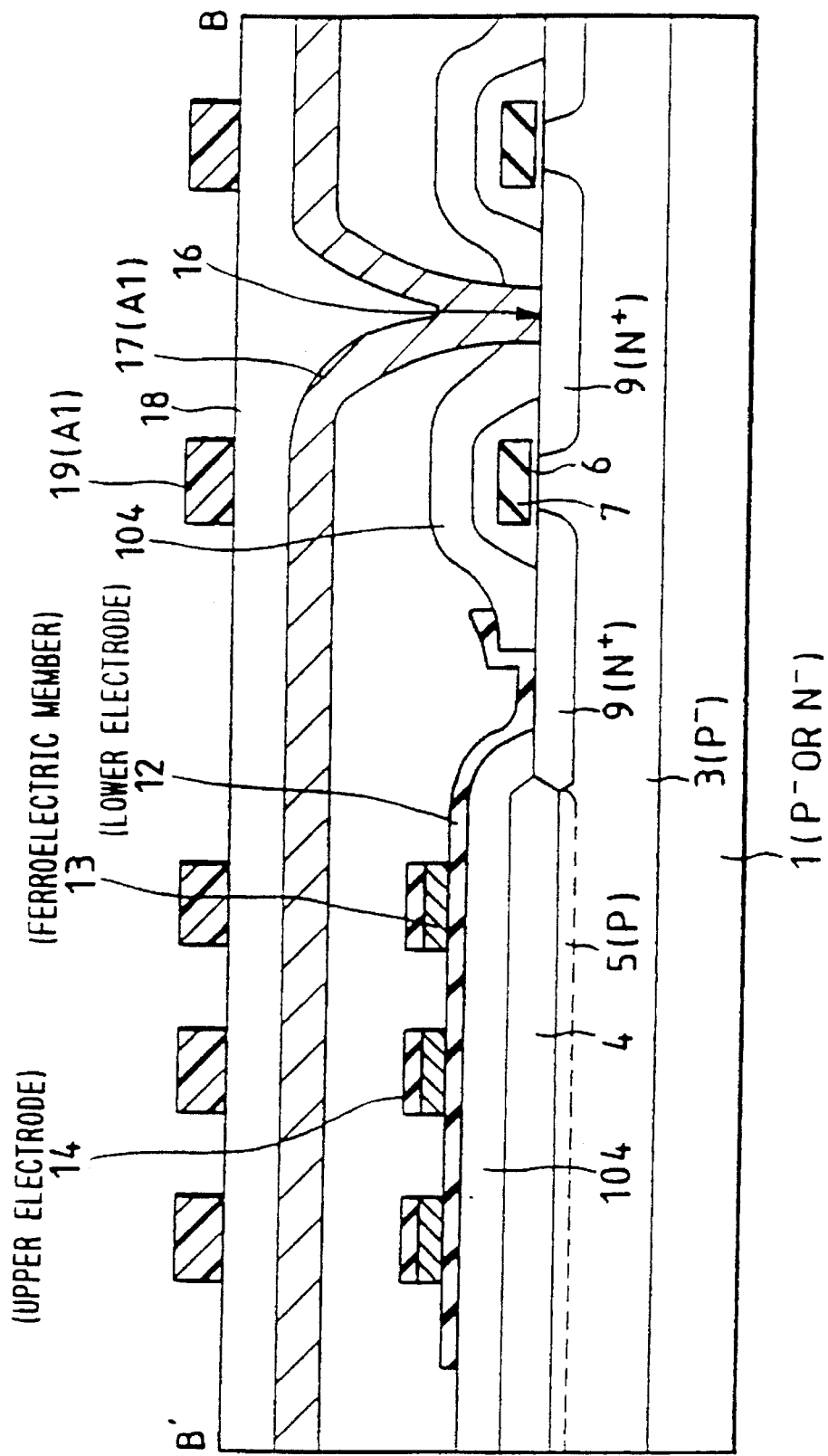
FIG. 47 is a section taken along line B—B' of FIG. 45.

As is apparent from FIGS. 45 to 47, this embodiment is slightly different in the structure of the ferroelectric capacitors. Specifically, in this embodiment, the lower electrodes 12 of the ferroelectric capacitors are formed over the field insulating films 4 and are connected with the sources or drains of the transfer MOSFETs. Thus, the diffusion layers 9 constructing the sources or drains of the transfer MOSFETs are reduced to such a small size as is necessary for forming contacts 116. As a result, the parasitic capacities of the sub-data lines can be remarkably reduced although the parasitic resistances of the sub-data lines are slightly increased.

Figure 48A:
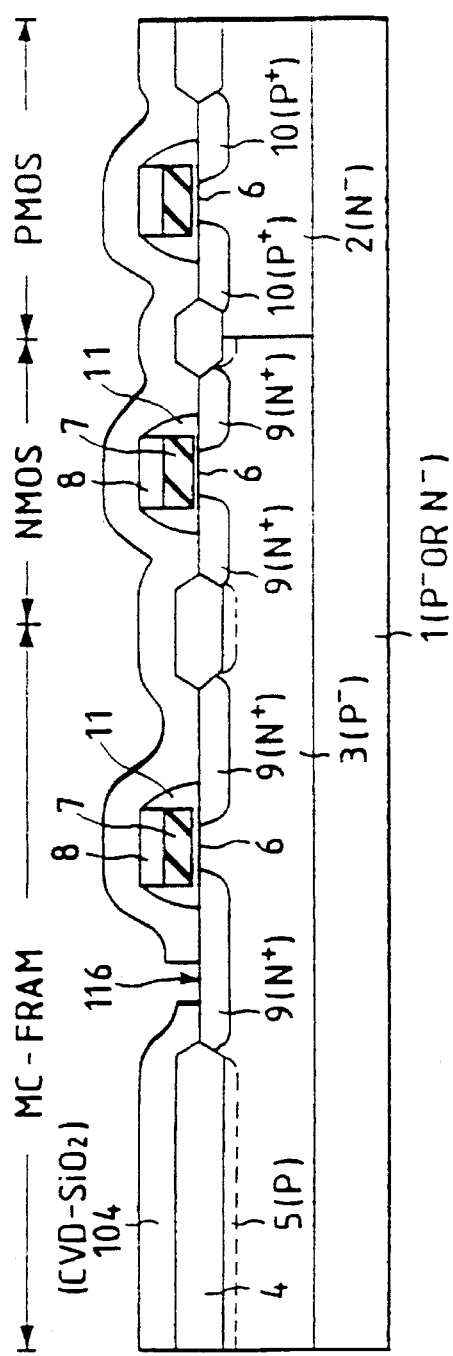
FIGS. 48(A) and 48(B) are sections each showing a portion of manufacture seeps for explaining one embodiment of a process for manufacturing the semiconductor memory system of FIG. 45.
Figure 48B:
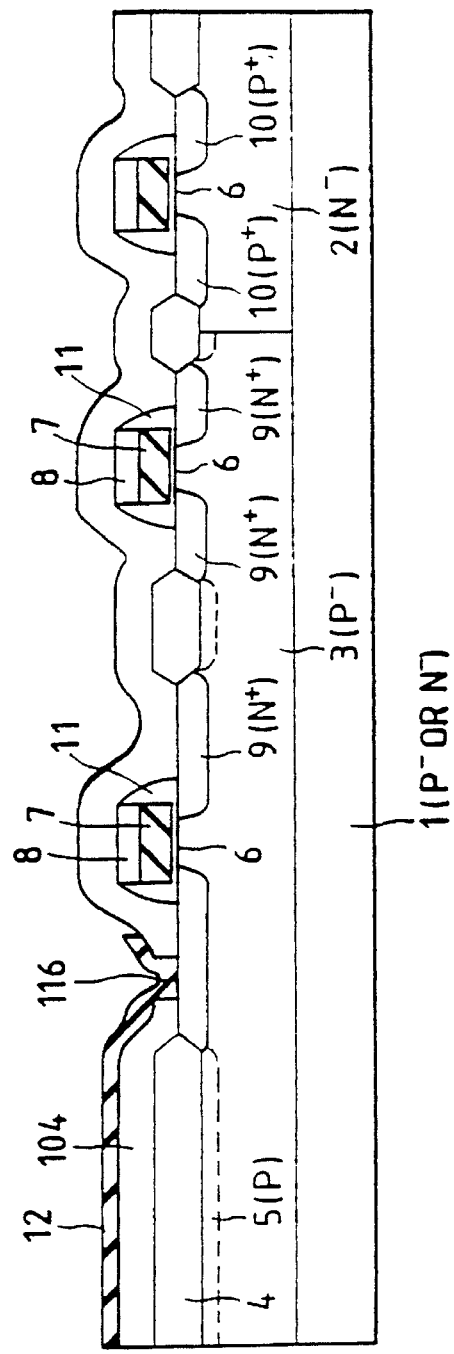
Figure 49:
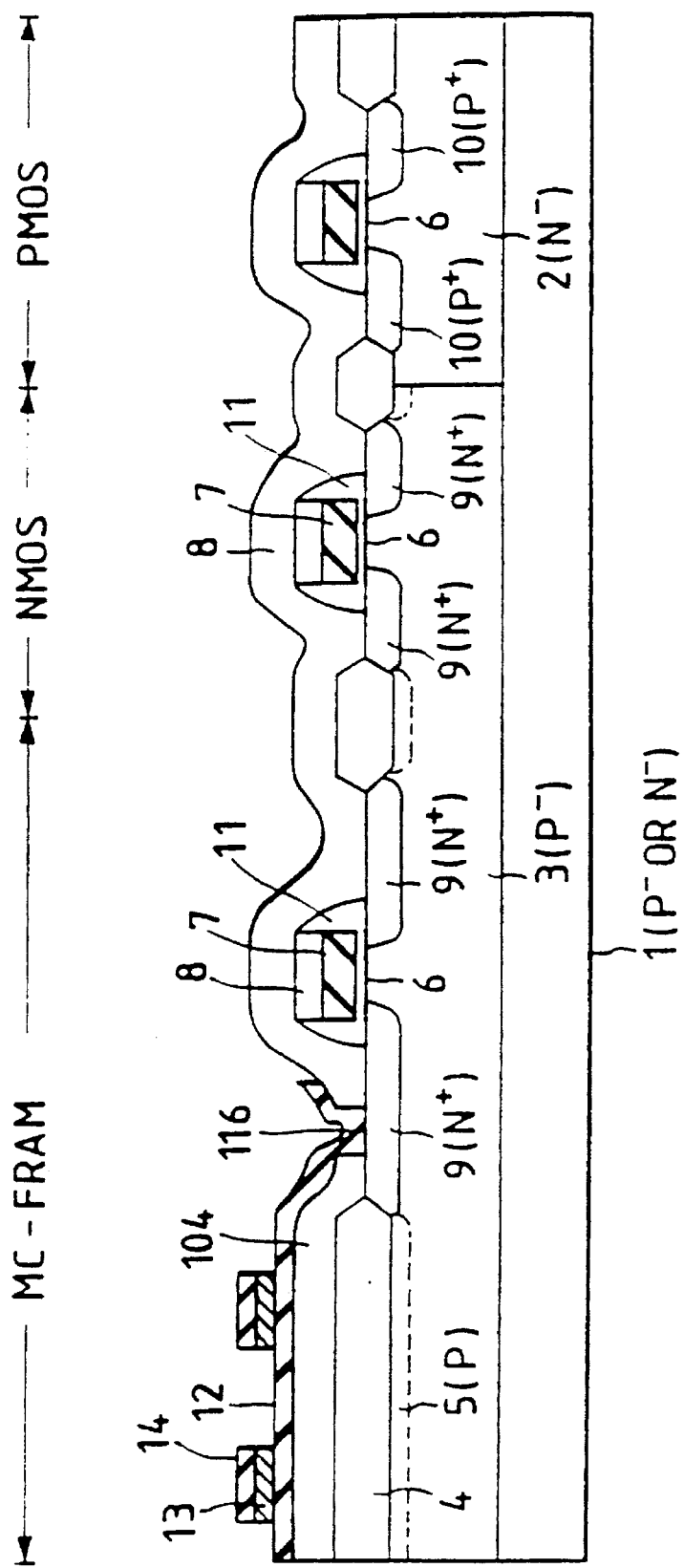
FIG. 49 is a section showing the remaining portion of the manufacture steps for explaining one embodiment of the process for manufacturing the semiconductor memory system of FIG. 45.

FIGS. 48 and 49 are sections each showing manufacture steps for explaining one embodiment of a process for manufacturing the aforementioned semiconductor memory system. The detail of the structure of the semiconductor memory system having the aforementioned construction will be more easily understood from the following description of the manufacture process. FIGS. 48 and 49 show the process for manufacturing not only the unit memory circuit MC-FRAM but also the N-channel type MOSFETs and P-channel type MOSFETs, which are used in the peripheral circuit of the unit memory circuit.

By the technology for manufacturing the well-known CMOS integrated circuit, as shown in FIG. 48(A), those portions over a P⁻- or N⁻-type semiconductor substrate, which are to be formed with the aforementioned unit memory circuit MC-RAM and N-channel type MOSFET, are formed with a P⁻-type layer 3, and the portions to be formed with the P-channel type MOSFET are formed with an N⁻-type layer 2.

Field insulating films 4 are formed excepting the portions for the diffusion layers for forming the elements. Below the field insulating films 4, there are formed P-type channel stoppers 5. The surfaces of the element forming regions, as enclosed by the aforementioned field insulating films, are formed with thin gate insulating films 6, which are overlaid by gate electrodes 7 made of poly-silicon or polycide. These gate electrodes 7 and field insulating films 4 are used as masks to form the N⁺-type diffusion layers 9 for constructing the sources and drains of the N-channel type MOSFETs. The P-channel type MOSFETs are formed with P⁺-type diffusion layers 10 for constructing the sources and drains at different steps. CVD-SiO₂ are formed over the aforementioned gate insulating films 7.

For the gate electrodes 7, there are formed side walls 11 of CVD-SiO₂ and inter-layer insulating films 104 of CVD-SiO₂. Moreover, the portions corresponding to the sources or drains of the transfer MOSFETs are formed with openings 116.

By the well-known method, as shown in FIG. 48(B), the silicide films 12 of Pt or the like are formed over the field insulating films 4 through the inter-layer insulating films 104. For example, the lower electrodes 12 are formed by depositing Pt or the like over the aforementioned layer insulating films 104 to form the silicide and by patterning them.

In FIG. 49, the ferroelectric material 13 of PZT or the like is deposited by the well-known method, and the upper electrodes 14 of Pt or the like are formed over the deposition. The aforementioned upper conductors 14 and ferroelectric members 13 are simultaneously patterned. As a result, there are formed the N-channel type MOSFETs as the transfer MOSFETs and the ferroelectric capacitors, which are necessary for the unit memory circuit. From then, inter-layer insulating films are formed, and the data lines are formed of aluminum or the like and are connected with the drains (or sources) of the transfer MOSFETs. If necessary, moreover, the inter-layer insulating films of the aforementioned embodiment are formed to form the shunting metal wiring layers 19 of aluminum or the like for reducing the resistances of the word lines.

The structure, in which a plurality of ferroelectric capacitors for one transfer MOSFET are arranged horizontally like the foregoing embodiments but unlike the stack structure of the prior art having the ferroelectric capacitors stacked, can reduce the manufacture steps drastically because the step of forming the ferroelectric capacitors is only once. In other words, the stack structure requires the similar forming steps of the capacitors to be repeated by the number of capacitors so that the manufacture process is complicated.

If the manufacture process is complicated as above, the cost is simply raised, and still the worse the characteristics of the ferroelectric capacitors are dispersed and deteriorated. Specifically, this deterioration is thought to come from that the dielectric material of the lower capacitors is subjected to a heat treatment each time of the manufacture step of a capacitor to be formed thereover and has its characteristics degraded by the influence of the heat, treatment.

Thus, in case of the stack structure, it is anticipated that the size of the capacitors composing the unit memory circuit is dispersed due to the misalignment of masks and that the migration of charge at the inverting time of the polarization is relatively seriously dispersed by the deterioration and dispersion of the aforementioned characteristics of the dielectric material. As a result, the operational margin of the sense amplifier may be deteriorated to cause a failure in the reading operation.

In the structure having the horizontal arrangement as in this embodiment, on the contrary, a plurality of capacitors are likewise formed at the common step to have their characteristics hardly dispersed so that they can provide stable writing and reading characteristics.

The horizontal arrangement described above never fails to have the area occupied by the memory array itself. In respect of this occupied area, the aforementioned stack area of the prior art is superior. However, it makes no substantial meaning no matter how highly the memory array itself might be integrated. That is to say, it should not be forgotten that the address selector for feeding the write voltage or the unselect voltage be actually present. In other words, even if the stack structure should be taken to narrow the pitch of the second word lines, no practical meaning would come out unless a stack structure should be given to the circuit for selecting the second word lines. Generally speaking, the CMOS circuit such as a decoder cannot be given the stack structure, it is not exaggerated too much to say that the stack structure cannot substantially aid in a high integration before a decoder having the stack structure is developed.

In this embodiment, an efficient layout can be efficiently made on the semiconductor substrate to enhance the substantial integration by causing the selector such as the decoder to conform to the pitch, at which the second word lines are transversely arranged and connected with the electrodes of the ferroelectric capacitors.

FIG. 50 presents sections of an element structure showing another embodiment of the semiconductor memory system according to the present invention. This embodiment is directed to the structure in which memory cells of 1 MOS/1 capacitor are juxtaposed, as in FIG. 16.

Figure 50A:
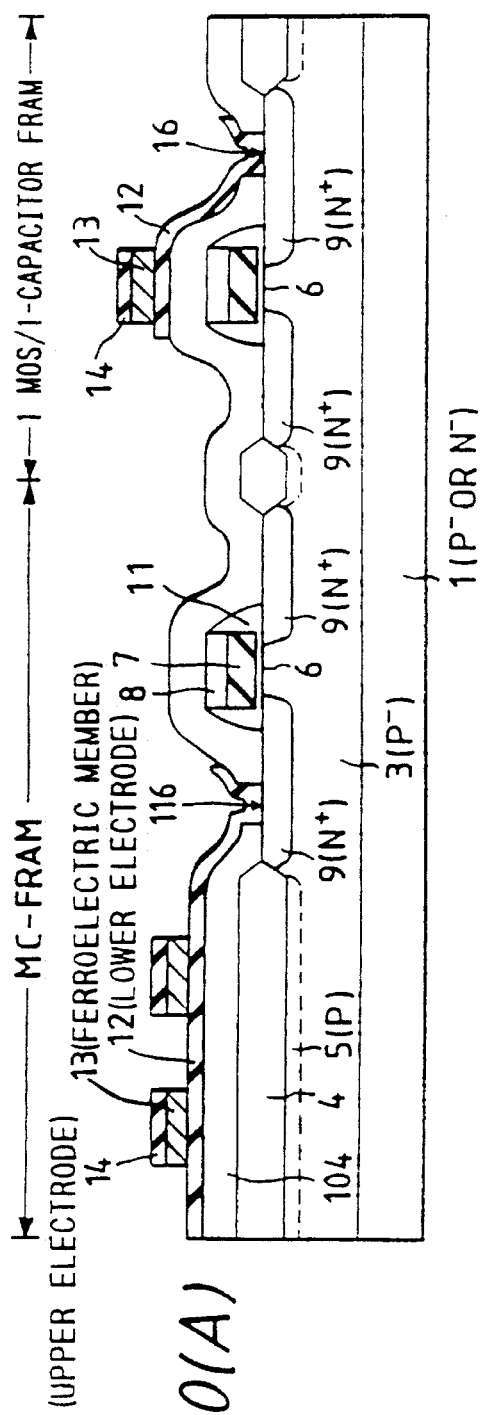
FIGS. 50(A) and 50(B) are sections each of an element structure and show another embodiment of the semiconductor memory system according to the present invention.

In FIG. 50(A), the memory cells of 1 MOS/1 capacitor are caused to operate as nonvolatile memories and are formed in the same element forming region 3 as that of the multi-capacitor type unit memory circuit MC-FRAM for similar writing and reading operations. At this time, ferroelectric capacitors are formed through the inter-layer insulating films 104 over their own transfer MOS so as to integrate the memory cells highly. These ferroelectric capacitors are formed at the same step and at the same time as those of the ferroelectric capacitors of the aforementioned multi-capacitor type unit memory circuit MC-FRAM so that they are formed in the inter-layer insulating films 104 of the field insulating films 4, too, in the multi-capacitor type unit memory circuit.

Figure 50B:
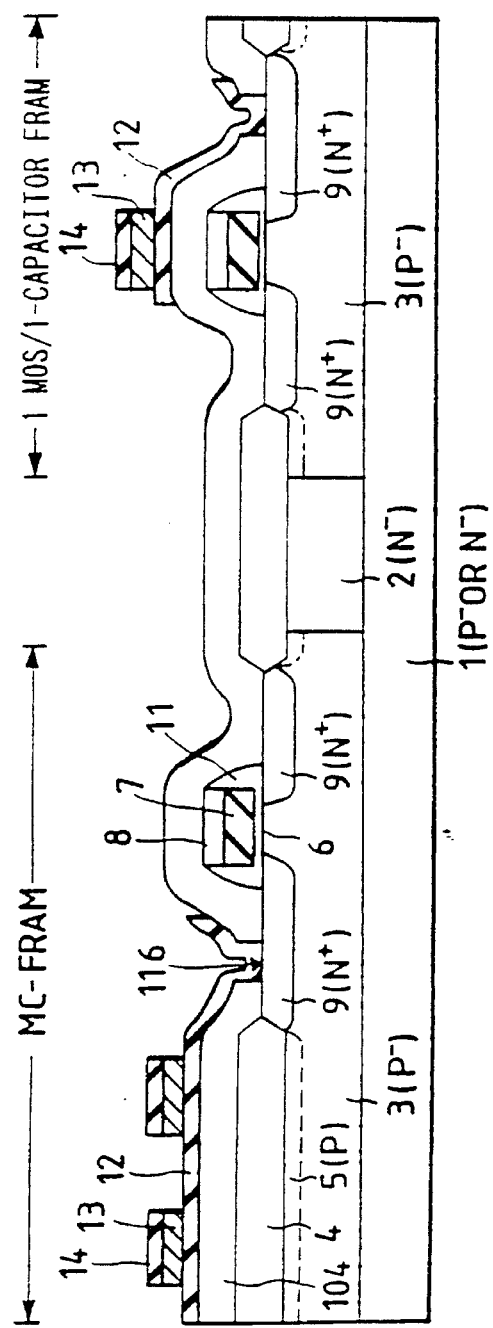

In FIG. 50(B), the memory cells of 1 MOS/1 capacitor are caused to operate not only as nonvolatile memories but also as volatile memories as in the ordinary dynamic type RAM. For these operations as the dynamic memory cells, the substrate has to be fed with a negative back bias voltage. For this bias, the element forming regions 3 of the multi-capacitor type unit circuit MC-FRAM and the 1 MOS/1 capacitor FRAM are electrically isolated by the $N^-$-type regions 2.

Figure 51:
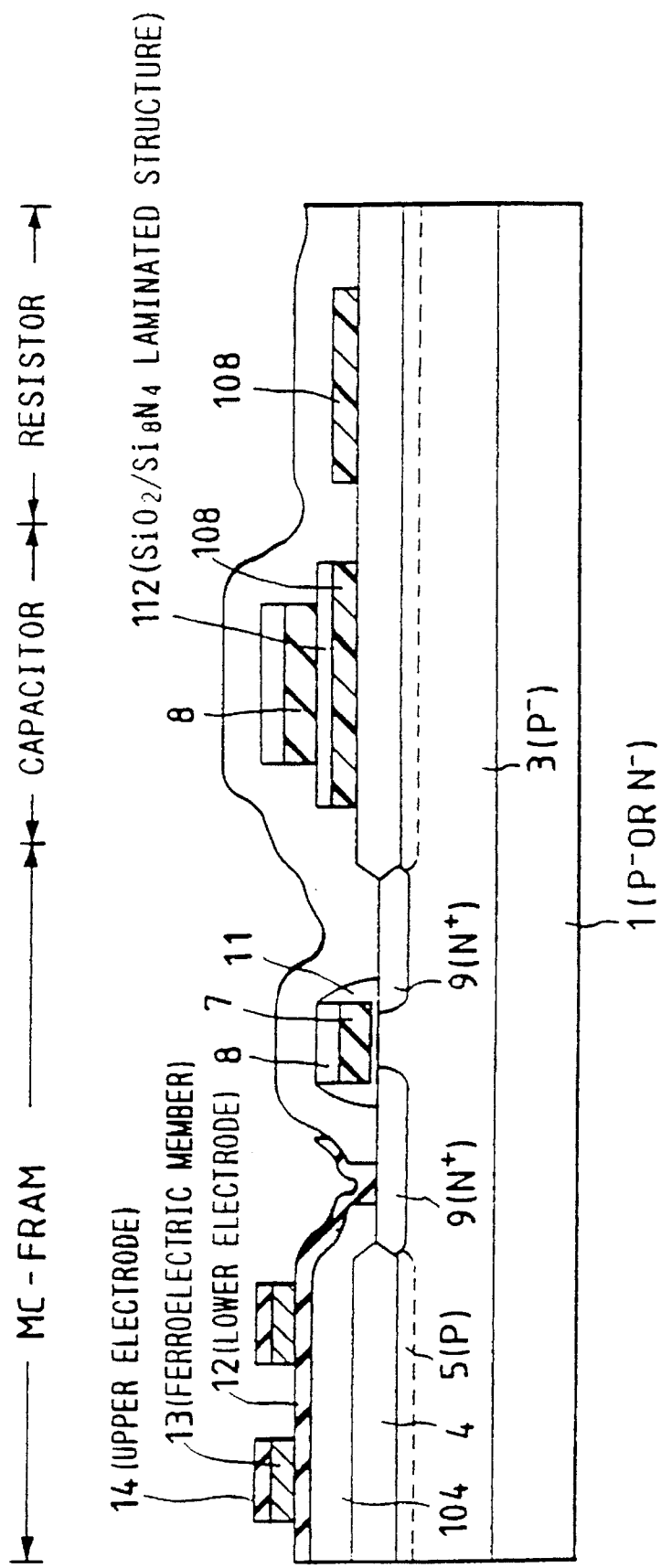
FIG. 51 is a section of an element structure and shows still another embodiment of the semiconductor memory system according to the present invention.

FIG. 51 is a section of an element structure and shows still another embodiment of the semiconductor memory system according to the present invention. In this embodiment, capacitors and resistors are formed to give multiple functions to the semiconductor memory system. The resistors can be formed by making use of poly-silicon layers 108, and the capacitors are formed by stacking the poly-silicon layers 108 and a dielectric material $Si_3N_4$. For example, the aforementioned block selecting system has to be equipped with an oscillation circuit for producing incrementing pulses so as to produce address signals at the inside. The oscillation circuit can be realized by a charge/discharge circuit making use of the capacitor and the resistor, as shown.

In case the multi-capacitor type memory circuit of this embodiment is packaged in a chip microcomputer, the aforementioned resistors and capacitors can also be utilized in case the A/D converter or the like is to be formed.

Figure 52:
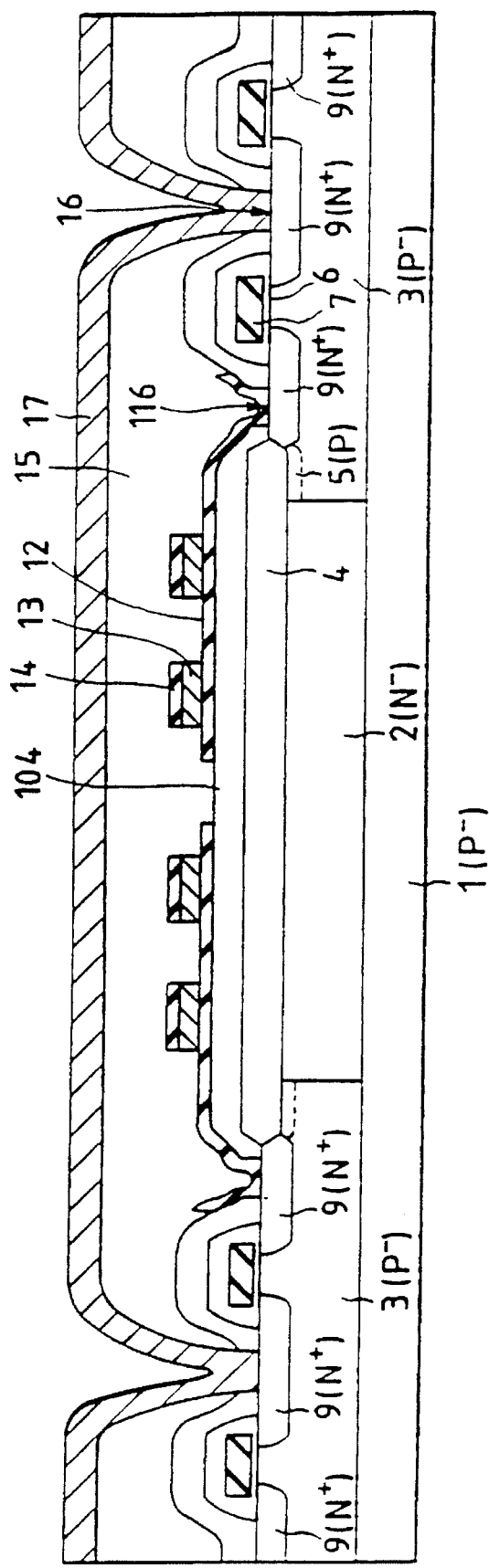
FIG. 52 is a section of an element structure and shows another embodiment of the semiconductor memory system according to the present invention.

FIG. 52 is a section of an element structure and shows another embodiment of the semiconductor memory system according to the present invention. In this embodiment, the lower electrodes 12 of the ferroelectric capacitors and the semiconductor regions below the former are made of not the $P^-$-type regions 3 of the foregoing embodiment but the $N^-$-type regions 2 connected electrically with the substrate 1. The $P^-$-type regions 3 to be formed with the aforementioned N-channel type MOSFET allow a leakage current to flow therethrough in response to the switching action of the MOSFET so that a potential change is established by the distributed resistance in the $P^-$-type regions 3. When this potential change occurs, the parasitic capacity causes a potential change in the lower electrodes 12 of the ferroelectric capacitors placed in the floating state, so that a stress is applied to the ferroelectric capacitors by the DC voltage.

As in this embodiment, the potential of the substrate 1 is given by changing the semiconductor regions below the field insulating films 4 to be formed with the ferroelectric capacitors into the $N^-$-type regions 2, so that a stable potential can be maintained against the switching operation of the MOSFET. As a result, it is possible to prevent the undesired stress from being applied to the ferroelectric capacitors, as described above.

Figure 53:
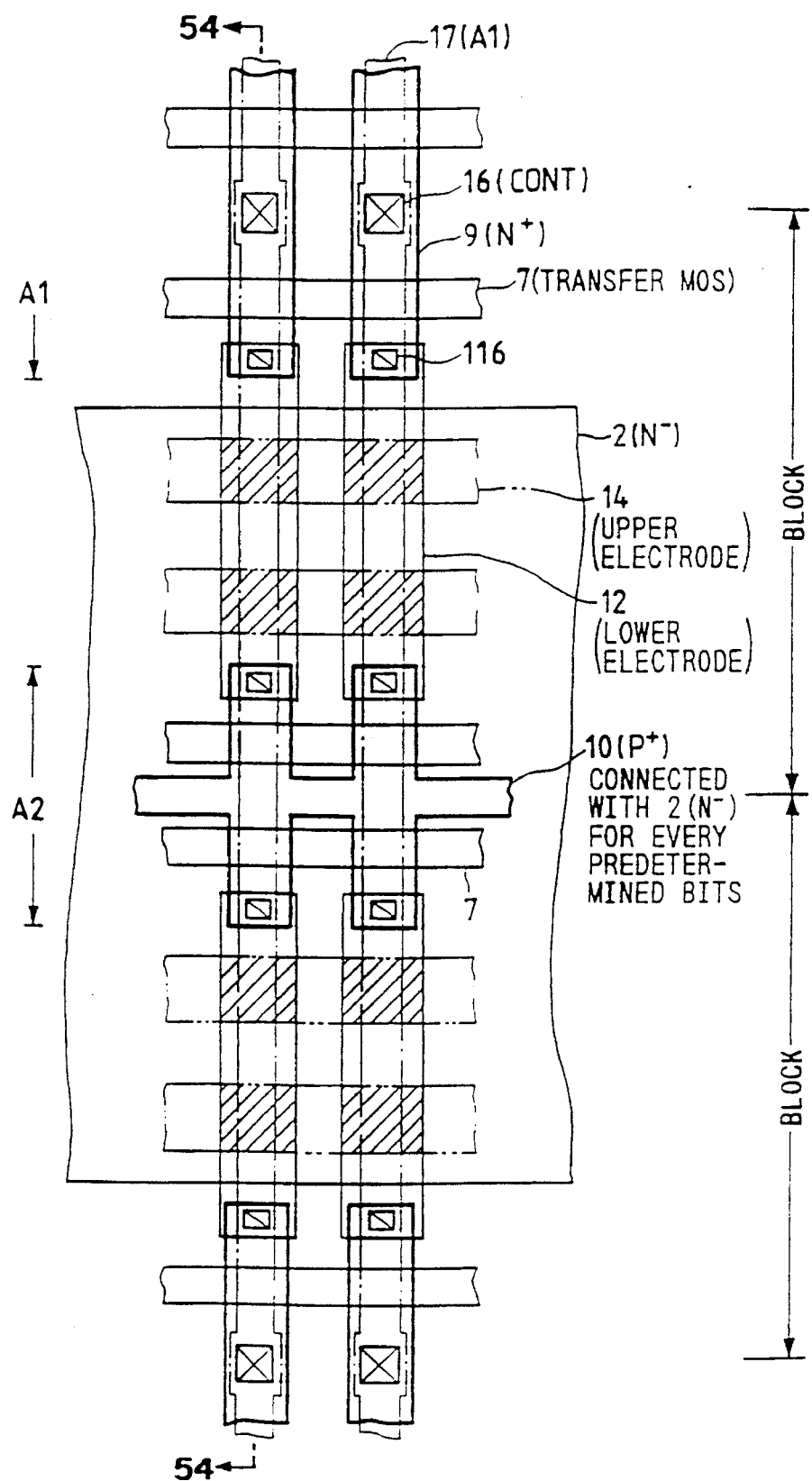
FIG. 53 is a layout diagram showing still another embodiment of the semiconductor memory system according to the present invention.
Figure 54:
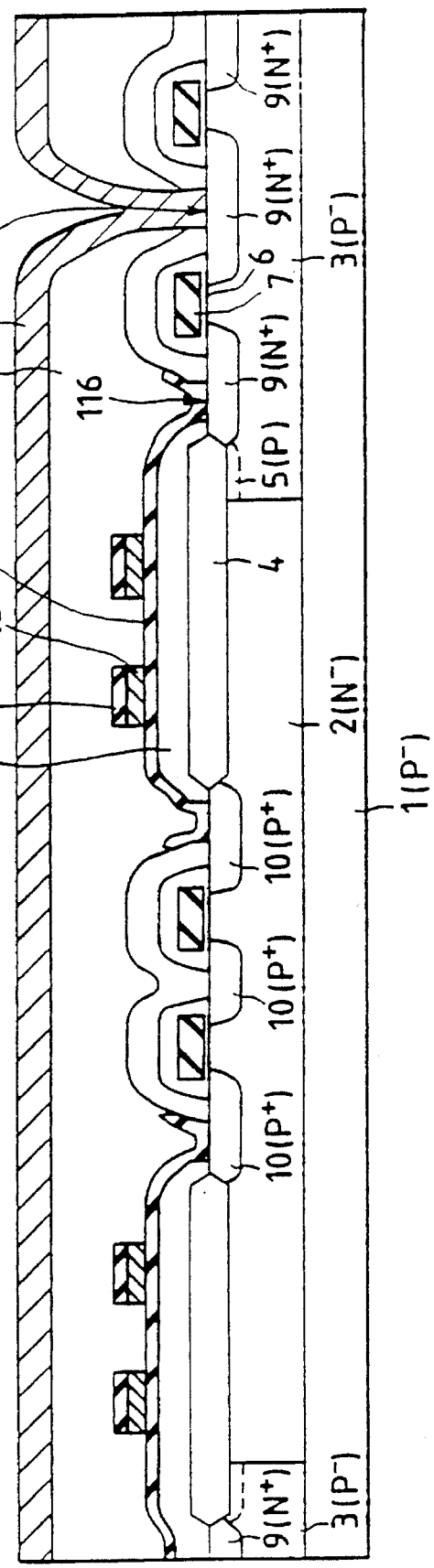
FIG. 54 is a section taken along B—B' of FIG. 53.

FIG. 53 is a section of an element structure and shows still another embodiment of the semiconductor memory system according to the present invention, and FIG. 54 is a section taken along line B—B' of FIG. 53. In FIGS. 53 and 54, the semiconductor memory system is embodied such that two ferroelectric capacitors are disposed in the unit memory circuit. The sub-data lines of the unit memory circuit of this embodiment are brought into the floating state, when the memory circuit is unselected, responsively as the transfer MOSFET is turned OFF. Thus, the stress of the voltage of Vo/2 is prevented by performing the data line discharging operation at the end of the aforementioned memory accessing.

In order to eliminate the stress of the DC voltage to be applied to the ferroelectric capacitors, the voltage need not be at 0 V unlike the foregoing embodiment, but equal voltages may be applied to the two electrodes. In this embodiment, therefore, the memory block is equipped at the other terminal (i.e., at the portion A2 of FIG. 53) of the transfer MOSFET with a P-channel type MOSFET for feeding a bias voltage the sub-data lines (i.e., the second data lines). In order to form this P-channel type MOSFET, the semiconductor regions of the field insulating films 4 to be equipped with the ferroelectric capacitors are made of $N^-$-type regions (or well regions).

In a manner to correspond to a memory block adjacent to the $N^-$-type well region 2, there are formed two P-channel type MOSFETs, between which is applied a bias voltage of Vo/2 or the like. According to this construction, the discharge of the data lines is omitted unlike before at the end of the memory accessing, and the unselect level of the second word lines is set to the unselect level of Vo/2. As a result, the ferroelectric capacitors can have their two electrodes held at Vo/2 to prevent the characteristic deterioration due to the voltage stress.

Specifically, the P-channel type MOSFET has its other diffusion layer 10 connected with the lower electrodes 12 of the ferroelectric capacitor so that its gate electrode may be fed with the same select signal as that of the first word lines which are connected with the gate of the transfer MOSFET composed of the N-channel type MOSFET. When the first word lines are at the high level, the transfer MOSFET (i.e., the N-channel type MOSFET) is turned ON and selected. At this time, the aforementioned P-channel type MOSFET is turned OFF so that the lower electrodes are fed through the transfer MOSFET with the potential of the data lines.

In response to the low level of the first word lines, the aforementioned transfer MOSFET is turned OFF, and the P-channel type MOSFET is turned ON. As a result, the sub-data lines take the potential (e.g., Vo/2) fed through the P-channel type MOSFET. As the sub-data lines are set to such potential, the second word lines or the upper electrodes are left at the potential of the unselect level of Vo/2. As a result, the aforementioned data line discharging operations of FIGS. 12 to 15 can be omitted to shorten the substantial memory accessing time period. In other words, the memory operations can be speeded up.

In the foregoing embodiment of FIG. 52, the potential difference between the upper and lower electrodes of the ferroelectric capacitors is not completely reduced to zero by the parasitic capacity between the source diffusion layers 9 and the P⁻-type well regions 3 of the transfer MOSFET. In case, however, the P-channel MOSFET is used as above, the potential difference between the upper and lower electrodes of the ferroelectric capacitors can be completely reduced to zero.

FIG. 55 is a section of an element structure and shows still another embodiment of the semiconductor memory system according to the present invention. In this embodiment, the potential of the lower electrodes (i.e., the sub-data lines) of the ferroelectric capacitors of the unselected block can be controlled by the P-channel type MOSFET so that it is freed from the influences of the potential fluctuation of the P⁻-type well regions 3. If this fact is noted, the N⁻-type well regions 2 need not always be formed below the portions to be formed with the ferroelectric capacitors. In short, the N⁻-type well regions 2 may be modified, as indicated at (A) or (B), because it is sufficient if the P-channel type MOSFET can be formed.

This makes it unnecessary to provide a masking allowance between the N⁻-type well regions 2 formed in the vicinity of the ferroelectric capacitors and the diffusion layers 9 of the N-channel type MOSFET constituting the transfer MOSFET, so that the block size can be reduced. In other words, the memory array can be highly integrated.

Figure 56:
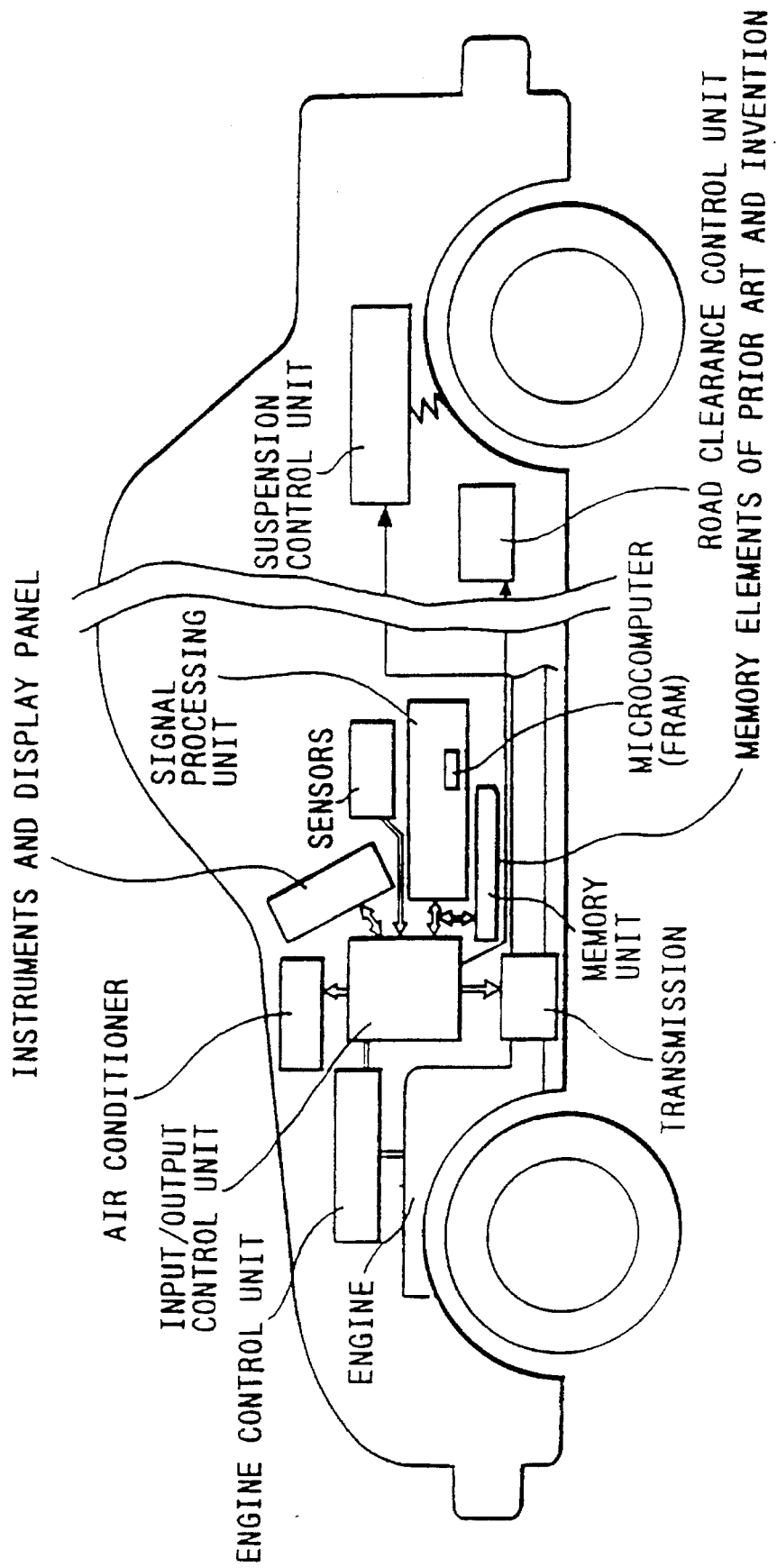
FIG. 56 is a schematic diagram of an automobile and shows an application of the semiconductor memory system according to the present invention.

FIG. 56 shows an application of the semiconductor memory system according to the present invention. The semiconductor memory system of this embodiment is applied to a system for electronically controlling an engine or suspension of an automobile. Specifically, a reliability upon the memory capacity is important in such system. The semiconductor memory system using the ferroelectric capacitors according to the present invention can highly endure disturbances so that it can solve the problem of reliability.

Figure 57:
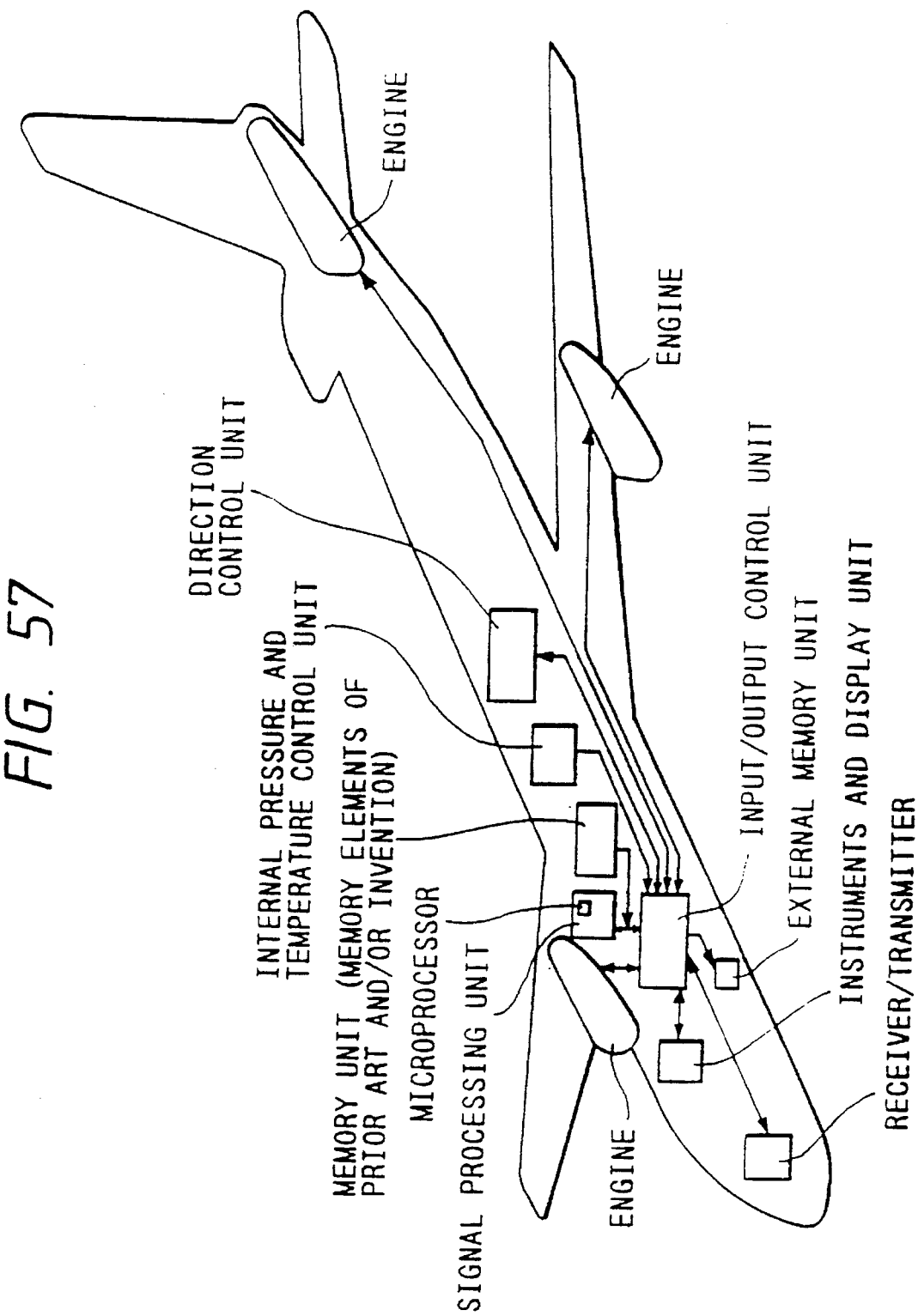
FIG. 57 is a schematic diagram of an airplane and shows an application of the semiconductor memory system according to the present invention.

FIG. 57 shows another application of the semiconductor memory system according to the present invention. The semiconductor memory system of this embodiment is installed on an airplane, as schematically shown in FIG. 57.

Figure 58:
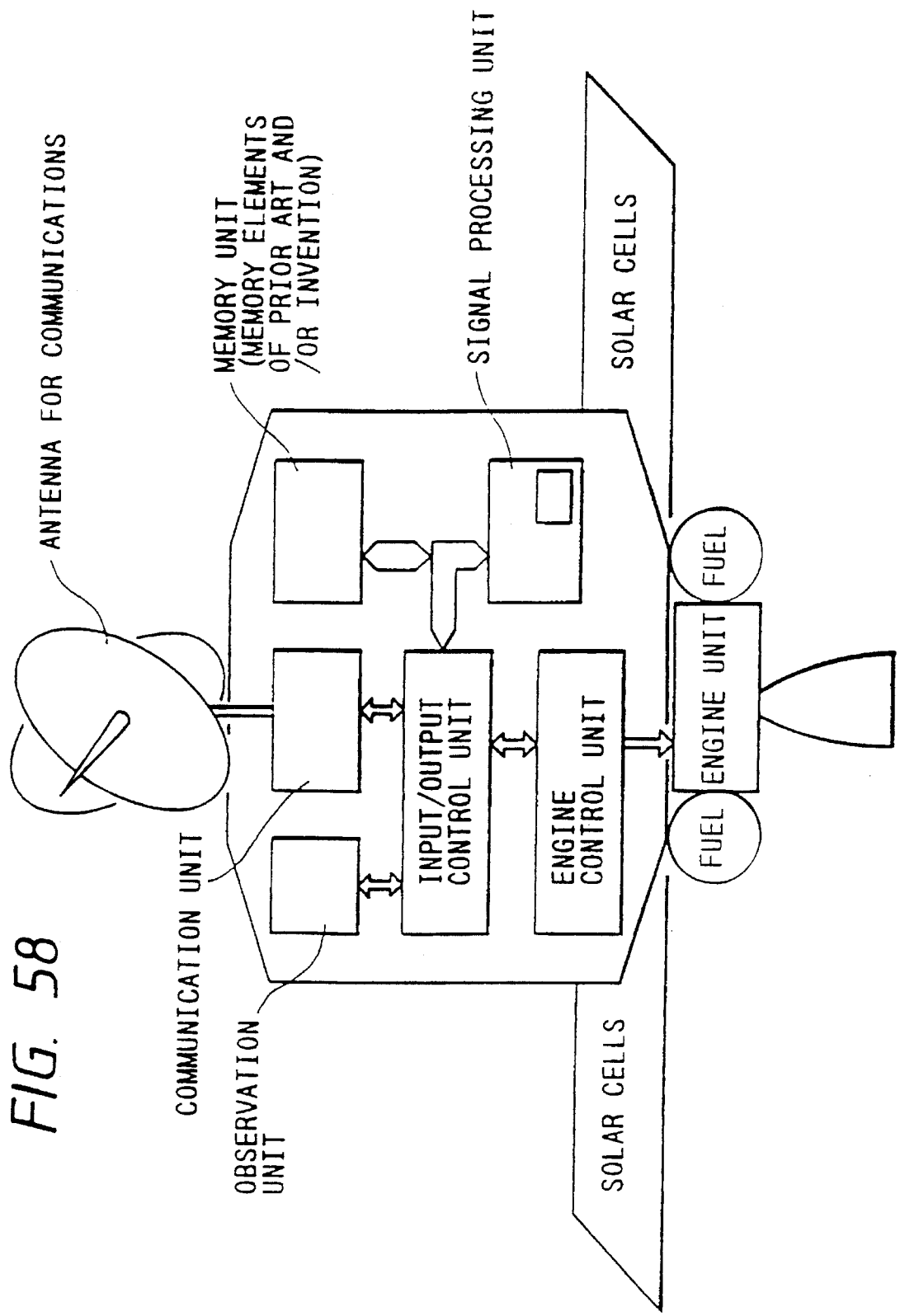
FIG. 58 is a schematic diagram of a space station and shows an application of the semiconductor memory system according to the present invention.

FIG. 58 shows another application of the semiconductor memory system according to the present invention. The semiconductor memory system of this embodiment is installed on a space station, as schematically shown in FIG. 58.

Figure 59:
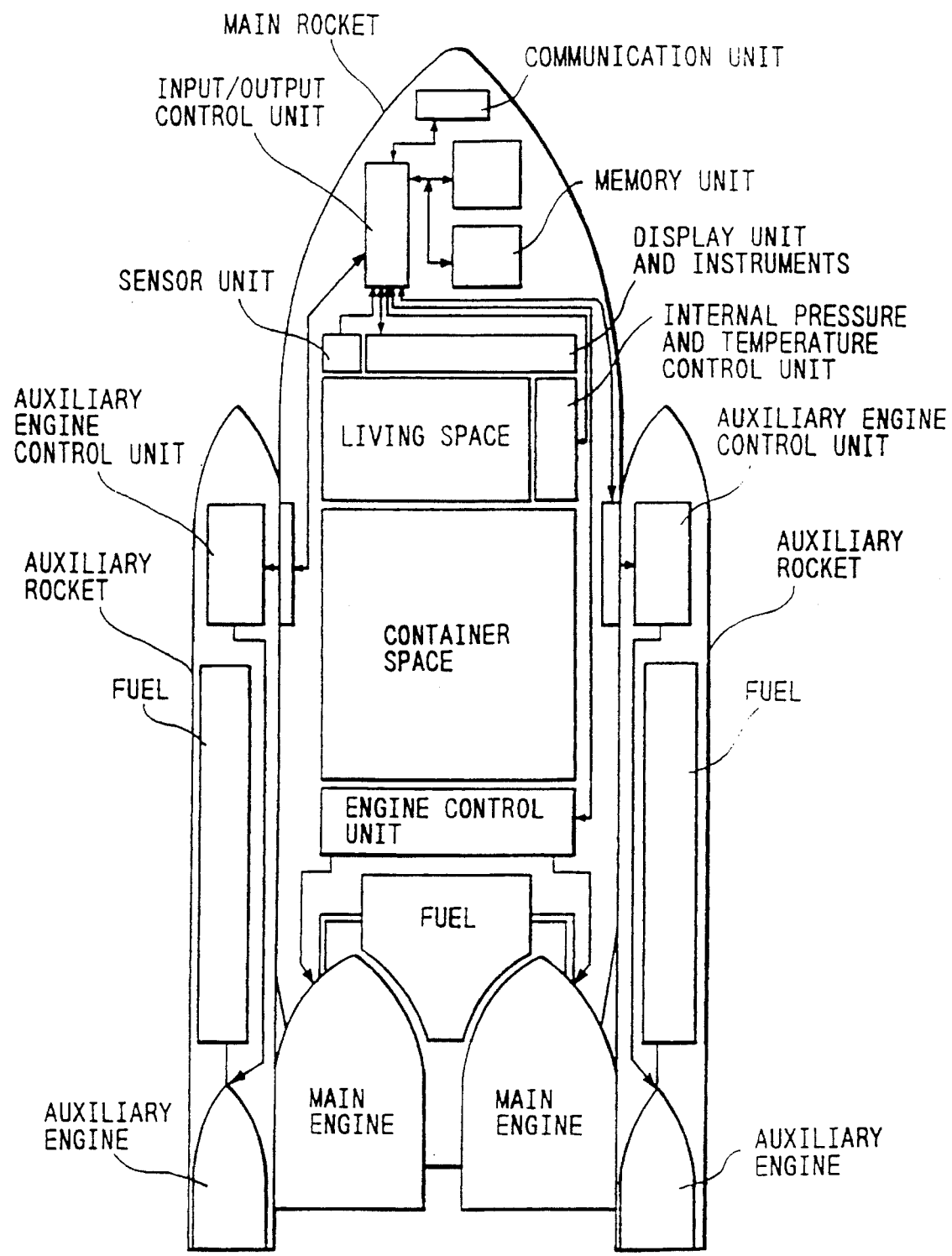
FIG. 59 is a schematic diagram of a rocket and shows an application of the semiconductor memory system according to the present invention.

FIG. 59 shows another application of the semiconductor memory system according to the present invention. The semiconductor memory system of this embodiment is installed on a rocket, as schematically shown in FIG. 59.

The semiconductor memory system according to the present invention can be properly applied to the control systems of the aforementioned airplane, space station and rocket, as shown in FIGS. 57, 58 and 59, because they are required to have a high reliability. Especially in the space environment of an artificial satellite, space station or rocket where the radiation density is far higher than that on the earth, the memory of the present invention using the ferroelectric capacitors and capable of highly resisting the radiation and reducing the characteristic deterioration if unselected can find suitable applications.

The effects to be obtained from the embodiments thus far described are as follows:

(1) The semiconductor memory system is constructed to comprise a unit memory circuit including: a switch element having its control terminal connected with first address selecting lines; a plurality of ferroelectric capacitors having their one-side terminals commonly connected with one terminal of the switch element; a plurality of second address selecting lines individually connected with the other terminals of the ferroelectric capacitors. When the first address selecting line is brought into a selecting state to turn ON the switch element, one of the second address selecting lines is brought into a selecting state and fed with such a voltage as to polarize the ferroelectric capacitors whereas the remaining second address selecting lines are set to such an unselect potential that the voltage applied to the ferroelectric capacitors may be about one half as high as that applied to the selected ferroelectric capacitor. When the first address selecting line is brought into an unselecting state to turn OFF the switch element, the second address selecting lines are fed with such an unselect potential that the voltage applied to the ferroelectric capacitors may be reduced substantially to zero. Thus, the stress to the ferroelectric capacitors of the unit memory circuit corresponding to the unselected switch element can be reduced because no voltage is applied to the ferroelectric capacitors.

(2) The unit memory circuits are arranged in a matrix form such that X-addresses are assigned to the first address selecting line and the second address selecting lines whereas Y-addresses are assigned to the signal line. At the same time, the signal lines are individually equipped with a pair of switch elements so that one selected signal line is connected through of the switch elements with the common signal line and fed with the select voltage whereas the remaining unselected signal lines are fed through the other switch element with a voltage at about one half level as high as that of the select voltage. Thus, the capacity can be increased, and the stress to the ferroelectric capacitors of the unit memory circuit corresponding to the unselected switch element can be reduced because no voltage is applied to the ferroelectric capacitors.

(3) The unit memory circuits constitutes one memory block so that a memory accessing is carried out at the unit of the memory block. Thus, the number of voltage applications to fatigue the unselected ferroelectric capacitors can be made far less than that of the case in which the individual ferroelectric capacitors are accessed at random.

(4) The memory block is so initialized that its ferroelectric capacitors may be polarized in one direction whereby an actual writing operation is carried out only for the data to invert the polarizations. Thus, it is possible to shorten the practical writing time period and to reduce the electric power consumption.

(5) The memory block is equipped with a counter circuit for memorizing the number of rewriting operations, and this counter circuit is used for deciding a forced refreshing operation for relieving the rewrite fatigue of a ferroelectric material. Thus, the ferroelectric material can be relieved from fatigue thereby to stabilize the information memorization.

(6) The data are inputted to and outputted from the memory block through a buffer memory composed of a data latch or a shift register. Thus, the data can be inputted to and outputted from the outside of the semiconductor memory system through the buffer memory so that the apparent memory accessing can be speed up.

(7) The writing operation for inverting the initialized polarization operates a sense amplifier and is carried out again if the sensed level fails to reach a predetermined level. Thus, the rewriting operation is carried out in case of insufficient writing so that the stable writing operation can be executed.

(8) There is further provided a memory cell array portion which includes memory cells each having a switch element and a ferroelectric capacitor. The memory cells are operated as dynamic memory cells by feeding their ferroelectric capacitors with such a voltage as to establish no polarization. Thus, a high-speed accessing can be achieved by such a proper use that the dynamic memory cells are used for latching the data temporarily.

(9) Those of the ferroelectric capacitors, which correspond to one switch, are juxtaposed over a common insulating film, and their one-side electrodes integrated with wiring lines to be connected with the switch element and their other-side electrodes integrated with the second address selecting lines intersect at a right angle through a ferroelectric layer. Thus, as compared with the stacked case, the process can be better simplified, and the deterioration and dispersion of the characteristics, which might otherwise be caused by the stacking process, can be more reduced.

Although our invention has been specifically described hereinbefore in connection with its embodiments, it should not be limited thereto but can naturally be modified in various manners without departing from the gist thereof. For example, the ferroelectric material making the ferroelectric capacitors is well known from the above-specified Publications and may be any of known substances.

For example, since the net magnitude of the residual polarizations in the ferroelectric crystals is determined by the sum of projections of the crystal axes upon the applied field vector, the net residual polarization takes a low value in case the crystal axes are oriented at random. In order to increase the residual polarization, therefore, the ferroelectric crystals making the ferroelectric capacitors, in which the angle made between the orientation of the crystal axes and the applied voltage is 5 degrees or less, are increased as much as possible e.g., 80% or more. The ferroelectric crystals may be exemplified by BaTiO or PZT.

The memory array may have its peripheral circuit exemplified in various modes of embodiments by a CMOS circuit, a circuit composed of an N-channel type MOSFET or a P-channel type MOSFET, or a combination of a MOSFET and a bipolar transistor.

The address inputting method may be exemplified not only by inputting the address signal at the block unit, as described before, but also by inputting an address assigned to a memory cell such as an ordinary RAM or ROM. In this modification, in order to reduce the number of external terminals, the common X- and Y-address terminals may be multiplexed as in the dynamic type RAM.

The effects to be achieved from the representative of the invention disclosed herein will be briefly described in the following. Specifically, the semiconductor memory system is constructed to comprise a unit memory circuit including: a switch element having its control terminal connected with first address selecting lines; a plurality of ferroelectric capacitors having their one-side terminals commonly connected with one terminal of the switch element; a plurality of second address selecting lines individually connected with the other terminals of the ferroelectric capacitors. When the first address selecting line is brought into a selecting state to turn ON the switch element, one of the second address selecting lines is brought into a selecting state and fed with such a voltage as to polarize the ferroelectric capacitors whereas the remaining second address selecting lines are set to such an unselect potential that the voltage applied to the ferroelectric capacitors may be about one half as high as that applied to the selected ferroelectric capacitor. When the first address selecting line is brought into an unselecting state to turn OFF the switch element, the second address selecting lines are fed with such an unselect potential that the voltage applied to the ferroelectric capacitors may be reduced substantially to zero. Thus, the stress to the ferroelectric capacitors of the unit memory circuit corresponding to the unselected switch element can be drastically reduced because no voltage is applied to the ferroelectric capacitors.

The unit memory circuits constitutes one memory block so that a memory accessing is carried out at the unit of the memory block. Thus, the number of voltage applications to fatigue the unselected ferroelectric capacitors can be made far less than that of the case in which the individual ferroelectric capacitors are accessed at random.

The memory block is so initialized that its ferroelectric capacitors may be polarized in one direction whereby an actual writing operation is carried out only for the data to invert the polarizations. Thus, it is possible to shorten the practical writing time period and to reduce the electric power consumption.

The memory block is equipped with a counter circuit for memorizing the number of rewriting operations, and this counter circuit is used for deciding a forced refreshing operation for relieving the rewrite fatigue of a ferroelectric material. Thus, the ferroelectric material can be relieved from fatigue thereby to stabilize the information memorization.

The data are inputted to and outputted from the memory block through a buffer memory composed of a data latch or a shift register. Thus, the data can be inputted to and outputted from the outside of the semiconductor memory system through the buffer memory so that the apparent memory accessing can be speed up.

The writing operation for inverting the initialized polarization operates a sense amplifier and is carried out again if the sensed level fails to reach a predetermined level. Thus, the rewriting operation is carried out in case of insufficient writing so that the stable writing operation can be executed.

There is further provided a memory cell array portion which includes memory cells each having a switch element and a ferroelectric capacitor. The memory cells are operated as dynamic memory cells by feeding their ferroelectric capacitors with such a voltage as to establish no polarization. Thus, a high-speed accessing can be achieved by such a proper use that the dynamic memory cells are used for latching the data temporarily.

Those of the ferroelectric capacitors, which correspond to one switch, are juxtaposed over a common insulating film, and their one-side electrodes integrated with wiring lines to be connected with the switch element and their other-side electrodes integrated with the second address selecting lines intersect at a right angle through a ferroelectric layer. Thus, as compared with the stacked case, the process can be better simplified, and the deterioration and dispersion of the characteristics, which might otherwise be caused by the stacking process, can be more reduced.

We claim:

1. A semiconductor memory device comprising:

a first word line;

a first data line;

a first memory cell comprising a first switch and a first ferroelectric capacitor, said first switch having a current path of which one end is coupled to said first data line and having a control terminal coupled to said first word line, said first ferroelectric capacitor having a first pair of electrodes, one of said first pair of electrodes being coupled to the other end of said current path of said first switch; and a second switch having a current path of which one end is coupled to the other of said first pair of electrodes, said first data line being set at a first voltage and the other of said first pair of electrodes receiving a second voltage in the case when the data in said first memory cell is read out, said first data line being set at a third voltage and the other end of said current path of said second switch receiving a fourth voltage in the case when a poling is executed to said first ferroelectric capacitor, a voltage difference between said first voltage and said second voltage being smaller than a voltage difference between said third voltage and said fourth voltage, said first switch being conductive in the case when the data in said first memory cell is read out and in the case when a poling is executed to said first ferroelectric capacitor, said second switch being conductive in the case when a poling is executed to said first ferroelectric capacitor, and a polarization inversion of said first ferroelectric capacitor being made possible in the case when the data in said first memory cell is read out.

2. A semiconductor memory device according to claim 1, wherein said first switch comprises a first MOSFET having a source-drain path coupled between said first data line and said one of said first pair of electrodes and having a gate coupled to said first word line.

3. A semiconductor memory device according to claim 2, further comprising:

a word line decoder coupled to said first word line; and a counter circuit coupled to said first word line and a control terminal of said second switch, said counter circuit counting the number of changes in the voltage level of said first word line and outputting a signal to said control terminal of said second switch at each occurrence in which the number of changes in the voltage level of said first word line has reached a predetermined number, and said second switch becoming conductive based on said signal being outputted from said counter circuit.

4. A semiconductor memory device according to claim 2, further comprising:

a third switch having a current path of which one end is coupled to said first data line, the other end of said current path of said third switch receiving said third voltage, said third switch being conductive in the case when a poling is executed to said first ferroelectric capacitor.

5. A semiconductor memory device according to claim 4, further comprising:

a fourth switch having a current path of which one end is coupled to said first data line, the other end of said current path of said fourth switch receiving said first voltage, said fourth switch being conductive in the case when the data in said memory cell is read out.

6. A semiconductor memory device according to claim 2, wherein said second voltage and said third voltage are a ground potential.

7. A semiconductor memory device according to claim 2, further comprising:

a second data line;

a second memory cell comprising a second MOSFET and a second ferroelectric capacitor having a second pair of electrodes, said second MOSFET having a gate coupled to said first word line and having a source-drain path of which one end is coupled to said second data line, one of said second pair of electrodes being coupled to the other end of said source-drain path of said second MOSFET, the other of said second pair of electrodes being coupled to said one end of said current path of said second switch, said second data line being set at said first voltage and the other of said second pair of electrodes receiving said second voltage in the case when the data in said second memory cell is read out, said second data line being set at said third voltage and the other end of said current path of said second switch receiving said fourth voltage in the case when a poling is executed to said first ferroelectric capacitor and said second ferroelectric capacitor, said second MOSFET being conductive in the case when the data in said second memory cell is read out and in the case when a poling is executed to said second ferroelectric capacitor, and said second switch being conductive in the case when a poling is executed to said second ferroelectric capacitor.

8. A semiconductor memory device according to claim 7, further comprising:

a word line decoder coupled to said first word line; and a counter circuit coupled to said first word line and a control terminal of said second switch, said counter circuit counting the number of changes in the voltage level of said first word line and outputting a signal to said control terminal of said second switch at each occurrence in which the number of changes in the voltage level of said first word line has reached a predetermined number, and said second switch becoming conductive based on said signal being outputted from said counter circuit.

9. A semiconductor memory device according to claim 7, further comprising:

a second word line;

a third switch;

a third memory cell comprising a third MOSFET and a third ferroelectric capacitor having a third pair of electrodes, said third MOSFET having a gate coupled to said second word line and having a source-drain path of which one end is coupled to said first data line, one of said third pair of electrodes being coupled to the other end of said source-drain path of said third MOSFET, the other of said third pair of electrodes being coupled to one end of a current path of said third switch; and a fourth memory cell comprising a fourth MOSFET and a fourth ferroelectric capacitor having a fourth pair of electrodes, said fourth MOSFET having a gate coupled to said second word line and having a source-drain path of which one end is coupled to said second data line, one of said fourth pair of electrodes being coupled to the other end of said source-drain path of said fourth MOSFET, the other of said fourth pair of electrodes being coupled to said one end of said current path of said third switch, said first data line being set at said first voltage and the other of said third pair of electrodes receiving said second voltage in the case when the data in said third memory cell is read out, said second data line being set at said first voltage and the other of said fourth pair of electrodes receiving said second voltage in the case when the data in said fourth memory cell is read out, said first data line being set at said third voltage and the other end of said current path of said third switch receiving said fourth voltage in the case when a poling is executed to said third ferroelectric capacitor, said second data line being set at said third voltage and the other end of said current path of said third switch receiving said fourth voltage in the case when a poling is executed to said fourth ferroelectric capacitor, said third MOSFET being conductive in the case when the data in said third memory cell is read out and in the case when a poling is executed to said third ferroelectric capacitor, said fourth MOSFET being conductive in the case when the data in said fourth memory cell is read out and in the case when a poling is executed to said fourth ferroelectric capacitor, said third switch being conductive in the case when a poling is executed to said third ferroelectric capacitor, and said third switch being conductive in the case when a poling is executed to said fourth ferroelectric capacitor.

10. A semiconductor memory device according to claim 9, further comprising:

a word line decoder coupled to said first word line and said second word line; and a counter circuit coupled to said first word line, said second word line, a control terminal of said second switch and a control terminal of said third switch, said counter circuit counting the number of changes in the voltage level of said first word line and counting the number of changes in the voltage level of said second word line, said counter circuit outputting a first signal to said control terminal of said second switch at each occurrence in which the number of changes in the voltage level of said first word line has reached a predetermined number, said counter circuit outputting a second signal to said control terminal of said third switch at each occurrence in which the number of changes in the voltage level of said second word line has reached said predetermined number, said second switch becoming conductive based on said first signal being outputted from said counter circuit, and said third switch becoming conductive based on said second signal being outputted from said counter circuit.

11. A semiconductor memory device according to claim 9, wherein said first MOSFET, said second MOSFET, said third MOSFET and said fourth MOSFET are each an N-channel MOSFET.

12. A semiconductor memory device comprising:

a first word line;

a first data line;

a first memory cell comprising a first switch and a first ferroelectric capacitor, said first switch having a current path of which one end is coupled to said first data line and having a control terminal coupled to said first word line, said first ferroelectric capacitor having a first pair of electrodes, one of said first pair of electrodes being coupled to the other end of said current path of said first switch; and a second switch having a current path of which one end is coupled to said first data line, said first data line being set at a first voltage and the other of said first pair of electrodes receiving a second voltage in the case when the data in said first memory cell is read out, the other end of said current path of said second switch receiving a third voltage and the other of said first pair of electrodes receiving a fourth voltage in the case when a poling is executed to said first ferroelectric capacitor, said first switch being conductive in the case when the data in said first memory cell is read out and in the case when a poling is executed to said first ferroelectric capacitor, said second switch being conductive in the case when a poling is executed to said first ferroelectric capacitor, a voltage difference between said first voltage and said second voltage being smaller than a voltage difference between said third voltage and said fourth voltage, and a polarization inversion of said ferroelectric capacitor being made possible in the case when the data in said first memory cell is read out.

13. A semiconductor memory device according to claim 12, wherein said first switch comprises a first MOSFET having a source-drain path coupled between said first data line and said one of said first pair of electrodes and having a gate coupled to said first word line.

14. A semiconductor memory device according to claim 13, further comprising:

a word line decoder coupled to said first word line; and a counter circuit coupled to said first word line and a control terminal of said second switch, said counter circuit counting the number of changes in the voltage level of said first word line and outputting a signal to said control terminal of said second switch at each occurrence in which the number of changes in the voltage level of said first word line has reached a predetermined number, and said second switch becoming conductive based on said signal being outputted from said counter circuit.

15. A semiconductor memory device according to claim 13, further comprising:

a third switch having a current path of which one end is coupled to the other of said first pair of electrodes, the other end of said current path of said third switch circuit receiving said second voltage in the case when the data in said memory cell is read out and receiving said fourth voltage in the case when a poling is executed to said first ferroelectric capacitor, and said third switch being conductive in the case when the data in said memory cell is read out and in the case when a poling is executed to said first ferroelectric capacitor.

16. A semiconductor memory device according to claim 15, further comprising a fourth switch having a current path of which one end is coupled to said first data line, the other end of said current path of said fourth switch receiving said first voltage, and said fourth switch being conductive in the case when the data in said memory cell is read out.

17. A semiconductor memory device according to claim 13,
wherein said second voltage and said fourth voltage are a ground potential.

18. A semiconductor memory device according to claim 13, further comprising:
a second data line;
a second memory cell comprising a second MOSFET and a second ferroelectric capacitor having a second pair of electrodes, said second MOSFET having a gate coupled to said first word line and having a source-drain path of which one end is coupled to said second data line, one of said second pair of electrodes being coupled to the other end of said source-drain path of said second MOSFET, the other of said second pair of electrodes receiving said second voltage in the case when the data in said second memory cell is read out and receiving said fourth voltage in the case when a poling is executed to said second ferroelectric capacitor; and
a third switch having a current path of which one end is coupled to said second data line, the other end of said current path of said third switch receiving said third voltage in the case when a poling is executed to said second ferroelectric capacitor,
said second data line being set at said first voltage in the case when the data in said second memory cell is read out,
said second MOSFET being conductive in the case when the data in said second memory cell is read out and in the case when a poling is executed to said second ferroelectric capacitor, and
said third switch being conductive in the case when a poling is executed to said second ferroelectric capacitor.

19. A semiconductor memory device according to claim 18, further comprising:
a word line decoder coupled to said first word line; and
a counter circuit coupled to said first word line, a control terminal of said second switch and a control terminal of said third switch,
said counter circuit counting the number of changes in the voltage level of said first word line and outputting a signal to said control terminal of said second switch and to said control terminal of said third switch at each occurrence in which the number of changes in the voltage level of said first word line has reached a predetermined number, and
said second and third switches becoming conductive based on said signal being outputted from said counter circuit.

20. A semiconductor memory device according to claim 18, further comprising:
a second word line;
a third memory cell comprising a third MOSFET and a third ferroelectric capacitor having a third pair of electrodes, said third MOSFET having a gate coupled to said second word line and having a source-drain path of which one end is coupled to said first data line, one of said third pair of electrodes being coupled to the other end of said source-drain path of said third MOSFET, the other of said third pair of electrodes receiving said second voltage in the case when the data in said third memory cell is read out and receiving said fourth voltage in the case when a poling is executed to said third ferroelectric capacitor; and a fourth memory cell comprising a fourth MOSFET and a fourth ferroelectric capacitor having a fourth pair of electrodes, said fourth MOSFET having a gate coupled to said second word line and having a source-drain path of which one end is coupled to said second data line, one of said fourth pair of electrodes being coupled to the other end of said source-drain path of said fourth MOSFET, the other of said fourth pair of electrodes receiving said second voltage in the case when the data in said fourth memory cell is read out and receiving said fourth voltage in the case when a poling is executed to said fourth ferroelectric capacitor;
said first data line being set at said first voltage in the case when the data in said third memory cell is read out,
said second data line being set at said first voltage in the case when the data in said fourth memory cell is read out,
said third MOSFET being conductive in the case when the data in said third memory cell is read out and in the case when a poling is executed to said third ferroelectric capacitor,
said fourth MOSFET being conductive in the case when the data in said fourth memory cell is read out and in the case when a poling is executed to said fourth ferroelectric capacitor,
the other end of said current path of said second switch receiving said third voltage in the case when a poling is executed to said third ferroelectric capacitor,
the other end of said current path of said third switch receiving said third voltage in the case when a poling is executed to said fourth ferroelectric capacitor,
said second switch being conductive in the case when a poling is executed to said third ferroelectric capacitor, and
said third switch being conductive in the case when a poling is executed to said fourth ferroelectric capacitor.

21. A semiconductor memory device according to claim 20, further comprising:
a word line decoder coupled to said first word line and said second word line; and
a counter circuit coupled to said first word line, said second word line, a control terminal of said second switch and a control terminal of said third switch,
said counter circuit counting the number of changes in the voltage level of said first word line and counting the number of changes in the voltage level of said second word line,
said counter circuit outputting a first signal to said control terminal of said second switch at each occurrence in which the number of changes in the voltage level of said first word line has reached a predetermined number,
said counter circuit outputting a second signal to said control terminal of said third switch at each occurrence in which the number of changes in the voltage level of said second word line has reached said predetermined number,
said second switch becoming conductive based on said first signal being outputted from said counter circuit, and
said third switch becoming conductive based on said second signal being outputted from said counter circuit.

22. A semiconductor memory device according to claim 20, wherein said first MOSFET, said second MOSFET, said third MOSFET and said fourth MOSFET are each an N-channel MOSFET.

23. A method of operating a semiconductor memory device, said device comprising a data line, a word line and a memory cell comprising a switch MOSFET and a ferroelectric capacitor, said switch MOSFET having a source-drain path of which one end is coupled to said data line and having a gate coupled to said word line, and said ferroelectric capacitor having a pair of electrodes of which one is coupled to the other end of said source-drain path of said switch MOSFET, in which said method comprises the steps of:

(a) setting said word line to a selecting level in the case when the data of said memory cell is read out and in the case when the data is written to said memory cell;

(b) setting a first voltage difference across said pair of electrodes in the case when the data of said memory cell is read out, a polarization inversion of said ferroelectric capacitor being made possible in the case when the data in said memory cell is read out;

(c) setting said first voltage difference across said pair of electrodes in the case when the data is written to said memory cell, a polarization inversion of said ferroelectric capacitor being made possible in the case when the data is written to said memory cell;

(d) counting the number of voltage changes between said selecting level and a non-selecting level of said word line; and (e) setting a second voltage difference across said pair of electrodes in the case when the number of voltage changes, counted by the above step (d), has reached a predetermined number, said second voltage difference being larger than said first voltage difference.

24. A method according to claim 23, further comprising the steps of:

(f) after said step (e), starting a new counting of the number of voltage changes between said selecting level and said non-selecting level of said word line; and (g) setting said second voltage difference across said pair of electrodes in the case when the number of voltage changes, counted by the above step (f), has reached said predetermined number.

25. A method of operating a semiconductor memory device, said device comprising a data line, a word line and a memory cell comprising a switch MOSFET and a ferroelectric capacitor, said switch MOSFET having a source-drain path of which one end is coupled to said data line and having a gate coupled to said word line, said ferroelectric capacitor having a pair of electrodes of which one is coupled to the other end of said source-drain path of said switch MOSFET, said method comprising the steps of:

(a) setting said word line to a selecting level so that said switch MOSFET is in an ON state and a first voltage difference is set across said pair of electrodes, a polarization inversion of said ferroelectric capacitor being made possible in the case when said first voltage difference is set across said pair of electrodes;

(b) setting said word line to a non-selecting level so that said switch MOSFET is in an OFF state;

(c) counting the number of voltage changes between said selecting level and said non-selecting level of said word line; and (d) setting a second voltage difference across said pair of electrodes in the case when the number of voltage changes, counted by the above step (c), has reached a predetermined number, said second voltage difference being larger than said first voltage difference.

26. A method according to claim 25, further comprising the steps of:

(e) after said step (d), starting a new counting of the number of voltage changes between said selecting level and said non-selecting level of said word line; and (f) setting said second voltage difference across said pair of electrodes in the case when the number of voltage changes, counted by the above step (d), has reached said predetermined number.

27. A method of operating a semiconductor memory device, said device comprising a data line and a memory cell having a ferroelectric capacitor having a pair of electrodes of which one is coupled to said data line, said method comprising the steps of:

(a) setting a first voltage difference across said pair of electrodes in the case when the data of said memory cell is read out, a polarization inversion of said ferroelectric capacitor being made possible in the case when the data in said memory cell is read out;

(b) setting said first voltage difference across said pair of electrodes in the case when the data is written to said memory cell, a polarization inversion of said ferroelectric capacitor being made possible in the case when the data is written to said memory cell;

(c) counting the number of reading and writing operations for said memory cell; and (d) setting a second voltage difference across said pair of electrodes in the case when the number of reading and writing operations for said memory cell, counted by the above step (c), has reached a predetermined number, said second voltage difference being larger than said first voltage difference.

28. A method according to claim 27, further comprising the steps of:

(e) after said step (d), starting a new counting of the number of reading and writing operations for said memory cell; and (f) setting said second voltage difference across said pair of electrodes in the case when the number of reading and writing operations for said memory cell, counted by the above step (e), has reached said predetermined number.

* * * * *